(12) United States Patent
Yamazaki et al.

(10) Patent No.: US 10,871,669 B2
(45) Date of Patent: Dec. 22, 2020

(54) DISPLAY DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP); Tetsuji Ishitani, Kanagawa (JP); Daisuke Kubota, Kanagawa (JP); Ryo Hatsumi, Kanagawa (JP); Masaru Nakano, Kanagawa (JP); Takashi Hamada, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 684 days.

(21) Appl. No.: 14/948,720

(22) Filed: Nov. 23, 2015

(65) Prior Publication Data

US 2016/0147109 A1 May 26, 2016

(30) Foreign Application Priority Data

| Nov. 26, 2014 | (JP) | 2014-238566 |
| Dec. 1, 2014 | (JP) | 2014-243313 |
| Mar. 6, 2015 | (JP) | 2015-044820 |
| May 28, 2015 | (JP) | 2015-109045 |

(51) Int. Cl.
*G02F 1/1333* (2006.01)

(52) U.S. Cl.
CPC .................. *G02F 1/133345* (2013.01)

(58) Field of Classification Search
None
See application file for complete search history.

(56) References Cited

U.S. PATENT DOCUMENTS

| 4,357,557 A | 11/1982 | Inohara et al. |
| 4,640,583 A | 2/1987 | Hoshikawa et al. |
| 6,219,127 B1 | 4/2001 | Hirakata et al. |
| 6,580,094 B1 | 6/2003 | Yamazaki et al. |
| 6,605,826 B2 | 8/2003 | Yamazaki et al. |
| 6,864,943 B2 | 3/2005 | Hirakata et al. |
| 6,872,604 B2 | 3/2005 | Yamazaki et al. |
| 6,894,431 B2 | 5/2005 | Yamazaki et al. |
| 7,189,999 B2 | 3/2007 | Yamazaki et al. |

(Continued)

FOREIGN PATENT DOCUMENTS

| CN | 001482840 A | 3/2004 |
| JP | 62-091623 | 6/1987 |

(Continued)

*Primary Examiner* — Phu Vu
(74) *Attorney, Agent, or Firm* — Husch Blackwell LLP

(57) ABSTRACT

A display device including a peripheral circuit portion with high operation stability. The display device includes a first substrate and a second substrate. A first insulating layer is on a first plane of the first substrate, and a second insulating layer is on a first plane of the second substrate. An area of the first plane of the first substrate is the same as an area of the first plane of the second substrate. The first plane of the first substrate and the first plane of the second substrate face each other. A bonding layer is between the first insulating layer and the second insulating layer. A protection film is in contact with the first substrate, the first insulating layer, the bonding layer, the second insulating layer, and the second substrate.

19 Claims, 64 Drawing Sheets

(56) References Cited

U.S. PATENT DOCUMENTS

| | | |
|---|---|---|
| 7,199,855 B2 | 4/2007 | Yoshimi et al. |
| 7,230,669 B1 | 6/2007 | Tashiro et al. |
| 7,283,185 B2 | 10/2007 | Hirakata et al. |
| 7,369,212 B2 | 5/2008 | Tashiro et al. |
| 7,372,535 B2 | 5/2008 | Tashiro et al. |
| 7,453,089 B2 | 11/2008 | Yamazaki et al. |
| 7,579,203 B2 | 8/2009 | Yamazaki et al. |
| 7,674,650 B2 | 3/2010 | Akimoto et al. |
| 7,733,457 B2 | 6/2010 | Tashiro et al. |
| 7,738,073 B2 | 6/2010 | Inoue et al. |
| 7,897,003 B2 | 3/2011 | Tashiro |
| 8,106,407 B2 | 1/2012 | Yamazaki et al. |
| 8,289,481 B2 | 10/2012 | Tashiro et al. |
| 8,497,516 B2 | 7/2013 | Yamazaki et al. |
| 8,541,266 B2 | 9/2013 | Yamazaki |
| 8,648,345 B2 | 2/2014 | Yamazaki et al. |
| 8,735,899 B2 | 5/2014 | Yamazaki et al. |
| 8,911,653 B2 | 12/2014 | Yamazaki et al. |
| 8,981,370 B2 | 3/2015 | Tanaka et al. |
| 9,263,697 B2 | 2/2016 | Yamazaki et al. |
| 9,330,905 B2 | 5/2016 | Onizawa |
| 9,768,239 B2 | 9/2017 | Yamazaki et al. |
| 10,236,331 B2 | 3/2019 | Yamazaki et al. |
| 2002/0041277 A1* | 4/2002 | Nakatani ............... G09G 5/006 345/204 |
| 2004/0012747 A1* | 1/2004 | Yamazaki ............. H01L 51/524 349/153 |
| 2006/0220550 A1 | 10/2006 | Harada |
| 2007/0072439 A1 | 3/2007 | Akimoto et al. |
| 2007/0108446 A1 | 5/2007 | Akimoto |
| 2007/0170839 A1 | 7/2007 | Choi et al. |
| 2007/0170854 A1 | 7/2007 | Kwak |
| 2007/0170860 A1 | 7/2007 | Choi et al. |
| 2008/0123042 A1 | 5/2008 | Tashiro et al. |
| 2008/0131646 A1 | 6/2008 | Tanaka |
| 2008/0196664 A1* | 8/2008 | David ................. H01L 51/5237 118/623 |
| 2009/0004772 A1 | 1/2009 | Jinbo et al. |
| 2009/0147205 A1* | 6/2009 | Mizuno ................ G02F 1/1339 349/153 |
| 2010/0060158 A1 | 3/2010 | Kase et al. |
| 2010/0134746 A1 | 6/2010 | Tashiro et al. |
| 2010/0255184 A1 | 10/2010 | Yamazaki et al. |
| 2010/0293782 A1 | 11/2010 | Yamazaki et al. |
| 2011/0012112 A1 | 1/2011 | Yamazaki et al. |
| 2011/0025940 A1 | 2/2011 | Liu et al. |
| 2011/0193095 A1 | 8/2011 | Nakata et al. |
| 2012/0061718 A1 | 3/2012 | Yamazaki et al. |
| 2012/0126234 A1 | 5/2012 | Yamazaki et al. |
| 2012/0161603 A1 | 6/2012 | Van Montfort et al. |
| 2012/0241802 A1 | 9/2012 | Philippens et al. |
| 2012/0300151 A1 | 11/2012 | Yamazaki et al. |
| 2013/0001582 A1 | 1/2013 | Kadono et al. |
| 2013/0026463 A1* | 1/2013 | Doi ...................... H01G 9/2077 257/43 |
| 2013/0048967 A1 | 2/2013 | Nishido et al. |
| 2013/0127335 A1 | 5/2013 | Chang et al. |
| 2013/0299791 A1* | 11/2013 | Hirakata ............. H01L 51/5228 257/40 |
| 2014/0061612 A1 | 3/2014 | Yamazaki et al. |
| 2014/0063424 A1 | 3/2014 | Sung et al. |
| 2014/0063432 A1 | 3/2014 | Yamazaki et al. |
| 2014/0065430 A1 | 3/2014 | Yamazaki et al. |
| 2014/0339538 A1 | 11/2014 | Yamazaki et al. |
| 2015/0053959 A1 | 2/2015 | Yamazaki et al. |
| 2016/0118416 A1 | 4/2016 | Yamazaki et al. |
| 2016/0120054 A1 | 4/2016 | Yamazaki et al. |
| 2016/0154268 A1 | 6/2016 | Yamazaki et al. |
| 2016/0155984 A1 | 6/2016 | Yamazaki et al. |
| 2016/0190055 A1 | 6/2016 | Jinbo et al. |
| 2019/0115564 A1 | 4/2019 | Yamazaki et al. |

FOREIGN PATENT DOCUMENTS

| | | |
|---|---|---|
| JP | 2002-082347 A | 3/2002 |
| JP | 2002-151253 A | 5/2002 |
| JP | 2004-047634 A | 2/2004 |
| JP | 2007-123861 A | 5/2007 |
| JP | 2008-089633 A | 4/2008 |
| JP | 2008-225399 A | 9/2008 |
| JP | 2010-098076 A | 4/2010 |
| JP | 2010-098141 A | 4/2010 |
| JP | 2011-003537 A | 1/2011 |
| JP | 2011-018479 A | 1/2011 |
| JP | 2011-076760 A | 4/2011 |
| JP | 2013-214692 A | 10/2013 |
| WO | WO 2004/008516 A1 | 1/2004 |
| WO | WO 2010/044431 A1 | 4/2010 |

* cited by examiner

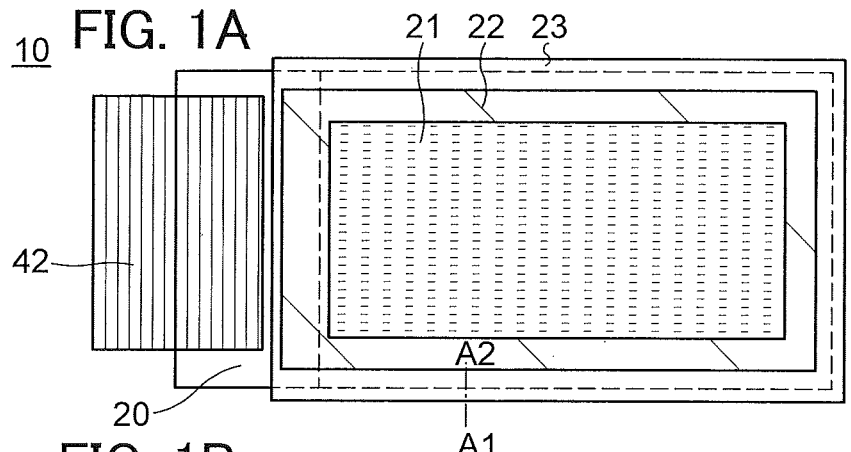
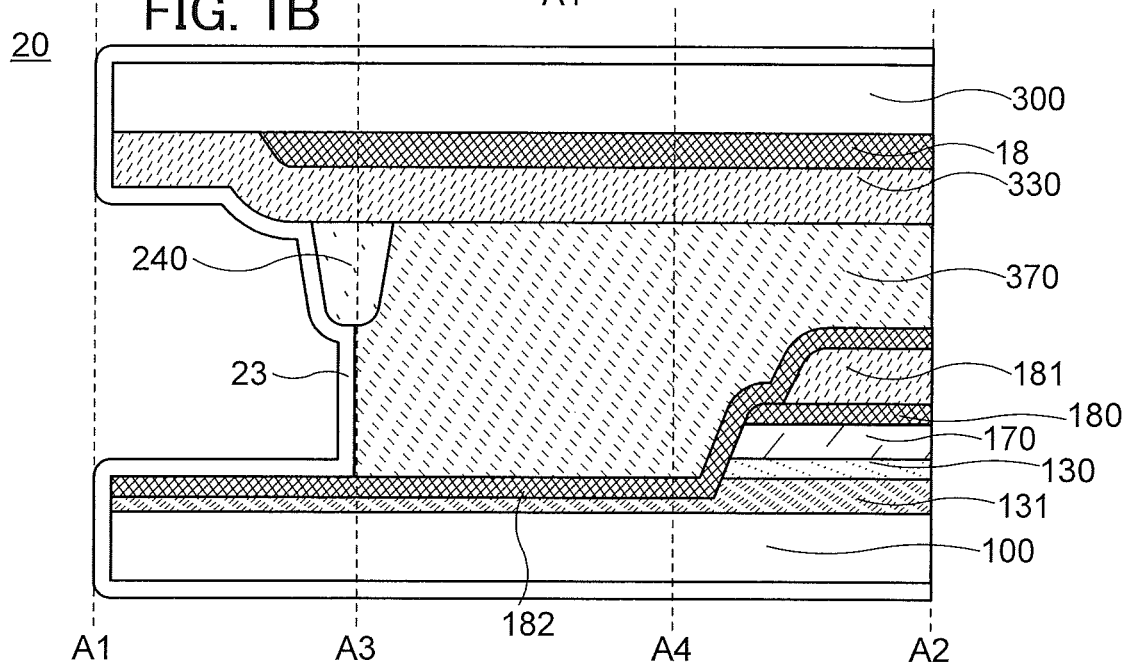
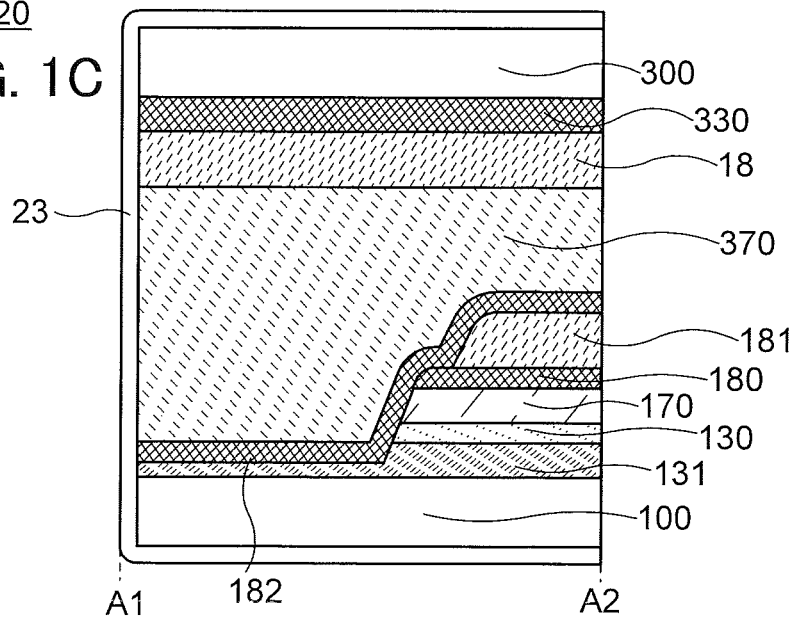

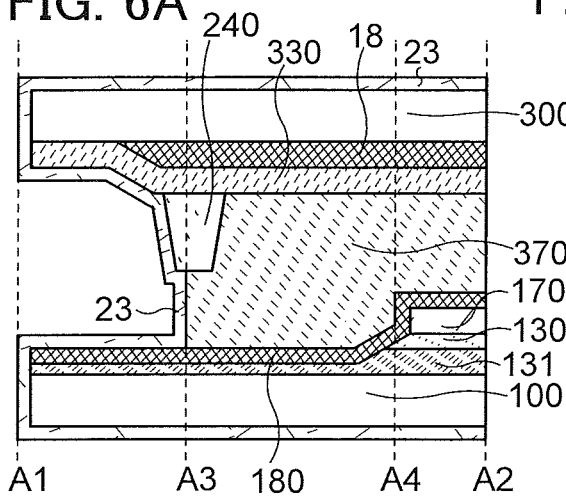
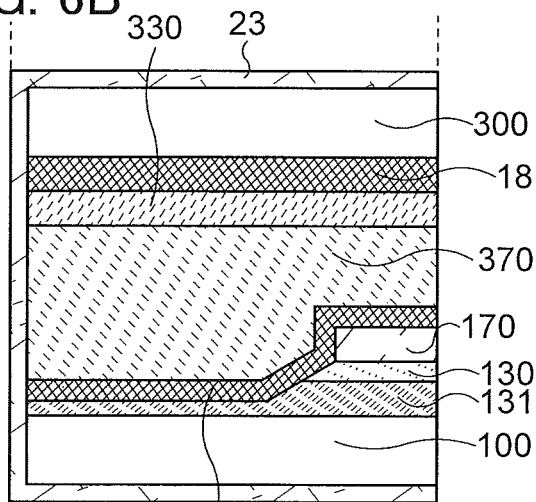
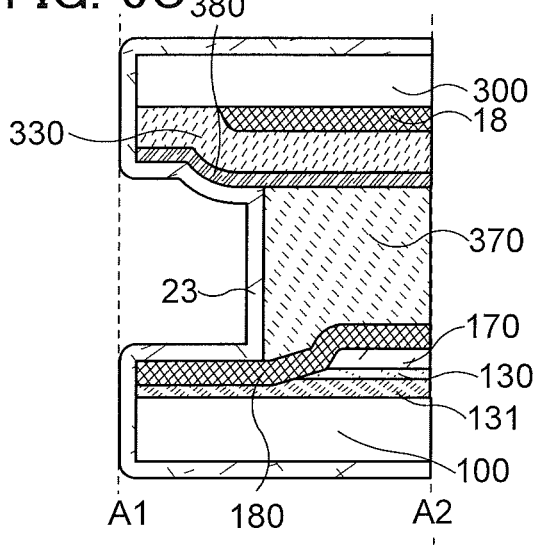
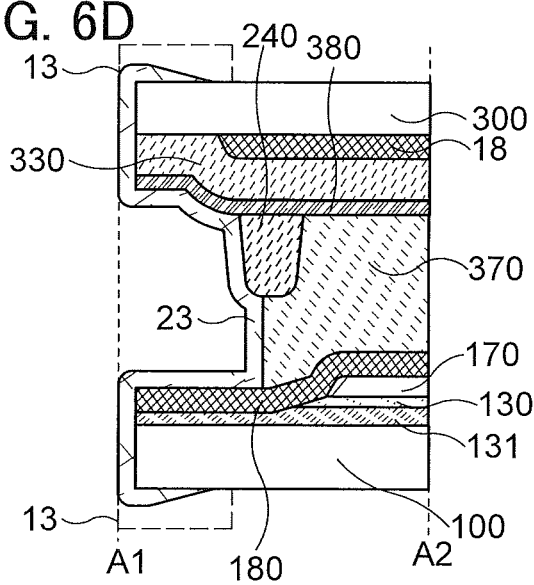
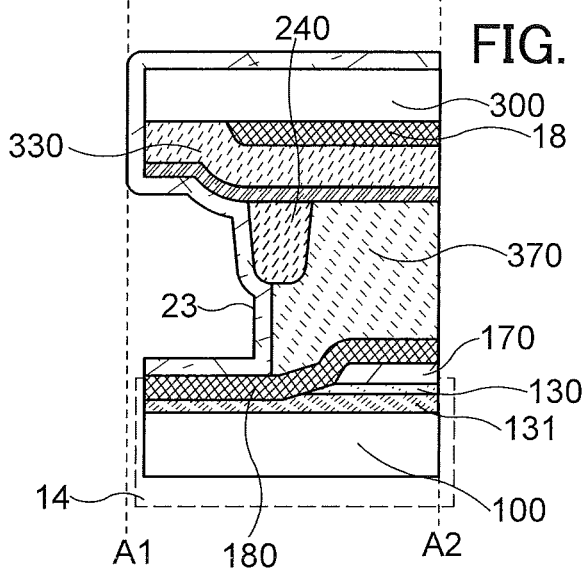

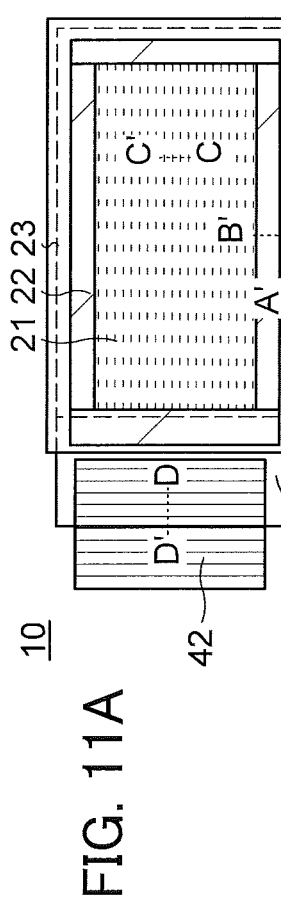
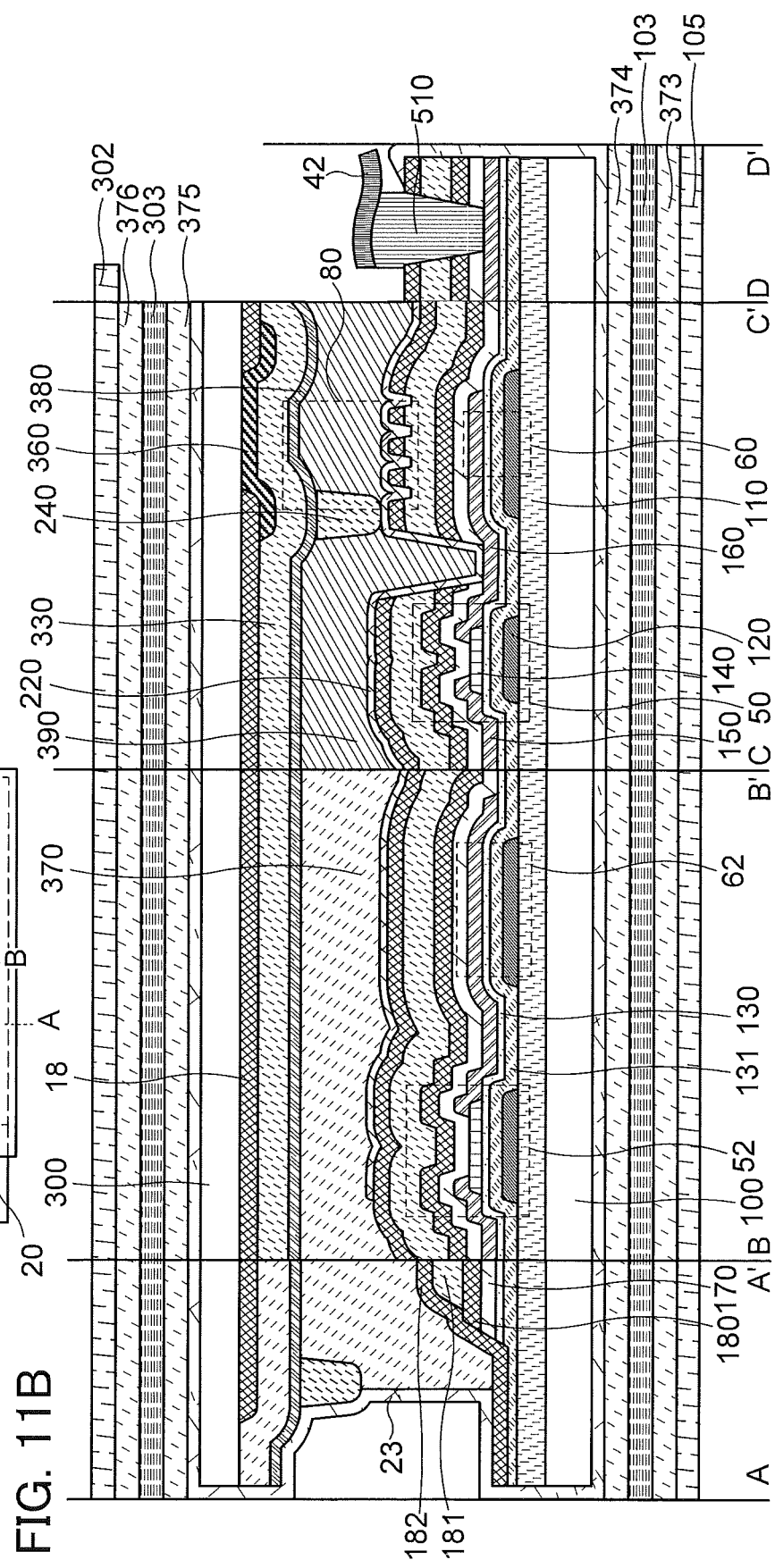
FIG. 11A
FIG. 11B writing period sensing period

FIG. 44A
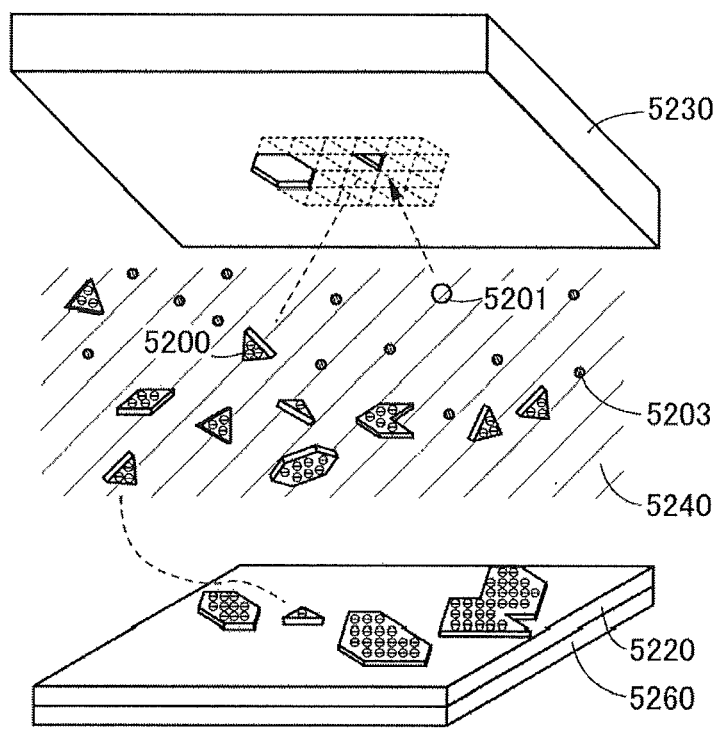
FIG. 44B
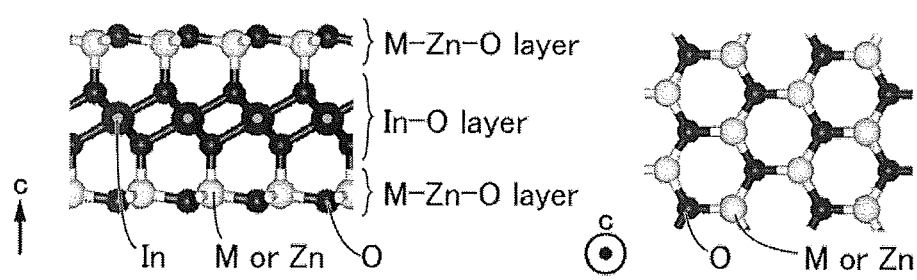
FIG. 44C
FIG. 44D
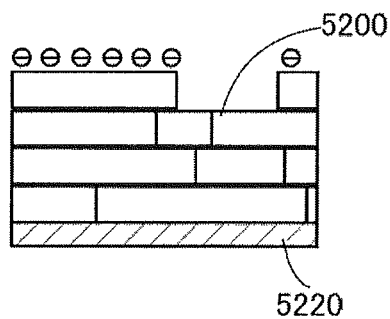

DISPLAY DEVICE AND ELECTRONIC DEVICE

BACKGROUND OF THE INVENTION

1. Field of the Invention

The present invention relates to a display device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an input device, an input/output device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Displays including thin film transistors have been widely spread and indispensable to our life. In addition, these displays are thin and lightweight, and have been necessary for portable information terminals.

Furthermore, display devices in which a display region (a pixel portion) and a peripheral circuit (a driver portion) are provided in the same substrate have been widely used. For example, Patent Document 1 discloses a technique of using oxide semiconductor transistors in the display region and the peripheral circuit. When the display region and the peripheral circuit are formed simultaneously, the manufacturing cost can be reduced.

REFERENCE

Patent Document

[Patent Document 1] Japanese Published Patent Application No. 2007-123861

SUMMARY OF THE INVENTION

A display device is required to have as large a display region as possible on a side viewed by a viewer (a display surface side). In order to enlarge the display region, a frame, which extends in a region from the edge of the display region to the edge of a substrate, needs to be as narrow as possible.

A driver circuit around the display region is positioned in such a frame region. When the display region is enlarged and the frame is narrowed, the driver circuit is disposed closer to the edge of the substrate. Therefore, atmospheric components might enter and lower characteristics of a transistor in the driver circuit, which might cause unstable circuit operation.

An object of one embodiment of the present invention is to provide a display device including a peripheral circuit portion with high operation stability.

Another object of one embodiment of the present invention is to provide a display device with a narrow frame.

Another object of one embodiment of the present invention is to provide a lightweight display device.

Another object of one embodiment of the present invention is to provide a high-definition display device.

Another object of one embodiment of the present invention is to provide a highly reliable display device.

Another object of one embodiment of the present invention is to provide a large-area display device.

Another object of one embodiment of the present invention is to provide a low-power display device.

Another object of one embodiment of the present invention is to provide a novel display device or the like.

Another object of one embodiment of the present invention is to provide a method for manufacturing the display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first substrate and a second substrate. A first insulating layer is on a first plane of the first substrate. A second insulating layer is on a first plane of the second substrate. An area of the first plane of the first substrate is the same as an area of the first plane of the second substrate. The first plane of the first substrate and the first plane of the second substrate face each other. A bonding layer is between the first insulating layer and the second insulating layer. A protection film is in contact with the first substrate, the first insulating layer, the bonding layer, the second insulating layer, and the second substrate.

One embodiment of the present invention is a display device including a first substrate and a second substrate. A first insulating layer is on a first plane of the first substrate. A second insulating layer is on a first plane of the second substrate. An area of the first plane of the second substrate is smaller than an area of the first plane of the first substrate. The first plane of the first substrate and the first plane of the second substrate face each other. A bonding layer is between the first insulating layer and the second insulating layer. A protection film is in contact with the first substrate, the first insulating layer, the bonding layer, the second insulating layer, and the second substrate.

A transistor, a capacitor, a display element, a light-blocking layer, a coloring layer, and a spacer can be included between the first plane of the first substrate and the first plane of the second substrate.

For the protection film, an oxide, a nitride, or a metal can be used.

For the protection film, aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, silicon nitride, manganese nitride, hafnium nitride, ruthenium, platinum, nickel, cobalt, manganese, or copper can be used.

The protection film can contain fluorine, carbon, or hydrogen.

The concentration of fluorine in the protection film is preferably greater than or equal to $1\times10^{18}$ atoms/cm$^3$ and less than $1\times10^{22}$ atoms/cm$^3$.

The concentration of carbon in the protection film is preferably greater than or equal to $1\times10^{17}$ atoms/cm$^3$ and less than $1\times10^{22}$ atoms/cm$^3$.

The concentration of hydrogen in the protection film is preferably greater than or equal to $1\times10^{19}$ atoms/cm$^3$ and less than $1\times10^{22}$ atoms/cm$^3$.

Any of the aforementioned display devices can include a liquid crystal element.

Any of the aforementioned display devices can include an organic EL element.

Any of the aforementioned display devices can be combined with a microphone and a speaker.

Note that other embodiments of the present invention are shown below in the description of Embodiments and the drawings.

One embodiment of the present invention can provide a display device in which a peripheral circuit portion has high operation stability.

Another embodiment of the present invention can provide a display device with a narrow frame.

Another embodiment of the present invention can provide a lightweight display device.

Another embodiment of the present invention can provide a high-definition display device.

Another embodiment of the present invention can provide a highly reliable display device.

Another embodiment of the present invention can provide a large-area display device.

Another embodiment of the present invention can provide a low-power display device.

Another embodiment of the present invention can provide a novel display device or the like.

Alternatively, a method for manufacturing the display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A to 1C are a top view and cross-sectional views illustrating a display device of one embodiment of the present invention.

FIGS. 6A to 6E are cross-sectional views each illustrating a display device of one embodiment of the present invention.

FIGS. 11A and 11B are a top view and a cross-sectional view illustrating a display device of one embodiment of the present invention.

FIGS. 44A to 44D illustrate a deposition method of a CAAC-OS.

DETAILED DESCRIPTION OF THE INVENTION

Figure 2A:
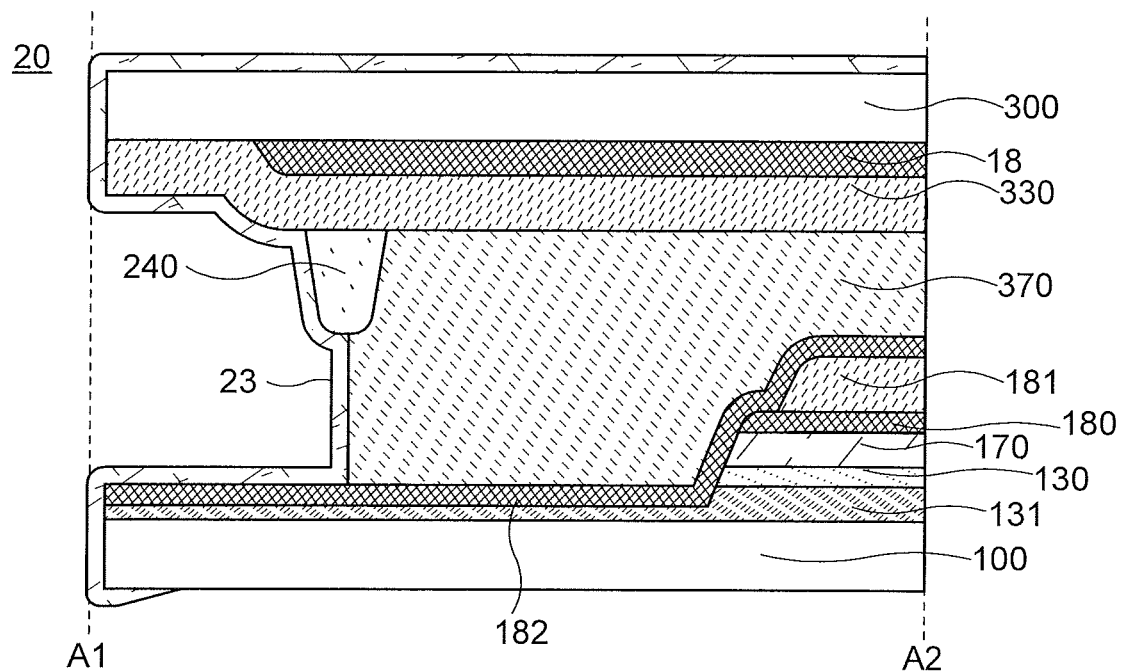
FIGS. 2A and 2B are cross-sectional views each illustrating a display device of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

<Notes on the Description for Drawings>

In this specification, terms for describing arrangement, such as "over" and "under", are used for convenience to describe a positional relation between components with reference to drawings. Furthermore, the positional relation between components is changed as appropriate in accordance with a direction in which each component is described. Thus, there is no limitation on terms used in this specification, and description can be made appropriately depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The tetra "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings.

In drawings such as plan views (also referred to as layout views) and perspective views, some of components might not be illustrated for clarity of the drawings.

The expression "being the same" may refer to having the same area or having the same shape. In addition, the expression "being the same" include a case of "being substantially the same" because a manufacturing process might cause some differences.

<Notes on Expressions that can be Rephrased>

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, a portion that functions as a source or a portion is not referred to as a source or a drain in some cases. In that case, one of the source and the drain might be referred to as a first electrode, and the other of the source and the drain might be referred to as a second electrode.

In this specification, ordinal numbers such as first, second, and third are used to avoid confusion among components, and thus do not limit the number of the components.

In this specification and the like, a structure in which a flexible printed circuit (FPC), a tape carrier package (TCP), or the like is attached to a substrate of a display panel, or a structure in which an integrated circuit (IC) is directly mounted on a substrate by a chip on glass (COG) method is referred to as a display device in some cases.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

<Notes on Definitions of Terms>

The following are definitions of the terms that are not mentioned in the above embodiments.

<<Connection>>

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, structural examples of a display panel are described.

<Protection of Substrate Surface Portion and Side Surface Portion by Protection Film 23>

FIG. 1A is a top view of a display device, and FIGS. 1B and 1C are cross-sectional views thereof. A display device 10 in FIG. 1A includes an FPC 42 and a display panel 20 including a display region 21 and a peripheral circuit 22. In one embodiment of the present invention, a protection film 23 is uniformly formed over the display panel 20. The protection film 23 is preferably formed by an atomic layer deposition (ALD) method. Note that a protection film such as the protection film 23 has a function of, for example, protecting a display element and a transistor, and in some cases has another function of, for example, adding one or more kinds of components to a display element or a transistor. For this reason, the protection film such as the protection film 23 is simply called a film in some cases. For example, the protection film such as the protection film 23 is called a first film, a second film, or the like in some cases.

FIG. 1B is a cross-sectional view of an edge of a substrate of the display panel taken along the dashed line A1-A2 in FIG. 1A. A3 indicates an edge of a region including a bonding layer 370, and A4 indicates an edge of the peripheral circuit. In the display panel, a transistor, a capacitor, a display element, and the like are formed. The display panel includes, at the edge of the substrate, a substrate 100, a substrate 300 an insulating layer 130, an insulating layer 131, an insulating layer 170, an insulating layer 180, an insulating layer 181, an insulating layer 182, a light-blocking layer 18, an insulating layer 330, a spacer 240, and the bonding layer 370 which are covered with the protection film 23. In FIG. 1B, the substrate 100 and the substrate 300 overlap each other and can have substantially the same area. Thanks to having the same area of the substrates, alignment controllability at the time of bonding the substrates can be improved.

The thickness of the protection film 23 is greater than or equal to 3 nm and less than or equal to 200 nm, preferably greater than or equal to 5 nm and less than 150 nm. With a thickness in the above range, a barrier property can be improved and atmospheric components can be prevented from entering the inside of the display panel.

Alternatively, the concentration of hydrogen in the protection film 23 is greater than or equal to $1\times10^{19}$ atoms/cm$^3$ and less than $1\times10^{22}$ atoms/cm$^3$, preferably greater than or equal to $1\times10^{19}$ atoms/cm$^3$ and less than $1\times10^{21}$ atoms/cm$^3$.

In the case where the protection film 23 contains much hydrogen, hydrogen might enter the display panel from the protection film 23 and thus characteristics of the peripheral circuit might deteriorate. Therefore, by setting the concentration of hydrogen in the protection film in the above range, the protection film 23 can have high purity, entry of hydrogen from the protection film to the display panel can be prevented, and the operation stability and reliability of the peripheral circuit can be improved.

Alternatively, the concentration of carbon in the protection film 23 is greater than or equal to $1\times10^{17}$ atoms/cm$^3$ and less than $1\times10^{22}$ atoms/cm$^3$, preferably greater than or equal to $1\times10^{17}$ atoms/cm$^3$ and less than $1\times10^{21}$ atoms/cm$^3$, more preferably greater than or equal to $1\times10^{17}$ atoms/cm$^3$ and less than $1\times10^{20}$ atoms/cm$^3$. By having a concentration of carbon within the above range, the protection film 23 can be denser and have a higher barrier property.

Alternatively, the concentration of fluorine in the protection film 23 is greater than or equal to $1\times10^{18}$ atoms/cm$^3$ and less than $1\times10^{22}$ atoms/cm$^3$, preferably greater than or equal to $1\times10^{18}$ atoms/cm$^3$ and less than $1\times10^{21}$ atoms/cm$^3$. By having a concentration of fluorine within the above range, the protection film 23 can be denser and have a higher barrier property.

<Method for Forming Protection Film 23 of Display Panel by ALD Method>

Figure 3A:
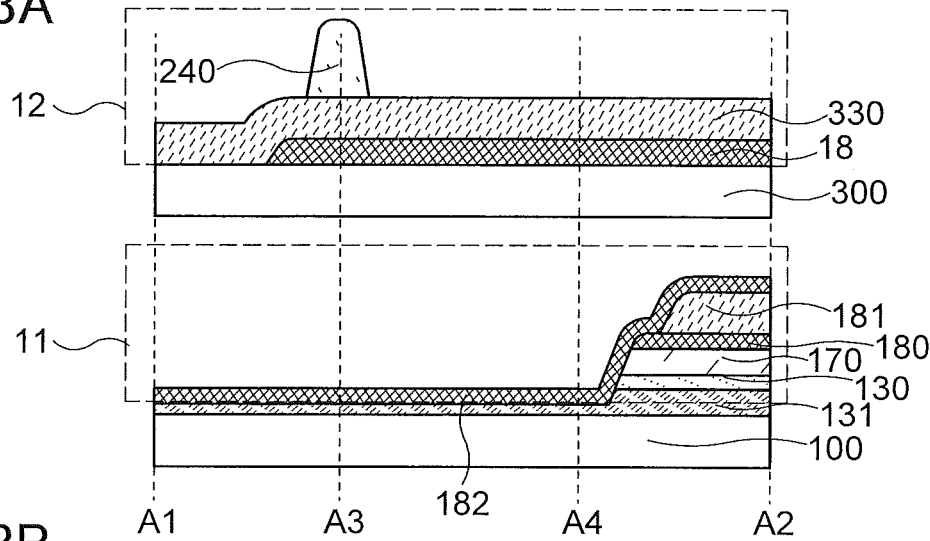
FIGS. 3A to 3C are cross-sectional views illustrating a method for manufacturing a display device of one embodiment of the present invention.

A method for forming the protection film 23 of the display panel by an ALD method is described with reference to FIGS. 3A to 3C.

A transistor, a capacitor, part of a display element, and the like are provided over the substrate 100, whereby a region 11 is formed. A light-blocking layer, a coloring layer, an insulating layer, part of the display element, and the like are provided over the substrate 300, whereby a region 12 is formed (see FIG. 3A).

Figure 3B:
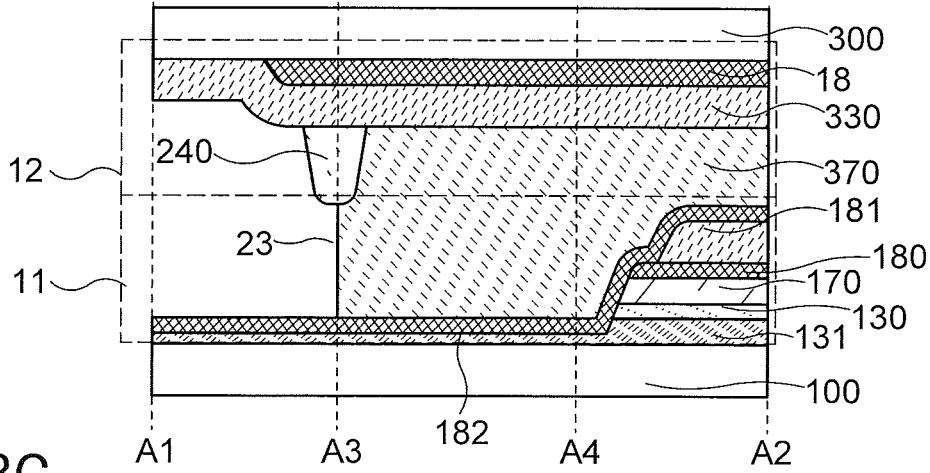
Figure 3C:
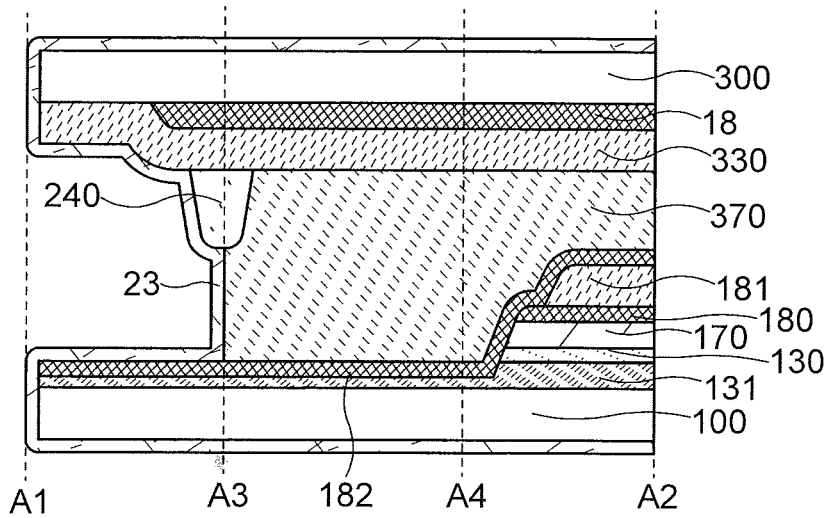

Next, the region 11 of the substrate 100 and the region 12 of the substrate 300 are disposed to face each other, and the substrate 100 and the substrate 300 are bonded with the bonding layer 370, whereby the display panel 20 can be formed (see FIG. 3B).

The temperature for forming the protection film 23 by an ALD method can be greater than or equal to room temperature and less than 200° C., preferably greater than or equal to 50° C. and less than 150° C.

By an ALD method, the protection film can be deposited extremely uniformly on a surface on which the protection film is deposited. By using an ALD method, for example, aluminum oxide, hafnium oxide, zirconium oxide, titanium oxide, zinc oxide, indium oxide, tin oxide, indium tin oxide (ITO), tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, silicon nitride, manganese nitride, hafnium nitride, and the like can be deposited as the protection film. Furthermore, the protection film is not limited to an insulating film, and a conductive film may also be deposited. For example, ruthenium, platinum, nickel, cobalt, manganese, copper, and the like can be deposited.

Furthermore, a portion electrically connected to the FPC 42 or the like is preferably masked so that the protection film 23 is not deposited on the portion. For the masking, an organic film, an inorganic film, a metal, or the like can be used. For example, an oxide insulating film such as silicon oxide, silicon oxynitride, gallium oxide, gallium oxynitride, yttrium oxide, yttrium oxynitride, hafnium oxide, or hafnium oxynitride, a nitride insulating film such as silicon nitride or aluminum nitride, or an organic material such as a photoresist, a polyimide resin, an acrylic resin, a polyimide amide resin, a benzocyclobutene resin, a polyamide resin, or an epoxy resin can be used. In the case where any of these films is used as a mask, the mask can be removed after the protection film 23 is deposited.

Furthermore, a region on which the protection film is deposited may be masked with a metal mask by an ALD method. The metal mask can be formed using a metal element selected from iron, chromium, nickel, cobalt, tungsten, molybdenum, aluminum, copper, tantalum, and titanium, an alloy including any of the metal elements, an alloy including any of the metal elements in combination, or the like. The metal mask can be positioned in the proximity of or in contact with the display panel.

A dense film can be formed by an ALD method. When the protection film 23 is deposited on the side surface portion of the display panel by an ALD method, entry of external components such as moisture can be inhibited. As a result, a change in transistor characteristics can be inhibited and the operation of the peripheral circuit can be stable. Moreover, the frame size can be reduced; thus, the pixel region can be enlarged and the definition of the display device can be increased.

With the protection film 23, even if a distance A1-A4 between an edge of the peripheral circuit 22 and the edge of the substrate is narrowed, the stable transistor characteristics, that is, the operation stability of the peripheral circuit, can be obtained because of a high barrier property of the protection film 23; thus, the frame of the display panel can be narrowed. For example, the distance A1-A4 between the edge of the peripheral circuit 22 and the edge of the substrate (a portion cut by the panel processing) can be 300 μm or shorter, preferably 200 μm or shorter. Alternatively, the edge of the display panel may have a structure without unevenness in shape as illustrated in FIG. 1C.

Metal components in the protection film 23 can be diffused into the insulating layer formed on the protection film 23. For example, in the case where the protection film 23 is formed over the insulating layer 330 while being heated and the insulating layer 330 is formed of an organic resin, the resin is softened and metal components in the protection film 23 can be diffused into the insulating layer.

Furthermore, a resin film can be provided on an outer surface of the protection film 23. This can disperse various pressures and thus can prevent a break of the insulating layer caused by pressure concentration. As a result, a display device that is highly convenient or highly reliable can be provided.

<Variation 1 of Structure of Peripheral Portion of Display Panel>

Figure 2B:
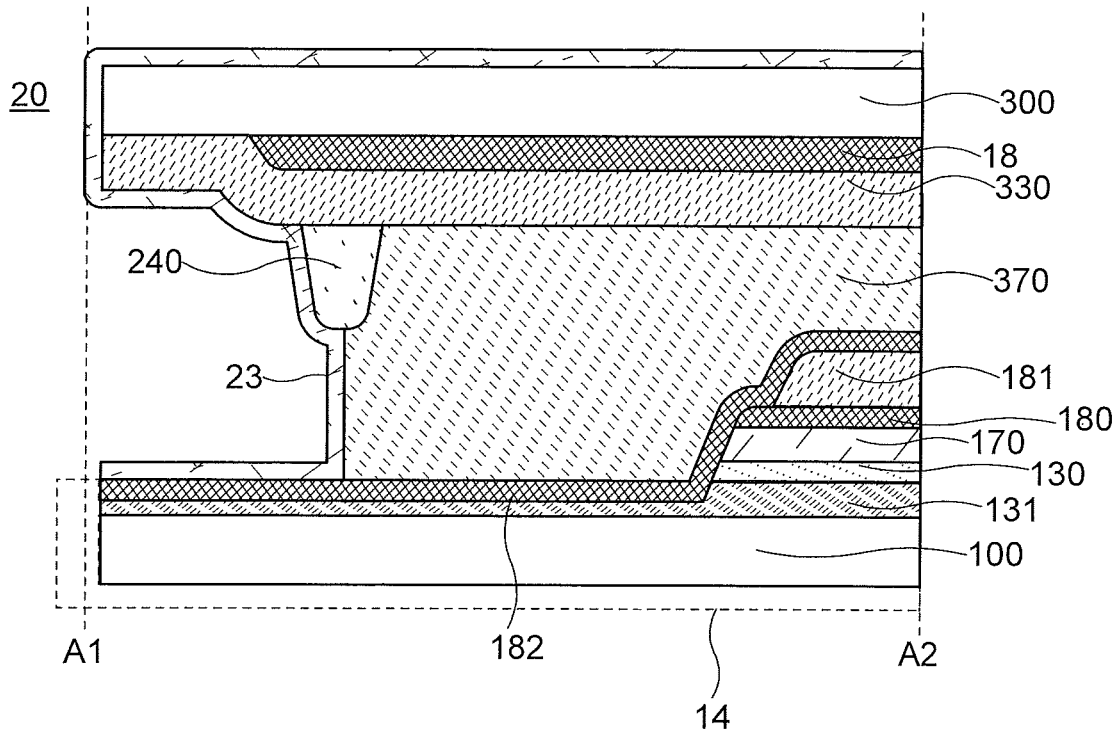

FIGS. 2A and 2B show other structural examples of FIG. 1B. A region where the protection film is formed can be controlled by masking. In this case, the protection film 23 can be deposited on a small region on a rear surface side of the display device as illustrated in FIG. 2A, or can be prevented from being deposited on the rear surface side (a region 14) as illustrated in FIG. 2B.

<Variation 2 of Structure of Peripheral Portion of Display Panel>

Figure 4A:
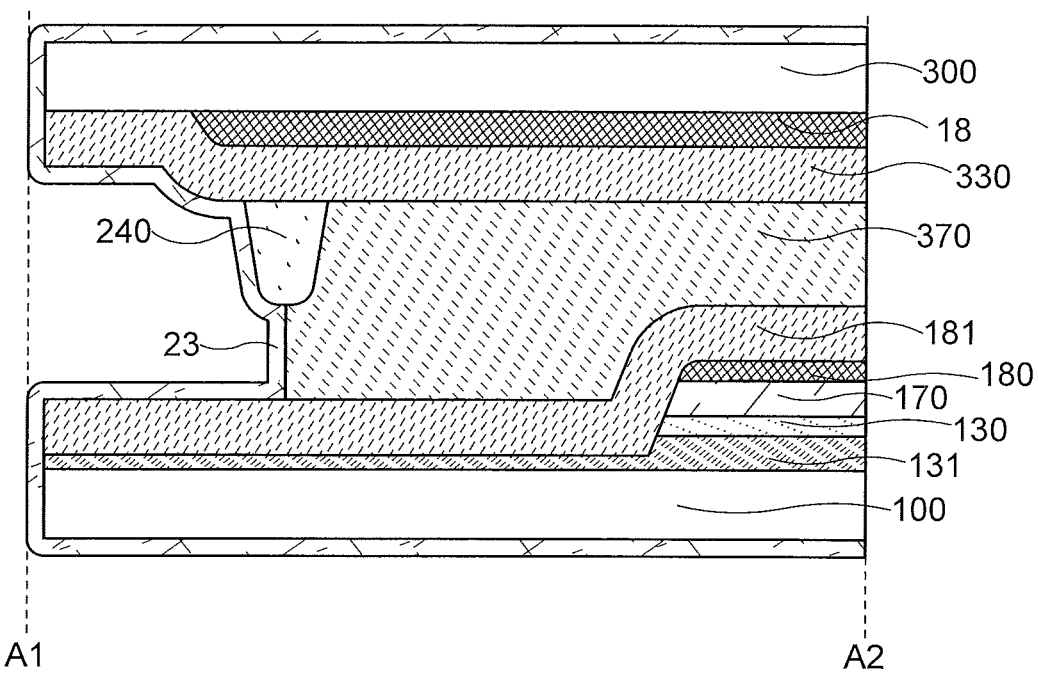
FIGS. 4A and 4B are cross-sectional views each illustrating a display device of one embodiment of the present invention.
Figure 4B:
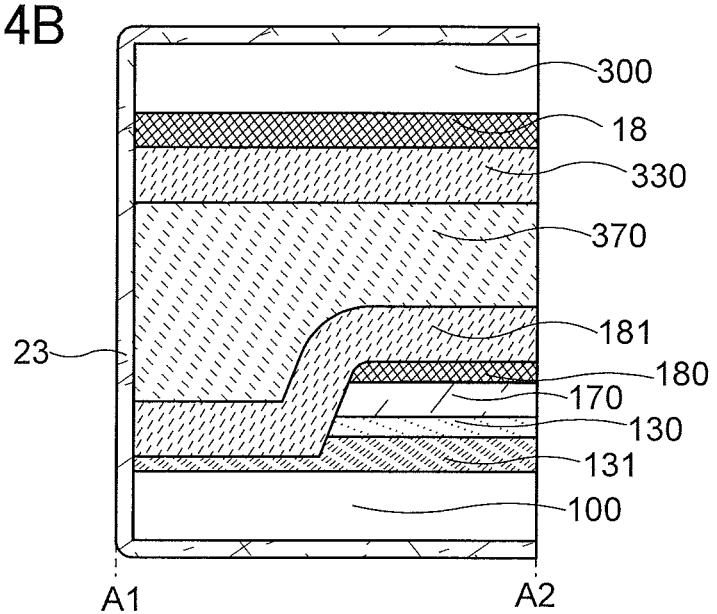

FIGS. 4A and 4B show another structural example of FIG. 1B. The protection film 23 can inhibit entry of moisture and the like and can reduce the number of insulating layers. The structures illustrated in FIGS. 4A and 4B do not include the insulating layer 182 that is used in FIGS. 1B and 1C.

<Variation 3 of Structure of Peripheral Portion of Display Panel>

Figure 5A:
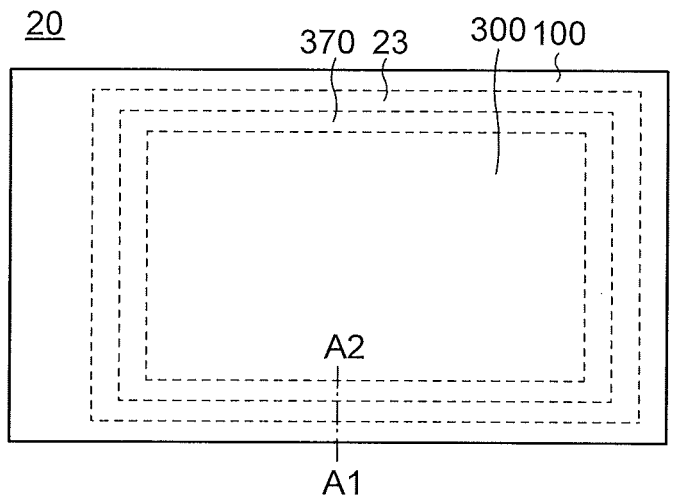
FIGS. 5A to 5D are a top view and cross-sectional views each illustrating a display device of one embodiment of the present invention.
Figure 5B:
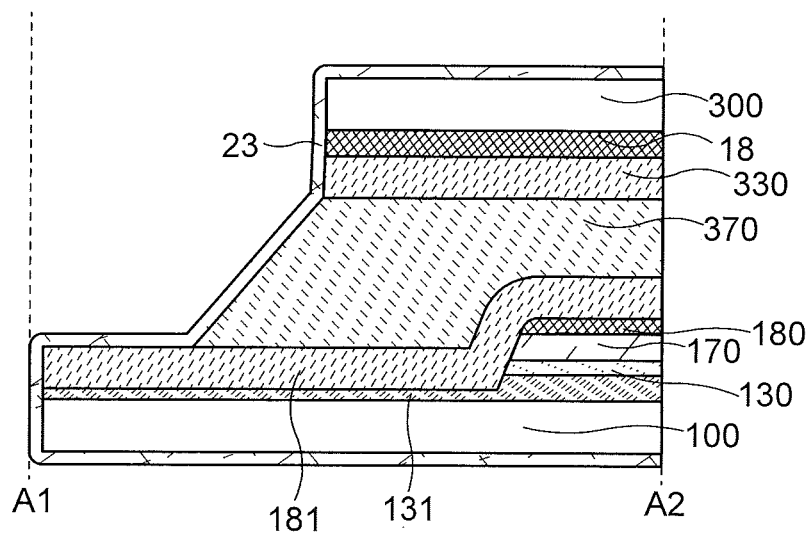

FIG. 5A shows a structural example different from the structural examples of FIGS. 4A and 4B. FIG. 5A is a top view of the display panel 20 seen from the substrate 300 side, and FIG. 5B is a cross-sectional view taken along the dashed-dotted line A1-A2 in FIG. 5A. In FIG. 5A, some layers are omitted for easy viewing. As in FIG. 4A, the structure illustrated in FIG. 5B does not include the insulating layer 182 illustrated in FIG. 1B. In FIGS. 5A and 5B, the area of a top surface of the substrate 300 can be smaller than the area of a top surface of the substrate 100. In such a case, the peripheral portion of the substrate 100 is exposed when seen from the top surface side (the substrate 300 side) as illustrated in FIG. 5A, and the bonding layer 370 has an inclined side surface; thus, the protection film 23 can be formed more uniformly.

Figure 5C:
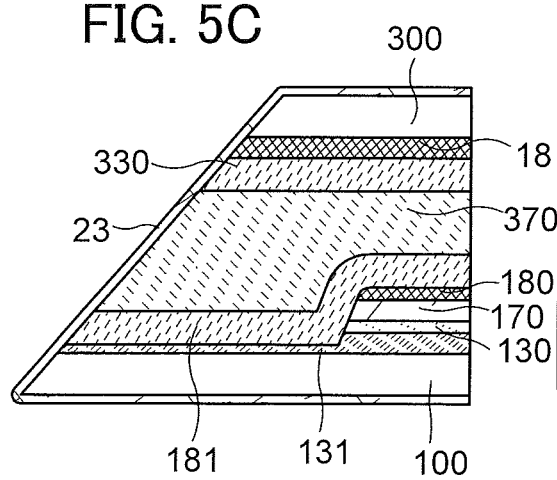
Figure 5D:
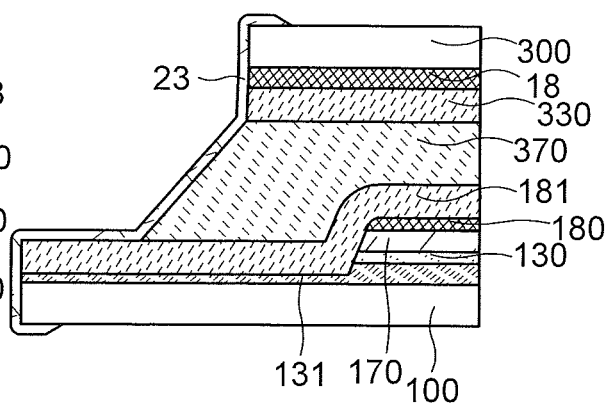

FIG. 5C shows a structural example different from the structural example of FIG. 5A. As illustrated in FIG. 5C, a structure in which the area of the top surface of the substrate 300 is smaller than the area of the top surface of the substrate 100 and there is not unevenness between the substrate 300 and the substrate 100 may be employed. Alternatively, as illustrated in FIG. 5D, the protection film 23 may be hardly deposited on the surfaces of the substrate 100 and the substrate 300.

<Variation 4 of Structure of Peripheral Portion of Display Panel>

FIGS. 6A to 6E show structural examples different from the structural example of FIG. 1B. The protection film 23 can inhibit entry of moisture and the like and can further reduce the number of insulating layers. The structures in FIGS. 6A to 6E do not include the insulating layer 181 and the insulating layer 182 that are used in FIGS. 1B and 1C. The peripheral portion may have unevenness as in FIG. 6A or may have no unevenness as in FIG. 6B. As in FIGS. 6B and 6C, the spacer 240 may be omitted. As in FIG. 6D, the protection film 23 may be hardly deposited on the surfaces of the substrate 100 and the substrate 300. As in FIG. 6E, the protection film 23 in the region 14 may be omitted.

In Embodiment 1, one embodiment of the present invention has been described. Other embodiments of the present invention are described in Embodiments 2 to 10. Note that one embodiment of the present invention is not limited thereto. In other words, various embodiments of the invention are described in Embodiments 1 to 10, and one embodiment of the present invention is not limited to a particular embodiment. Although the example where a film is formed by an ALD method is described in one embodiment of the present invention, one embodiment of the present invention is not limited thereto. Depending on the case or the situation, a variety of film formation methods can be employed in one embodiment of the present invention. For example, in one embodiment of the present invention, a film may be formed by at least any one of a CVD method, a plasma CVD method, an MOCVD method, a PVD method, a sputtering method, an evaporation method, a spin coating method, an ink-jet method, a printing method, and a coating method. Alternatively, depending on the case or the situation, a film may be formed without using an ALD method in one embodiment of the present invention.

Note that the structures, methods, and the like described in this embodiment can be used as appropriate in combination with any of the structures, methods, and the like described in the other embodiments.

Embodiment 2

In this embodiment, a method for manufacturing a plurality of display panels including the protection film 23 described in Embodiment 1 is described.

FIGS. 7A to 7D illustrate a manufacturing method of the display panel 20. In the schematic views of FIGS. 7A to 7D, a liquid crystal element 80 and the adhesive layer 370 are illustrated as a display element, and a display panel can be formed by bonding an element substrate where a transistor, a capacitor, and the like are provided for the substrate 100 and a counter substrate where a light-blocking layer, a coloring layer, and the like are provided for the substrate 300 to seal liquid crystal. Note that portions similar to those of the manufacturing method in FIGS. 3A to 3C are omitted.

Figure 7A:
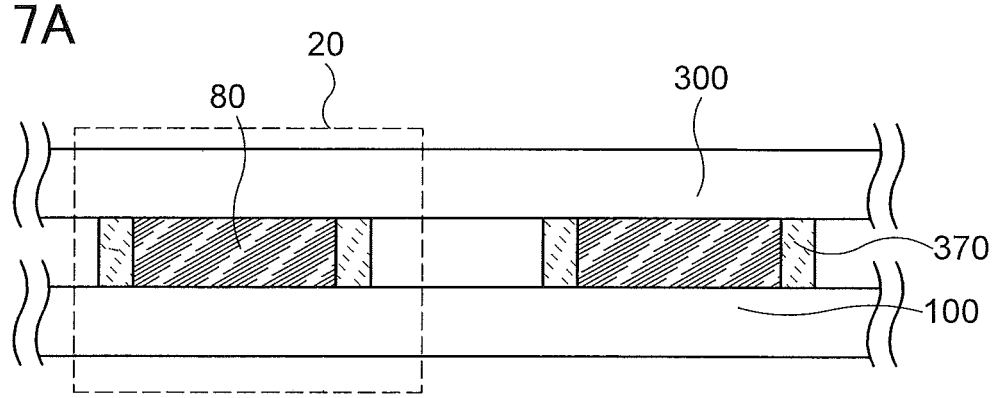
FIGS. 7A to 7D are cross-sectional views illustrating a method for manufacturing a display device of one embodiment of the present invention.
Figure 7B:
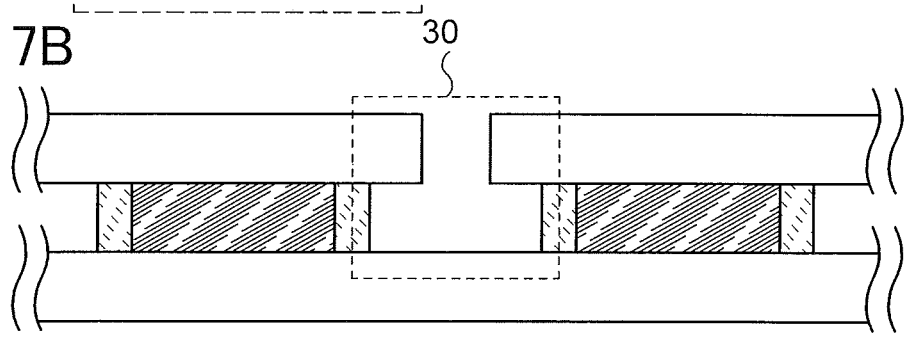
Figure 7C:
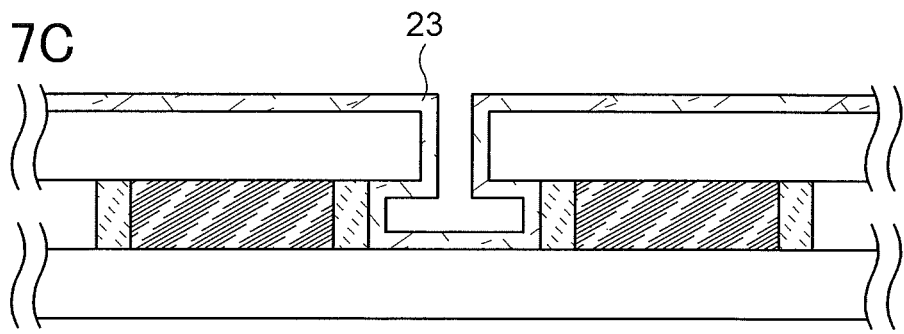

In a structure including the plurality of display panels 20 (see FIG. 7A), the substrate 300 (an upper side) is cut to form a groove portion 30 (see FIG. 7B). After the formation of the groove portion 30, the protection film 23 is formed from the upper side by an ALD method (see FIG. 7C), and the substrate 100 is cut, whereby the plurality of display panels can be finally manufactured (see FIG. 7D). Note that in this case, the formation of the protection film 23 on a rear surface of the display device can be inhibited.

After the cutting, another protection film may be formed by an ALD method.

Figure 7D:
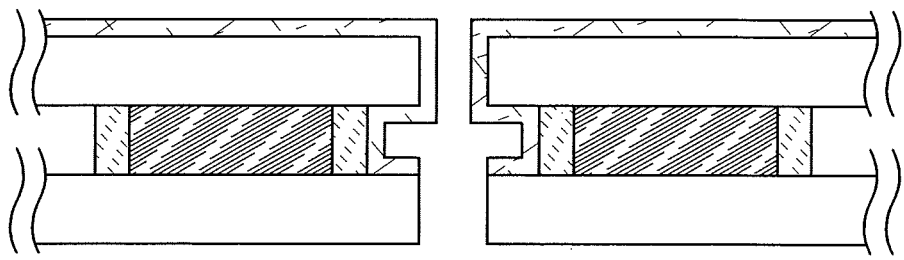
Figure 8A:
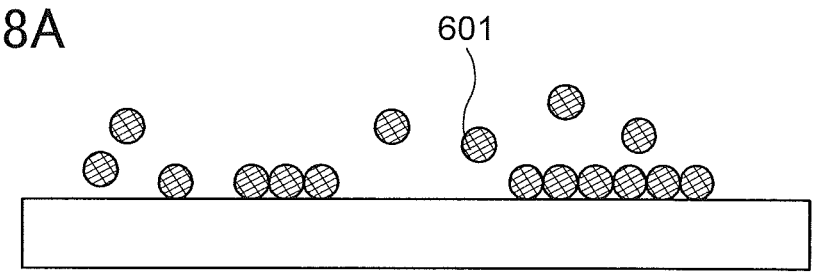
FIGS. 8A to 8D are schematic cross-sectional views illustrating a film formation principle.
Figure 8B:
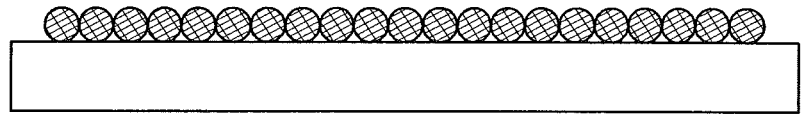
Figure 8C:
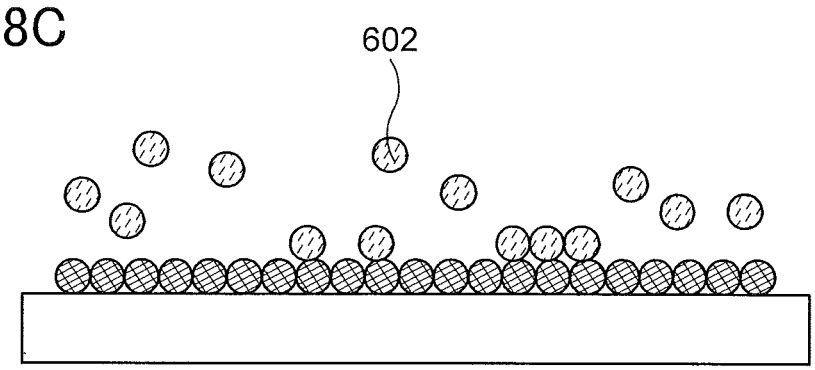
Figure 8D:
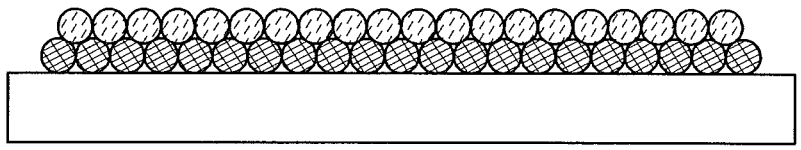

When the substrate 100 is divided as in FIG. 7D, a damaged region that contains a tiny crack (also, referred to as microcrack) is formed in a film at/near the edge of the substrate in some cases. Specifically, when glass is divided by scribing and pressure is applied so as to concentrate a scribed portion, a microcrack is formed at an edge of the divided glass in some cases. In such a case, when the protection film is formed by an ALD method, the protection film fills the microcrack in the damaged region; thus, the protection film can cover the damaged region. Accordingly, embrittlement or a crack in the substrate or the film can be suppressed in the following manufacturing process.

Note that the structures, methods, and the like described in this embodiment can be used as appropriate in combination with any of the structures, methods, and the like described in the other embodiments.

Embodiment 3

<<Deposition Method>>

A deposition apparatus which can be used for forming a semiconductor layer, an insulating layer, a conductive layer, and the like, which can be used in one embodiment of the present invention, is described below.

<<CVD and ALD>>

In a conventional deposition apparatus utilizing a CVD method, one or more kinds of source gases (precursors) for reaction are supplied to a chamber at the same time at the time of deposition. In a deposition apparatus utilizing an ALD method, precursors for reaction are sequentially introduced into a chamber, and then the sequence of the gas introduction is repeated. For example, two or more kinds of precursors are sequentially supplied to the chamber by switching respective switching valves (also referred to as high-speed valves). For example, a first precursor is introduced, an inert gas (e.g., argon or nitrogen) or the like is introduced after the introduction of the first precursor so that the plural kinds of precursors are not mixed, and then a second precursor is introduced. Alternatively, the first precursor may be exhausted by vacuum evacuation instead of the introduction of the inert gas, and then the second precursor may be introduced.

FIGS. 8A to 8D show a film formation process by an ALD method. First precursors 601 are adsorbed onto a substrate surface (see FIG. 8A), whereby a first monolayer is formed (see FIG. 8B). At this time, metal atoms and the like included in the precursors can be bonded to hydroxyl groups that exist at the substrate surface. The metal atoms may be bonded by alkyl groups such as methyl groups or ethyl groups. The first monolayer reacts with second precursors 602 introduced after the first precursors 601 are exhausted (see FIG. 8C), whereby a second monolayer is stacked over the first monolayer. Thus, a thin film is formed (see FIG. 8D). For example, in the case where an oxidizer is included in the second precursors, the oxidizer chemically reacts with metal atoms included in the first precursors or an alkyl group bonded to metal atoms, whereby an oxide film can be formed.

An ALD method is a film formation method based on a surface chemical reaction, by which precursors are adsorbed onto a surface and adsorbing is stopped by a self-terminating mechanism, whereby a layer is formed. For example, precursors such as trimethylaluminum react with hydroxyl groups (OH groups) that exist at the surface. At this time, only a surface reaction due to heating occurs; therefore, the precursors come into contact with the surface and metal atoms or the like in the precursors can be adsorbed onto the surface by thermal energy. The precursors have characteristics of, for example, having a high vapor pressure, being thermally stable and not decomposed before being deposited, and being chemically adsorbed onto a substrate at a high speed. Since the precursors are introduced in a state of a gas, when the first precursors and the second precursors, which are alternately introduced, have enough time to be diffused, a film can be formed with good coverage even onto a region having unevenness with a high aspect ratio.

In an ALD method, the sequence of the gas introduction is repeated a plurality of times until a desired thickness is obtained, whereby a thin film with excellent step coverage can be formed. The thickness of the thin film can be precisely adjusted by controlling the number of repeating times. The deposition rate can be increased and the impurity concentration in the film can be reduced by improving the exhaustion capability.

An ALD method includes an ALD method using heating (thermal ALD method) and an ALD method using plasma (plasma ALD method). In the thermal ALD method, precursors react with each other using thermal energy, and in the plasma ALD method, precursors react with each other in a state of a radical.

By an ALD method, an extremely thin film can be formed with high accuracy. In addition, the coverage of an uneven surface with the film and the film density of the film are high.

Furthermore, plasma damage is not caused by the thermal ALD method. Therefore, generation of defects in a film can be inhibited.

<<Plasma ALD>>

Alternatively, when the plasma ALD method is employed, the film can be formed at a lower temperature than when the thermal ALD method is employed. With the plasma ALD method, for example, the film can be formed without decreasing the deposition rate even at 100° C. or lower. Moreover, in the plasma ALD method, nitrogen radicals can be formed by plasma; thus, a nitride film as well as an oxide film can be formed.

In addition, oxidizability of an oxidizer can be enhanced by the plasma ALD method. By the plasma ALD method, precursors remaining in the film or organic components released from precursors can be reduced. In addition, carbon, chlorine, hydrogen, and the like in the film can be reduced. Therefore, a film with low impurity concentration can be formed.

Furthermore, in the case where a light-emitting element (such as an organic EL element) is used as a display element, when a process temperature is high, the deterioration of the light-emitting element may be accelerated. Here, with the plasma ALD method, the process temperature can be lowered; thus, the deterioration of the light-emitting element can be inhibited.

In the case of using the plasma ALD, inductively coupled plasma (ICP) is used to generate radical species. Accordingly, plasma can be generated at a place apart from the substrate, so that plasma damage to the substrate or a film on which the protection film is formed can be inhibited.

As described above, with the plasma ALD method, the process temperature can be lowered and the coverage of the surface can be increased as compared with other deposition methods, and the protection film can be deposited on the side surface portion of the substrate after the display panel is fabricated. Thus, entry of water from the outside can be inhibited. Therefore, the reliability of driver operation of a peripheral circuit at an edge portion of a panel is improved (the transistor characteristics are improved), so that a stable operation can be achieved even in the case of employing a narrow frame.

<<ALD Apparatus>>

Figure 9A:
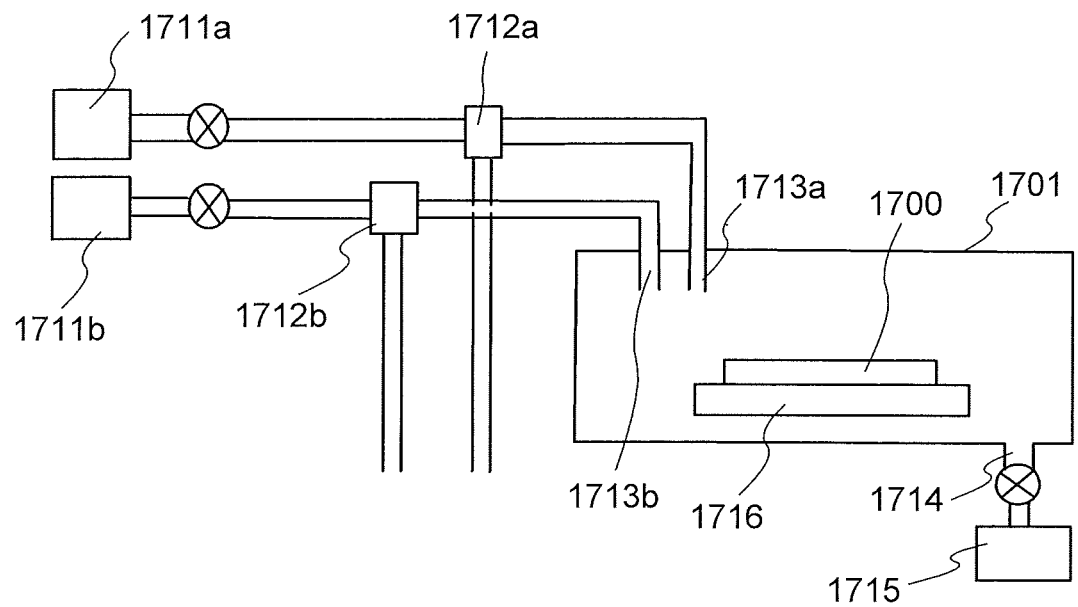
FIG. 9A is a schematic cross-sectional view of a deposition apparatus and FIG. 9B is a schematic top view of a manufacturing apparatus provided with the deposition apparatus.

FIG. 9A illustrates an example of a deposition apparatus utilizing an ALD method. The deposition apparatus utilizing an ALD method includes a deposition chamber (chamber 1701), source material supply portions 1711a and 1711b, high-speed valves 1712a and 1712b which are flow rate controllers, source material introduction ports 1713a and 1713b, a source material exhaust port 1714, and an evacuation unit 1715. The source material introduction ports 1713a and 1713b provided in the chamber 1701 are connected to the source material supply portions 1711a and 1711b, respectively, through supply tubes and valves. The source material exhaust port 1714 is connected to the evacuation unit 1715 through an exhaust tube, a valve, and a pressure controller.

A substrate holder 1716 with a heater is provided in the chamber, and a substrate 1700 over which a film is formed is provided over the substrate holder.

In the source material supply portions 1711a and 1711b, a precursor is formed from a solid source material or a liquid source material by using a vaporizer, a heating unit, or the like. Alternatively, the source material supply portions 1711a and 1711b may supply a precursor in a gas state.

Although two source material supply portions 1711a and 1711b are provided as an example, the number of source material supply portions is not limited thereto, and three or more source material supply portions may be provided. The high-speed valves 1712a and 1712b can be accurately controlled by time, and a precursor and an inert gas are supplied by the high-speed valves 1712a and 1712b. The high-speed valves 1712a and 1712b are flow rate controllers for a precursor, and can also be referred to as flow rate controllers for an inert gas.

In the deposition apparatus illustrated in FIG. 9A, a thin film is formed over a surface of the substrate 1700 in the following manner: the substrate 1700 is transferred to put on the substrate holder 1716, the chamber 1701 is sealed, the substrate 1700 is heated to a desired temperature (e.g., higher than or equal to 100° C. or higher than or equal to 150° C.) by heating the substrate holder 1716 with a heater; and supply of a precursor, evacuation with the evacuation unit 1715, supply of an inert gas, and evacuation with the evacuation unit 1715 are repeated.

In the deposition apparatus illustrated in FIG. 9A, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1711a and 1711b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1711a and 1711b appropriately.

For example, in the case where a hafnium oxide layer is formed by a deposition apparatus using an ALD method, two kinds of gases, i.e., ozone ($O_3$) as an oxidizer and a precursor which is obtained by vaporizing liquid containing a solvent and a hafnium precursor compound (hafnium alkoxide or hafnium amide such as tetrakis(dimethylamide)hafnium (TDMAH)) are used. In this case, the first precursor supplied from the source material supply portion 1711a is TDMAH, and the second precursor supplied from the source material supply portion 1711b is ozone. Note that the chemical formula of tetrakis(dimethylamide)hafnium is Hf[N($CH_3$)$_2$]$_4$. Examples of another material include tetrakis (ethylmethylamide)hafnium. Note that nitrogen has a function of eliminating charge trap states. Therefore, when the precursor contains nitrogen, a hafnium oxide film having low density of charge trap states can be formed.

For example, in the case where an aluminum oxide layer is formed by a deposition apparatus utilizing an ALD method, two kinds of gases, e.g., $H_2O$ as an oxidizer and a precursor which is obtained by vaporizing liquid containing a solvent and an aluminum precursor compound (e.g., trimethylaluminum (TMA)) are used. In this case, the first precursor supplied from the source material supply portion 1711a is TMA, and the second precursor supplied from the source material supply portion 1711b is $H_2O$. Note that the chemical formula of trimethylaluminum is Al($CH_3$)$_3$. Examples of another material liquid include tris(dimethylamide)aluminum, triisobutylaluminum, and aluminum tris (2,2,6,6-tetramethyl-3,5-heptanedionate).

<<Multi-Chamber Manufacturing Apparatus>>

Figure 9B:
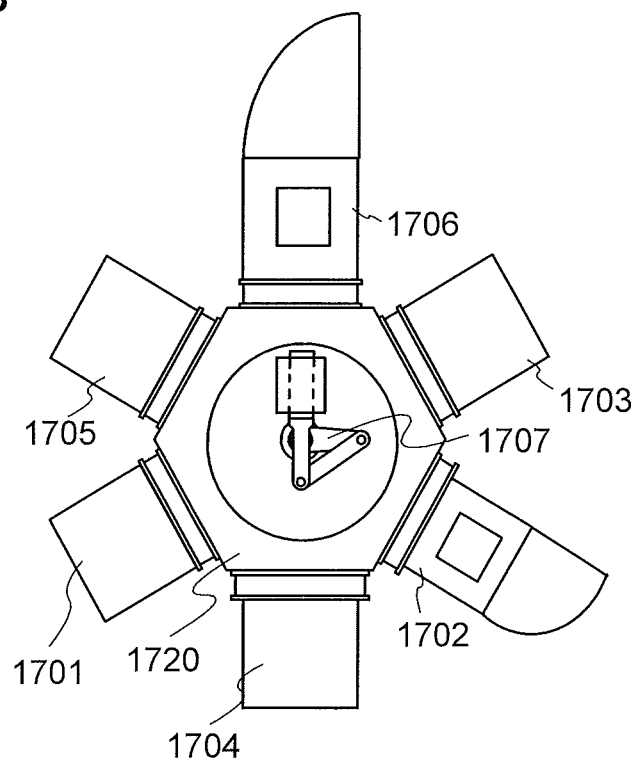

FIG. 9B illustrates an example of a multi-chamber manufacturing apparatus including at least one deposition apparatus illustrated in FIG. 9A.

In the manufacturing apparatus illustrated in FIG. 9B, a stack of films can be successively formed without exposure to the air, and entry of impurities is prevented and throughput is improved.

The manufacturing apparatus illustrated in FIG. 9B includes at least a load chamber 1702, a transfer chamber 1720, a treatment chamber 1703, a chamber 1701 which is a deposition chamber, and an unload chamber 1706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 1704 and 1705 may be deposition apparatuses utilizing an ALD method like the chamber 1701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 1704 is a deposition apparatus utilizing a plasma CVD method and the chamber 1705 is a deposition apparatus utilizing an MOCVD method is shown below.

Although FIG. 9B shows an example in which a top view of the transfer chamber 1720 is a hexagon, a manufacturing apparatus in which the top surface shape is set to a polygon having more than six corners and more chambers are connected depending on the number of layers of a stack may be used. The top surface shape of the substrate is rectangular in FIG. 9B; however, there is no particular limitation on the top surface shape of the substrate. Although FIG. 9B shows an example of the single wafer type, a batch-type deposition apparatus in which films are deposited on a plurality of substrates at a time may be used.

<<Large Area ALD Apparatus>>

Figure 10A:
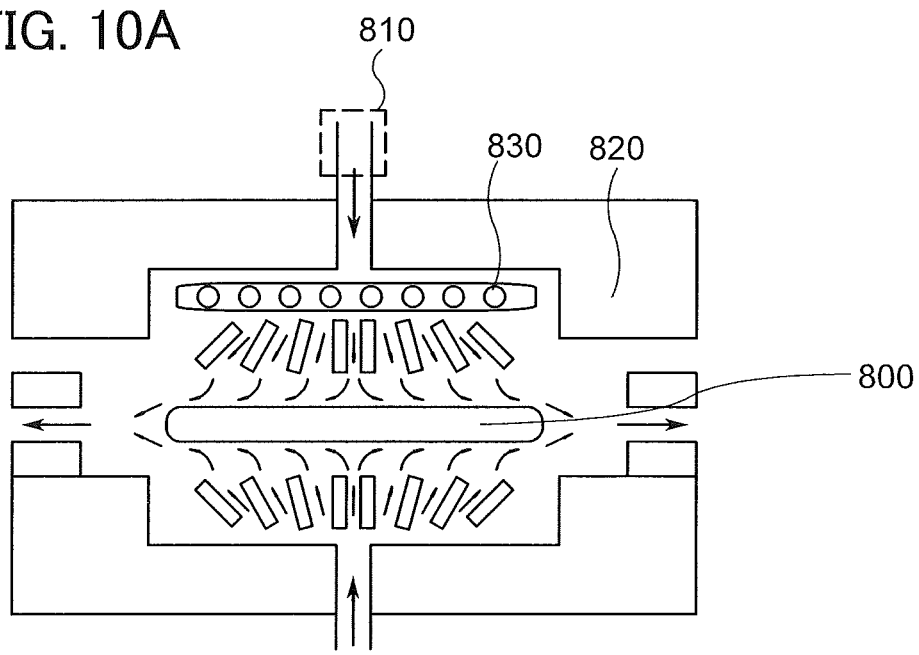
FIGS. 10A and 10B are schematic cross-sectional views of deposition apparatuses.
Figure 10B:
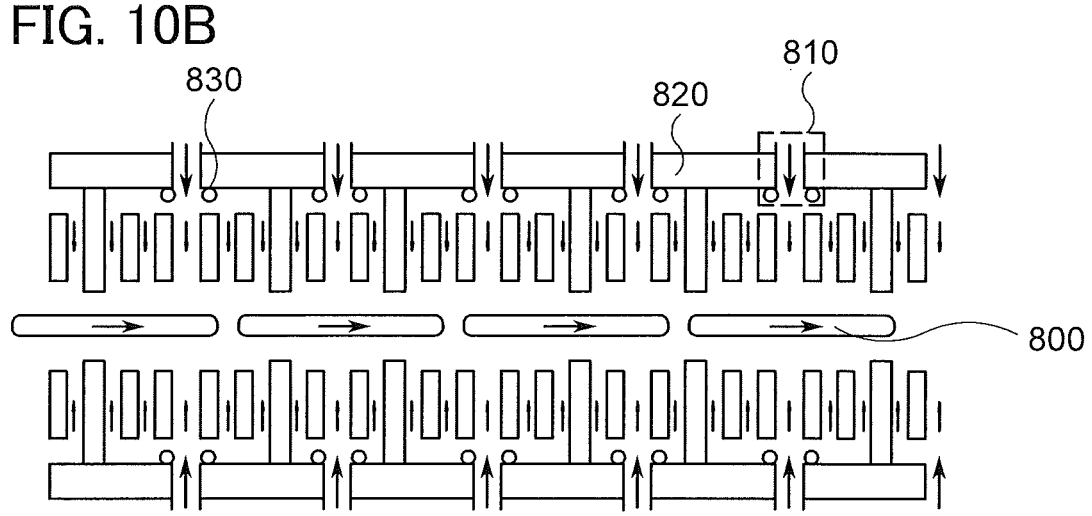

Moreover, with the plasma ALD method, a film can be deposited on a large substrate. FIGS. 10A and 10B are schematic views of other examples of the ALD apparatus. A gas which is made into plasma (precursor) is introduced from an introduction port 810 into a chamber 820, and a film can be deposited on a substrate 800 from above and below through a plasma generation source 830 by an ALD method. The plasma generation source 830 may be positioned in the chamber or outside the chamber. As for the deposition method, the film can be deposited with the substrate fixed in the chamber as illustrated in FIG. 10A, or the film can be deposited while the substrate is carried by an in-line method as illustrated in FIG. 10B. By using the plasma ALD method, the film can be deposited with high throughput and in a large area.

In order to form a film uniformly on a side surface portion of the display panel, film formation may be performed in the state where the display panel is disposed on a susceptor or the like; alternatively, the substrate 100 of the display panel and a jig of a cassette may be in point contact, line contact, or surface contact.

Note that the structures, methods, and the like described in this embodiment can be used as appropriate in combination with any of the structures, methods, and the like described in the other embodiments.

Embodiment 4

In this embodiment, the details of the display device described in Embodiments 1 and 2 are described with reference to drawings.

FIGS. 11A and 11B are examples of a top view and a cross-sectional view of the display device. Note that FIG. 11A illustrates a typical structure including the display panel 20, the display region 21, the peripheral circuit 22, and the FPC 42.

FIG. 11B is a cross-sectional view taken along the dashed lines A-A', B-B', C-C', and D-D' in FIG. 11A. The cross section taken along the dashed line A-A' shows a peripheral portion of the display device, the cross section taken along the dashed line B-B' shows the peripheral circuit portion, the cross section taken along the dashed line C-C' shows the display region, and the cross section taken along the dashed line D-D' shows a portion connected to an FPC.

<<Transistors 50 and 52>>

A transistor 50 can include a conductive layer 120, the insulating layer 130, the insulating layer 131, a semiconductor layer 140, a conductive layer 150, a conductive layer 160, and the insulating layer 170. A transistor 52 can have the same structure. The transistor 50 can further include the insulating layer 181 or the insulating layer 182.

<<Dual-Gate Structure>>

A transistor 55, which is a modification example of the transistor 50, can be used as well. Description is given with reference to FIGS. 35A to 35C. The transistor 55 illustrated in FIGS. 35A to 35C has a dual-gate structure.

Figure 35A:
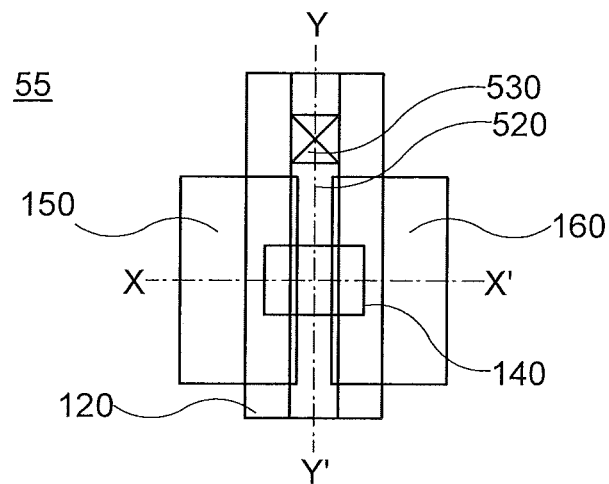
FIGS. 35A to 35C are a top view and cross-sectional views illustrating a transistor of one embodiment of the present invention.
Figure 35B:
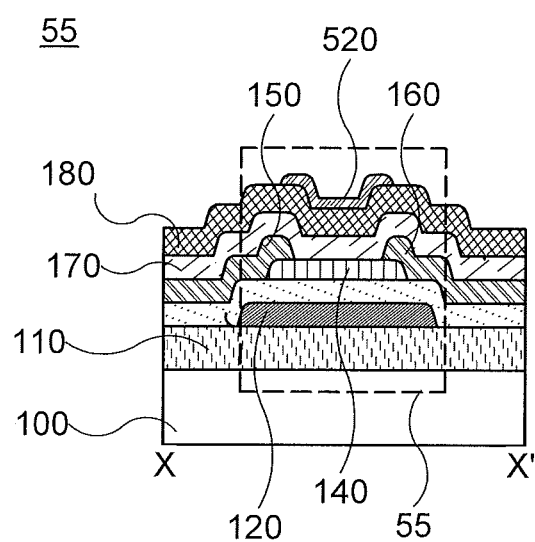
Figure 35C:
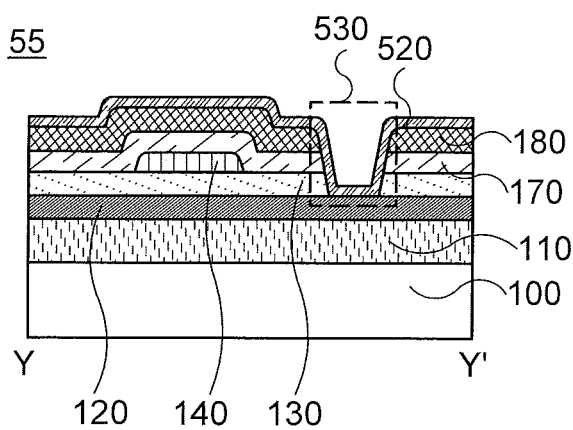

FIG. 35A is a top view of the transistor 55. FIG. 35B is a cross-sectional view taken along the dashed-dotted line X-X' in FIG. 35A, and FIG. 35C is a cross-sectional view taken along the dashed-dotted line Y-Y' in FIG. 35A. Note that in FIG. 35A, the substrate 100, the insulating layer 110, the insulating layer 130, the insulating layer 170, the insulating layer 180, and the like are not illustrated for the sake of clarity.

The transistor 55 illustrated in FIGS. 35A to 35C further includes a conductive layer 520 in addition to the layers included in the transistor 50. The conductive layer 120 can be connected to the conductive layer 520 through an opening 530 formed in the insulating layers 130, 170, and 180.

<<Conductive Layer 520>>

The conductive layer 520 can be formed using a conductive film that transmits visible light or a conductive film that reflects visible light. As the conductive film that transmits visible light, the same material as that of a conductive layer 190 to be described later can be used; for example, a material including one of indium (In), zinc (Zn), and tin (Sn) can be used. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

Alternatively, the conductive film that reflects visible light used for the conductive layer 520 can be formed using the same material used for a conductive layer 220 to be described later.

Note that when a side surface of the semiconductor layer 140 faces the conductive layer 520 in the channel width direction as shown in FIG. 35C, carriers flow not only at the interface between the insulating layer 170 and the semiconductor layer 140 and at the interface between the insulating layer 130 and the semiconductor layer 140 but also in the semiconductor layer 140. Therefore, the amount of transfer of carriers in the transistor 55 is increased. As a result, the on-state current and field-effect mobility of the transistor 55 are increased. The electric field of the conductive layer 520 affects the side surface or an end portion including the side surface and its vicinity of the semiconductor layer 140; thus, generation of a parasitic channel at the side surface or the end portion of the semiconductor layer 140 can be suppressed.

By providing the transistor illustrated in FIGS. 35A to 35C in a pixel portion, signal delay in wirings can be reduced and display defects such as display unevenness can be suppressed even though the number of wirings is increased in a large-sized display device or a high-definition display device.

Note that all of transistors 52 included in the peripheral circuit (gate driver and the like) may have the same structure or may have two or more kinds of structures. All of a plurality of transistors 50 included in the pixel portion may have the same structure, or may have two or more kinds of structures.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

<<Reflective Liquid Crystal Panel>>

As the display panel mounted in the display device, a reflective liquid crystal panel can be used as illustrated in FIG. 11B. In the display device 10 illustrated in FIG. 11B, the liquid crystal element 80 is used as a display element. The display device 10 includes a polarizing plate 103, a polarizing plate 303, a protection substrate 105, a protection substrate 302, a bonding layer 373, a bonding layer 374, a bonding layer 375, and a bonding layer 376. In the case of a reflective liquid crystal panel, part or whole of the pixel electrode functions as a reflective electrode (described later). In that case, a memory circuit such as an SRAM can be provided under the reflective electrode, which can further reduce the power consumption.

Other examples of the liquid crystal panel include a transmissive liquid crystal panel (described later), a semi-transmissive liquid crystal panel, a direct-view liquid crystal panel, and a projection liquid crystal panel.

<<Substrate 100>>

There is no particular limitation on a material and the like of a substrate 100 as long as the material has heat resistance high enough to withstand at least heat treatment performed later. The substrate 100 desirably has a high light-transmitting property.

For the substrate 100, an organic material, an inorganic material, a composite material of an organic material and an inorganic material, or the like can be used. For example, an inorganic material such as glass, a ceramic, or a metal can be used for the substrate 100.

Specifically, non-alkali glass, soda-lime glass, potash glass, crystal glass, or the like can be used for the substrate 100. An inorganic oxide film, an inorganic nitride film, an inorganic oxynitride film, or the like can be used for the substrate 100. For example, silicon oxide, silicon nitride, silicon oxynitride, alumina, or the like can be used for the substrate 100. Stainless steel, aluminum, or the like can be used for the substrate 100.

A single-layer material or a stacked-layer material in which a plurality of layers are stacked can be used for the substrate 100. For example, a stacked-layer material in which a base, an insulating film that prevents diffusion of impurities contained in the base, and the like are stacked can be used for the substrate 100. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 100. Alternatively, a stacked-layer material in which a resin and a film for preventing diffusion of impurities that penetrate the resin, such as a silicon oxide film, a silicon nitride film, and a silicon oxynitride film are stacked can be used for the substrate 100.

The above-described substrate that can be used as the substrate 100 can be used as the substrate 300 as well.

<<Insulating Layer 110>>

The insulating layer 110 that functions as a base film is formed using silicon oxide, silicon oxynitride, silicon nitride, silicon nitride oxide, gallium oxide, hafnium oxide, yttrium oxide, aluminum oxide, aluminum oxynitride, or the like. Note that when silicon nitride, gallium oxide, hafnium oxide, yttrium oxide, aluminum oxide, or the like is used as a material for the insulating layer 110, it is possible to suppress diffusion of impurities such as alkali metal, water, and hydrogen into the semiconductor layer 140 from the substrate 100. The insulating layer 110 is formed over the substrate 100. The insulating layer 110 is not necessarily provided.

<<Conductive Layer 120>>

The conductive layer 120 that functions as a gate electrode is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Furthermore, one or more metal elements selected from manganese and zirconium may be used. The conductive layer 120 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum; tungsten, molybdenum, chromium, neodymium, and scandium may be used.

<<Insulating Layer 130>>

The insulating layer 130 functions as a gate insulating film. The insulating layer 130 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 130 may contain lanthanum (La), nitrogen, or zirconium (Zr) as an impurity. For the insulating layer 130, for example, silicon oxynitride can be used.

<<Insulating Layer 131>>

The stacked insulating layers 130 and 131 can be used as the gate insulating film. For the insulating layer 131, the same material used for the insulating layer 130 can be used. For example, silicon nitride can be used for the insulating layer 131. Use of the insulating layer 131 can prevent entry of hydrogen, water, and the like from the outside to the semiconductor layer 140.

<<Semiconductor Layer 140>>

The semiconductor layer 140 is formed with a metal oxide containing at least In or Zn. The area of a top surface of the semiconductor layer 140 is preferably equal to or smaller than the area of a top surface of the conductive layer 120.

<<Oxide Semiconductor>>

As an oxide semiconductor used for the aforementioned semiconductor layer 140, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

When the semiconductor layer 140 is formed using an In-M-Zn oxide, the atomic ratio of In to M when the summation of In and M is assumed to be 100 atomic % is preferably as follows: the proportion of In is higher than 25 atomic % and the proportion of M is lower than 75 atomic %; further preferably, the proportion of In is higher than 34 atomic % and the proportion of M is lower than 66 atomic %.

The energy gap of the semiconductor layer 140 is 2 eV or more, preferably 2.5 eV or more, and further preferably 3 eV or more. With the use of an oxide semiconductor having such a wide energy gap, the off-state current of the transistor 50 can be reduced.

The thickness of the semiconductor layer 140 desirably ranges from 3 nm to 200 nm, preferably from 3 nm to 100 mu, and further preferably from 3 nm to 50 nm. In the case where the oxide semiconductor layer 140 is formed using an In-M-Zn oxide (M is Al, Ga, Y, Zr, La, Ce, or Nd, and is not limited to a natural number), it is preferable that the atomic ratio of metal elements of a sputtering target used for forming the In-M-Zn oxide be In:M:Zn=1:1:1, In: M Zn=1:1:1.2, In: M Zn 1:1:1.5, In:M:Zn=2:1:3, In:M:Zn=3:1:2, In:M:Zn=4:2:4.1. Note that the atomic ratio of metal elements in the formed semiconductor layer 140 varies from the above atomic ratio of metal elements of the sputtering target within a range of ±40% as an error. Note that a c-axis aligned crystalline oxide semiconductor (CAAC-OS) film and a microcrystalline oxide semiconductor film that are described later can be formed using a target including an In—Ga—Zn oxide, preferably a polycrystalline target including an In—Ga—Zn oxide.

Hydrogen contained in the semiconductor layer 140 reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Further, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen as well as the oxygen vacancies in the semiconductor layer 140 be reduced as much as possible. Specifically, in the semiconductor layer 140, the concentration of hydrogen which is measured by secondary ion mass spectrometry (SIMS) is set to lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, and still more preferably lower than or equal to $1\times10^{16}$ atoms/cm$^3$. As a result, the transistor 50 has a positive threshold voltage (also referred to as nominally-off characteristics).

When silicon or carbon which is one of the elements belonging to Group 14 is contained in the semiconductor layer 140, oxygen vacancies are increased in the semiconductor layer 140, and the semiconductor layer 140 has n-type conductivity. Thus, the concentration of silicon or carbon (the concentration is measured by SIMS) in the semiconductor layer 140 is lower than or equal to $2\times10^{18}$ atoms/cm$^3$, preferably lower than or equal to $2\times10^{17}$ atoms/cm$^3$. As a result, the transistor 50 has a positive threshold voltage (also referred to as normally-off characteristics).

Furthermore, the concentration of alkali metal or alkaline earth metal in the semiconductor layer 140, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the semiconductor layer 140. As a result, the transistor 50 has a positive threshold voltage (also referred to as normally-off characteristics).

Furthermore, when nitrogen is contained in the semiconductor layer 140, electrons serving as carriers are generated to increase the carrier density, so that the semiconductor layer 140 easily has n-type conductivity. Thus, the transistor tends to have normally-on characteristics. For this reason, nitrogen in the semiconductor layer 140 is preferably reduced as much as possible; for example, the concentration of nitrogen which is measured by SIMS is preferably set to lower than or equal to $5\times10^{18}$ atoms/cm$^3$.

When impurities in the semiconductor layer 140 are reduced, the carrier density of the semiconductor layer 140 can be lowered. The carrier density of the semiconductor layer 140 is $1\times10^{15}$/cm$^3$ or less, preferably $1\times10^{13}$/cm$^3$ or less, further preferably $8\times10^{11}$/cm$^3$ or less, further preferably less than $1\times10^{11}$/cm$^3$, further preferably less than $1\times10^{10}$/cm$^3$, and $1\times10^{-9}$/cm$^3$ or more.

When an oxide semiconductor having a low impurity concentration and a low density of defect states is used for the semiconductor layer 140, the transistor can have more excellent electrical characteristics. Here, the state in which impurity concentration is low and the density of defect states is low (the amount of oxygen vacancies is small) is referred to as "highly purified intrinsic" or "substantially highly purified intrinsic." A highly purified intrinsic or substantially highly purified intrinsic oxide semiconductor has few carrier generation sources, and thus has a low carrier density in some cases. Thus, the transistor whose channel region is formed in the semiconductor layer 140 including the oxide semiconductor is likely to have a positive threshold voltage (also referred to as normally-off characteristics). A highly purified intrinsic or substantially highly purified intrinsic oxide semiconductor has a low density of defect states and accordingly has a low density of trap states in some cases. The transistor including the semiconductor layer 140 containing the highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. In addition, variation in characteristics can be prevented.

In the case where the voltage between a source and a drain is set to about 0.1 V, 5 V, or 10 V, for example, the off-state current standardized on the channel width of the transistor 50 in which the semiconductor layer 140 is used for the semiconductor layer can be as low as several yoctoamperes per micrometer to several zeptoamperes per micrometer.

When a transistor with an extremely low off-state leakage current is used as the transistor 50 connected to a display element (e.g., the liquid crystal element 80), the time for holding image signals can be extended. For example, images can be held even when the frequency of writing image signals is more than or equal to 11.6 (once a day) and less than 0.1 Hz (0.1 times a second), preferably more than or equal to 0.28 mHz (once an hour) and less than 1 Hz (once a second). Thus, the frequency of writing image signals can be reduced, which leads to a reduction in power consumption of the display panel 20. Needless to say, the frequency of writing image signals can be more than or equal to 1 Hz, preferably more than or equal to 30 Hz (30 times a second), further preferably more than or equal to 60 Hz (60 times a second) and less than 960 Hz (960 times a second).

From the above reason, the use of a transistor containing an oxide semiconductor allows fabrication of a highly reliable display panel with low power consumption.

In the transistor including an oxide semiconductor, the semiconductor layer 140 can be formed by a sputtering method, a metal organic chemical vapor deposition (MOCVD) method, or a pulse laser deposition (PLD) method, for example. In the case where the semiconductor layer 140 is formed by a sputtering method, a large-area display device can be manufactured.

Note that instead of the semiconductor layer 140, a semiconductor layer including silicon or silicon germanium may be used. The semiconductor layer including silicon or silicon germanium can have an amorphous structure, a polycrystalline structure, or a single crystal structure, as appropriate.

<<Conductive Layers 150 and 160>>

Each of the conductive layers 150 and 160 has a function of a source electrode, a drain electrode, or an electrode of a capacitor. The conductive layers 150 and 160 are formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Furthermore, one or more metal elements selected from manganese and zirconium may be used. The conductive layers 150 and 160 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

<<Insulating Layer 170>>

The insulating layer 170 has a function of protecting the channel region of the transistor. The insulating layer 170 is formed using an oxide insulating film such as silicon oxide, silicon oxynitride, aluminum oxide, aluminum oxynitride, gallium oxide, gallium oxynitride, yttrium oxide, yttrium oxynitride, hafnium oxide, or hafnium oxynitride, or a nitride insulating film such as silicon nitride or aluminum nitride. The insulating layer 170 can have a single-layer structure or a stacked-layer structure.

The insulating layer 170 is preferably formed using an oxide insulating film containing more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen atoms is greater than or equal to $1.0 \times 10^{18}$ atoms/cm$^3$, preferably greater than or equal to $3.0 \times 10^{20}$ atoms/cm$^3$ in themial desorption spectroscopy (TDS) analysis in which heat treatment is performed such that a temperature of a film surface is higher than or equal to 100° C. and lower than or equal to 700° C. or higher than or equal to 100° C. and lower than or equal to 500° C. By the heat treatment, oxygen contained in the insulating layer 170 can be transferred to the semiconductor layer 140, so that the amount of oxygen vacancies in the semiconductor layer 140 can be reduced.

<<Insulating Layer 180>>

When an insulating film having a blocking effect against oxygen, hydrogen, water, and the like is provided as the insulating layer 180, it is possible to prevent outward diffusion of oxygen from the semiconductor layer 140 and entry of hydrogen, water, or the like into the semiconductor layer 140 from the outside. The insulating layer 180 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials. The insulating layer 180 may contain lanthanum (La), nitrogen, or zirconium (Zr) as an impurity.

<<Insulating Layer 181>>

The insulating layer 181 has a function of making a flat surface. An inorganic material or an organic material can be used for the insulating layer 181. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used.

<<Insulating Layer 182>>

When an insulating film having a blocking effect against oxygen, hydrogen, water, and the like is provided as the insulating layer 182, the insulating layer 182 in addition to the insulating layer 180 can prevent outward diffusion of oxygen from the semiconductor layer 140 and entry of hydrogen, water, or the like into the semiconductor layer 140 from the outside. The insulating layer 182 can be formed using, for example, an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 182 may be a stack of any of the above materials. The insulating layer 182 may contain lanthanum (La), nitrogen, or zirconium (Zr) as an impurity.

<<Liquid Crystal Element 80>>

The liquid crystal element 80 can be driven in a twisted nematic (TN) mode, for example. The liquid crystal element 80 includes a liquid crystal layer 390, the conductive layer 220, and the conductive layer 380.

Although not illustrated in FIGS. 11A and 11B, an alignment film may be provided on a side of the conductive layer 220 in contact with the liquid crystal layer 390 and on a side of the conductive layer 380 in contact with the liquid crystal layer 390.

Since the liquid crystal layer 390 is sandwiched between the conductive layer 220 and the conductive layer 380, liquid crystal molecules can be controlled by an electric field generated therebetween. As a method for driving a display device using a liquid crystal element, for example, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an in-plane switching (IPS) mode, or a transverse bend alignment (TBA) mode may be used. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

The liquid crystal element 80 may be formed using a liquid crystal composition including a liquid crystal exhibiting a nematic phase and a chiral material. In that case, a cholesteric phase or a blue phase is exhibited. The liquid crystal exhibiting a blue phase has a short response time of 1 msec or less. Since the liquid crystal exhibiting a blue phase is optically isotropic, alignment treatment is not necessary and viewing angle dependence is small.

<<Conductive Layer 220>>

For the conductive layer 220 that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. A metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

<<Capacitors 60 and 62>>

A capacitor 60 can include the conductive layer 120, the insulating layer 130, the insulating layer 131, and the conductive layer 160. The conductive layer 120 has a function of one electrode of a capacitor 60. The conductive layer 160 has a function of the other electrode of the capacitor 60. The insulating layer 130 and the insulating layer 131 are positioned between the conductive layer 120 and the conductive layer 160. The capacitor 62 can have the same structure as the capacitor 60.

<<Conductive Layer 380>>

The conductive layer 380 is formed using a conductive film that transmits visible light. For example, a material including one of indium (In), zinc (Zn), and tin (Sn) can be used for the conductive film that transmits visible light. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

<<Insulating Layer 330>>

The insulating layer 330 has a function of making a flat surface. An inorganic material or an organic material can be used for the insulating layer 330. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used.

<<Coloring Layer 360>>

A coloring layer 360 transmits light in a specific wavelength range. For example, a color filter that transmits light in a specific wavelength range, such as red, green, blue, or yellow light, can be used. Each coloring layer is formed in a desired position with any of various materials by a printing method, an inkjet method, an etching method using a photolithography method, or the like. In a white pixel, a resin such as a transparent resin or a white resin may overlap with the light-emitting element.

<<Light-Blocking Layer 18>>

A light-blocking material can be used for the light-blocking layer 18. A resin in which a pigment is dispersed, a resin containing a dye, or an inorganic film such as a black chromium film can be used for the light-blocking layer 18. Carbon black, an inorganic oxide, a composite oxide containing a solid solution of a plurality of inorganic oxides, or the like can be used for the light-blocking layer 18.

<<Spacer 240>>

An insulating material can be used for a spacer 240. For example, an inorganic material, an organic material, or a stacked-layer material of an inorganic material and an organic material can be used. Specifically, a film containing silicon oxide, silicon nitride, or the like, acrylic, polyimide, a photosensitive resin, or the like can be used.

<<Adhesive layer 370>>

An inorganic material, an organic material, a composite material of an inorganic material and an organic material, or the like can be used for the adhesive layer 370.

For example, an organic material such as a light curable adhesive, a reactive curable adhesive, a thermosetting adhesive, and/or an anaerobic adhesive can be used for the adhesive layer 370. Note that each of the adhesives can be used alone or in combination.

The light curable adhesive refers to, for example, an adhesive that is cured by ultraviolet rays, an electron beam, visible light, infrared light, or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, silica, or the like can be used for the adhesive layer 370.

The material is cured rapidly particularly when a light curable adhesive is used, leading to shortening of the process time. In addition, influence of the film formation step can be inhibited because curing starts with light irradiation. In addition, involuntary curing of the adhesive due to environment can be prevented because curing starts with light irradiation. Furthermore, curing can be performed at low temperatures to facilitate the control of process environment. From the above reasons, the use of a light curable adhesive shortens the process time and reduces processing costs.

<<FPC 42>>

The FPC 42 is electrically connected to the conductive layer 160 through an anisotropic conductive film 510. An image signal and the like can be supplied from the FPC 42 to the driver circuit including the transistor 52, the capacitor 62, and the like.

<Insulating Layers 181 and 182 with Unevenness>

The insulating layer 181 and the insulating layer 182 can have unevenness in a pixel region, and thus external light that enters the conductive layer 220 and reflects can be scattered. Accordingly, light reflection can be prevented.

<Insulating Layers 181 and 182 without Unevenness and Scattering Film 304>

Figure 12:
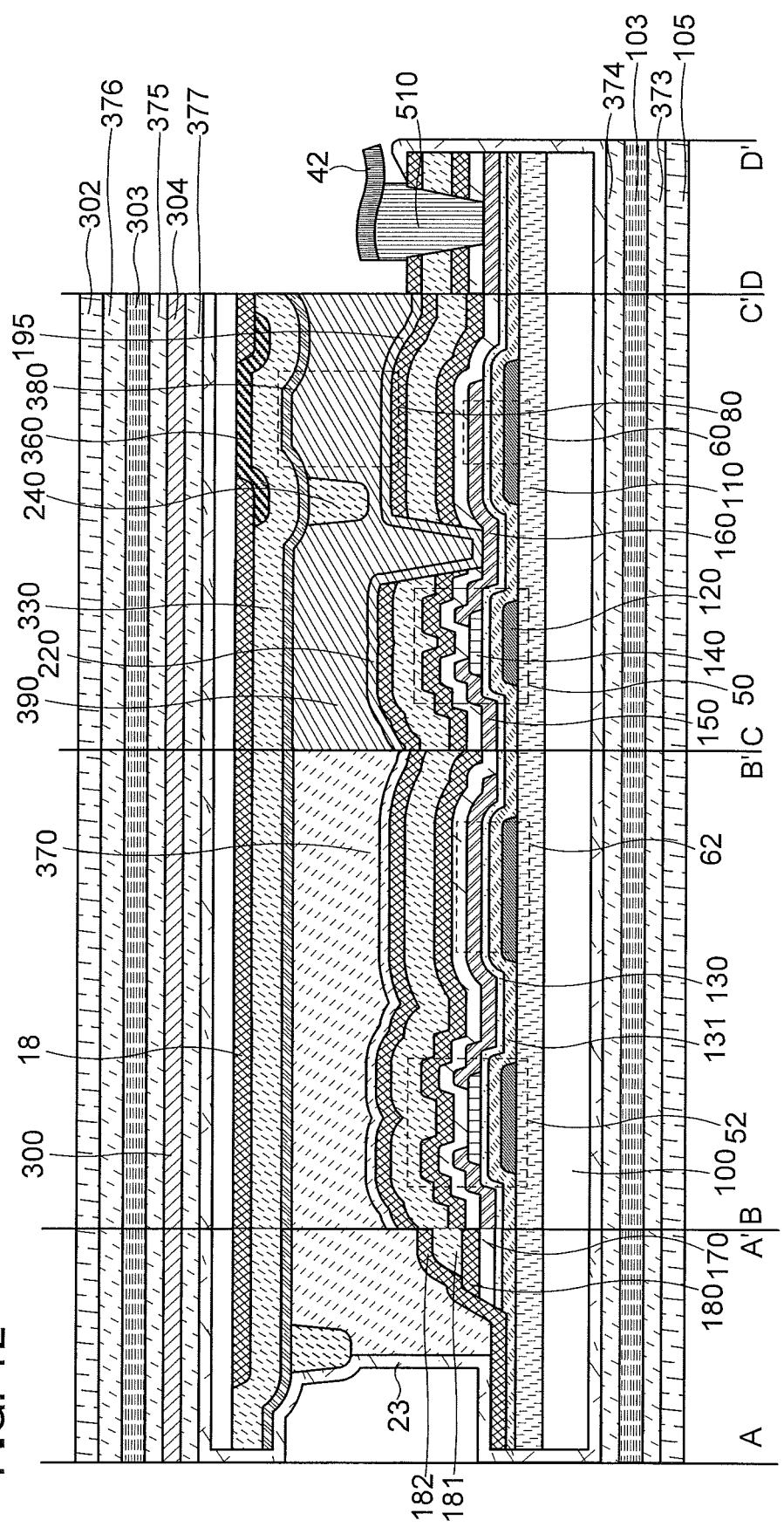
FIG. 12 is a cross-sectional view illustrating a display device of one embodiment of the present invention.

Alternatively, the insulating layer 181 and the insulating layer 182 do not necessarily have unevenness. FIG. 12 is a cross-sectional view of another structure of the display device illustrated in FIGS. 11A and 11B. In this case, a scattering film 304 and a bonding layer 377 are provided on the viewer side of the substrate 300 (the top surface side of the display device), whereby the same effect as that in FIGS. 11A and 11B can be obtained.

<Shape 1 of Substrate Edge of Display Device>

Figure 13:
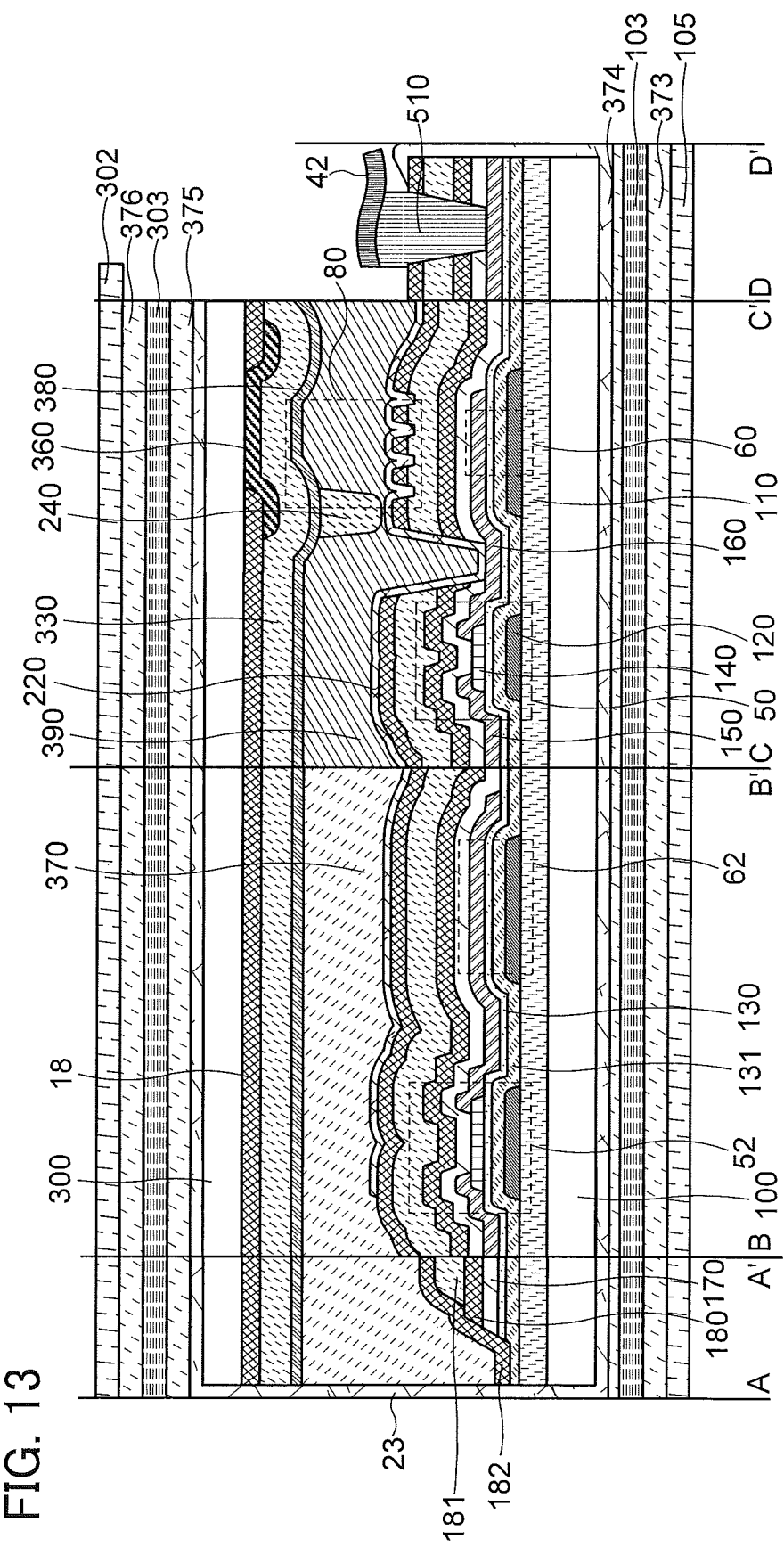
FIG. 13 is a cross-sectional view illustrating a display device of one embodiment of the present invention.

FIG. 13 is a cross-sectional view of another structure of the display device illustrated in FIG. 11B. The protection film 23 in FIG. 13 in which an edge of the substrate does not have unevenness as in FIG. 1C can be formed by an ALD method.

<Shape 2 of Substrate Edge of Display Device>

Figure 14:
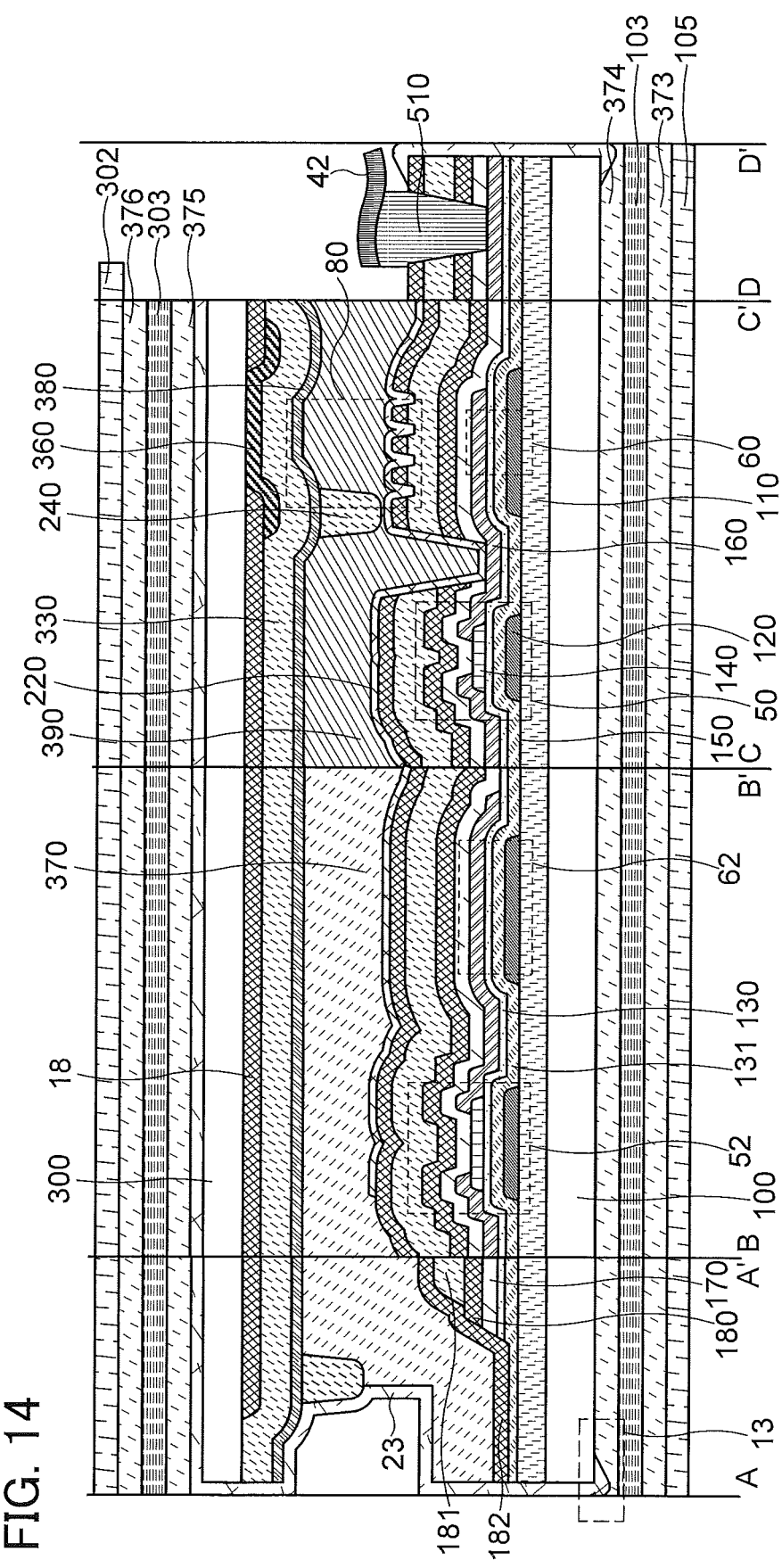
FIG. 14 is a cross-sectional view illustrating a display device of one embodiment of the present invention.
Figure 15:
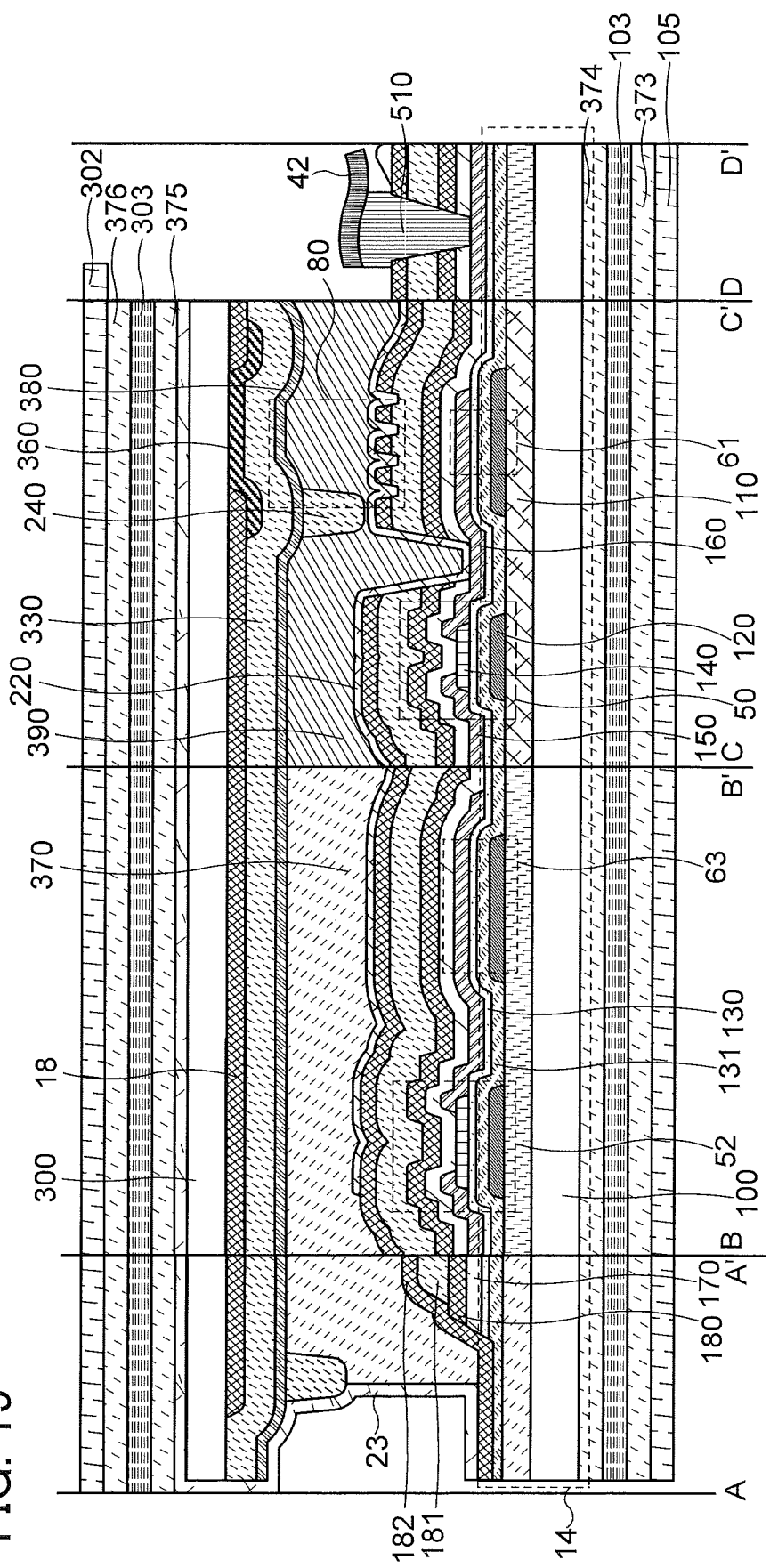
FIG. 15 is a cross-sectional view illustrating a display device of one embodiment of the present invention.

The protection film 23 can be formed in a selected region on a surface and a side surface of the display device 10. FIG. 14 and FIG. 15 are cross-sectional views of the display devices.

FIG. 14 shows a structure in which the protection film 23 is hardly deposited on the rear surface of the display device (on the substrate 100 side) as illustrated in FIG. 2A. For example, in the structure of FIG. 14, with use of a mask, the protection film 23 can be prevented from being deposited on the rear surface and an upper surface of the FPC 42. In that case, the protection film may cover an edge of the substrate 100 or the substrate 300 as illustrated in a region 13. Alternatively, as illustrated in FIG. 15, the region 14 in which the protection film is not deposited on the rear surface can be provided by the method illustrated in FIGS. 7A to 7D.

<Shape 3 of Substrate Edge of Display Device>

Figure 16:
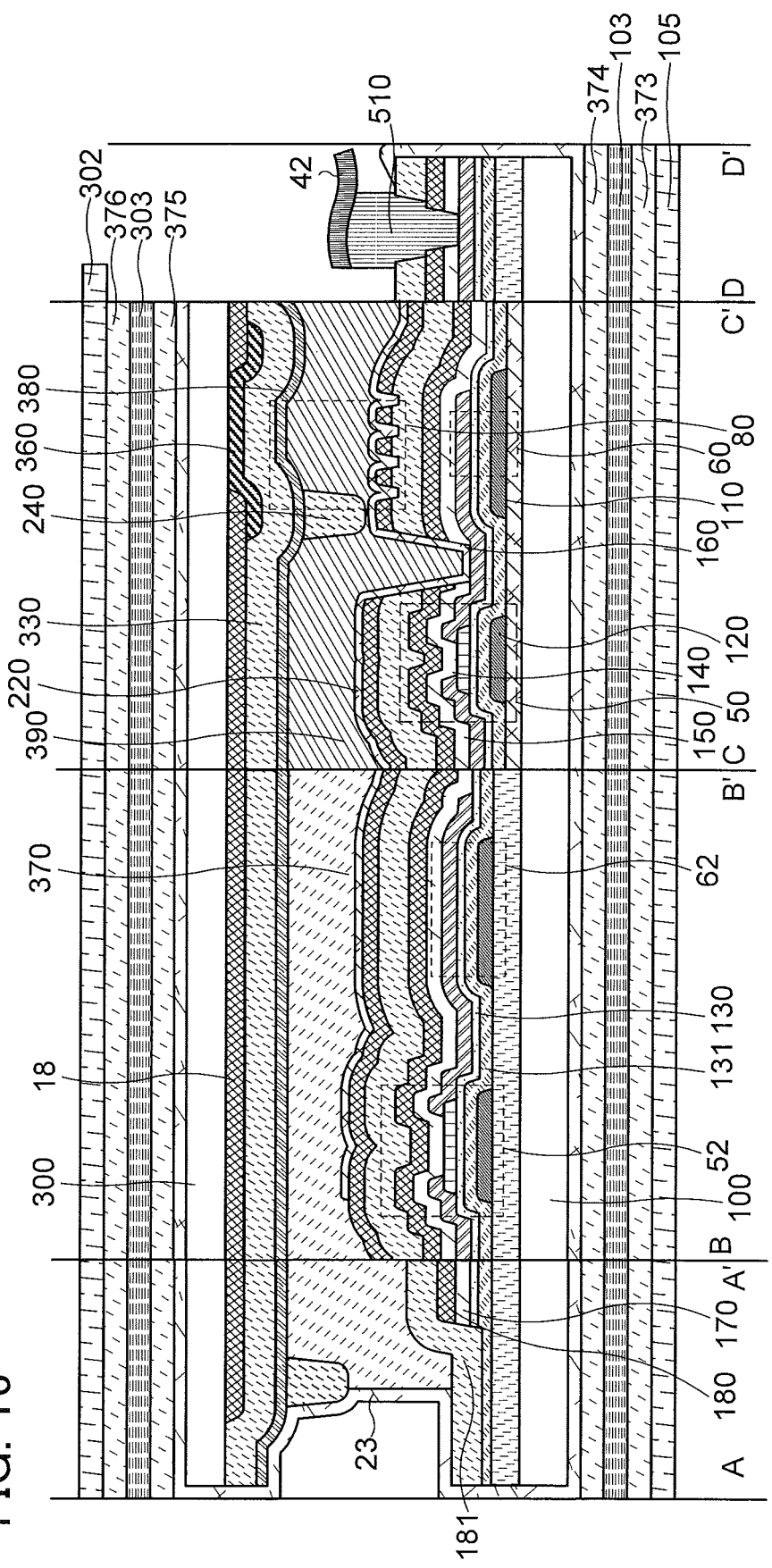
FIG. 16 is a cross-sectional view illustrating a display device of one embodiment of the present invention.
Figure 17:
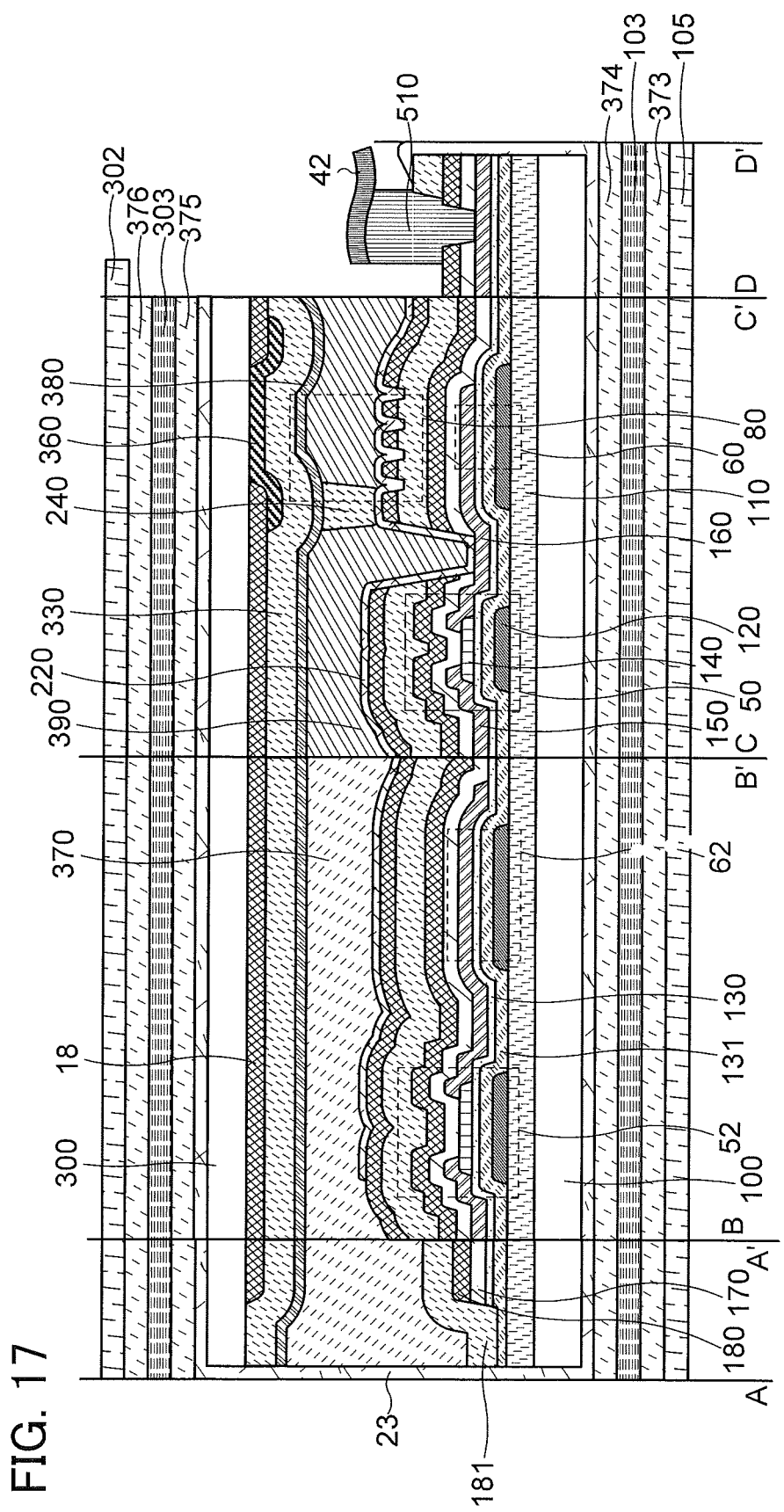
FIG. 17 is a cross-sectional view illustrating a display device of one embodiment of the present invention.
Figure 18:
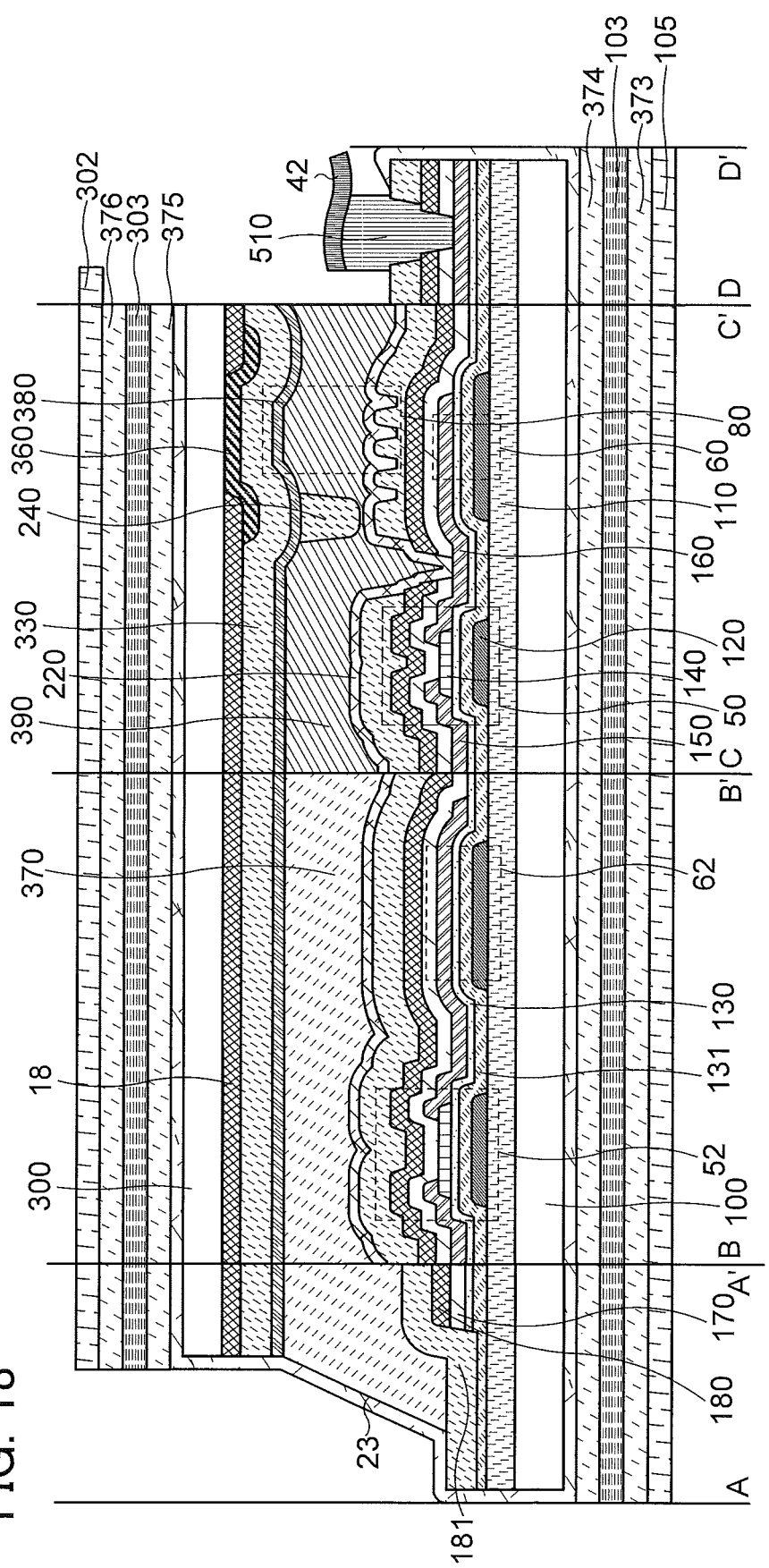
FIG. 18 is a cross-sectional view illustrating a display device of one embodiment of the present invention.

FIG. 16, FIG. 17, and FIG. 18 show structural examples of the display device 10 which are different from the above-described structural examples. The structure of FIG. 16 employs the structure of FIG. 4A. The structure of FIG. 17 employs the structure of FIG. 4B. The structure of FIG. 18 employs the structure of FIG. 5A. In each of the structures, by providing the protection film 23, entry of atmospheric components such as water can be prevented and the insulating layer 182 can be omitted.

In the structure of FIG. 18, the protection film 23 can be formed more uniformly by making the area of the substrate 300 smaller than the area of the substrate 100.

<Shape 4 of Substrate Edge of Display Device>

Figure 19:
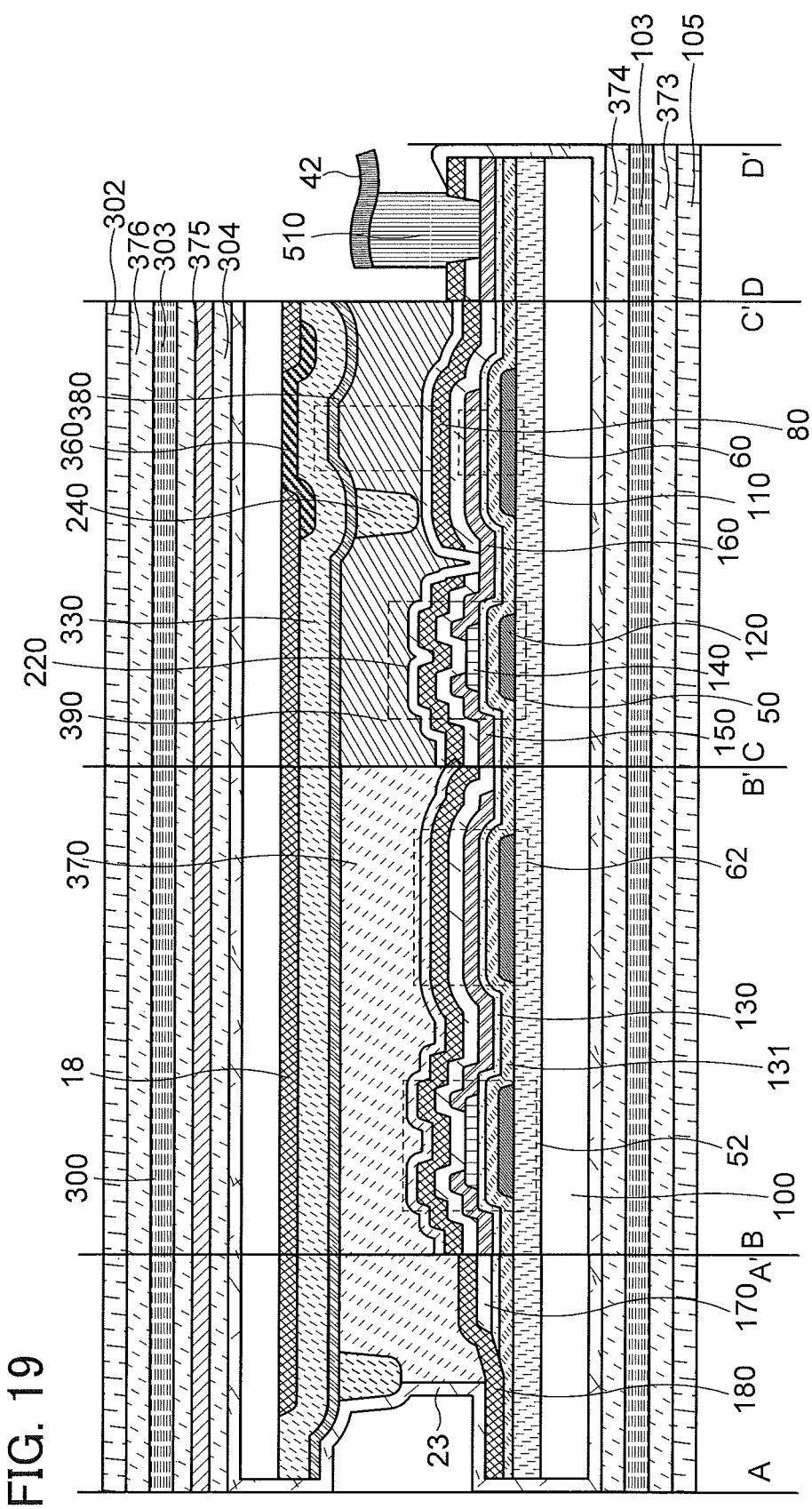
FIG. 19 is a cross-sectional view illustrating a display device of one embodiment of the present invention.

FIG. 19 shows another structural example of the display device 10. The structure of FIG. 19 employs the structure of FIG. 6A, and can omit the insulating layer 181 and the insulating layer 182 by including the protection film 23.

<Combination of Display Device and Touch Sensor>

Figure 20:
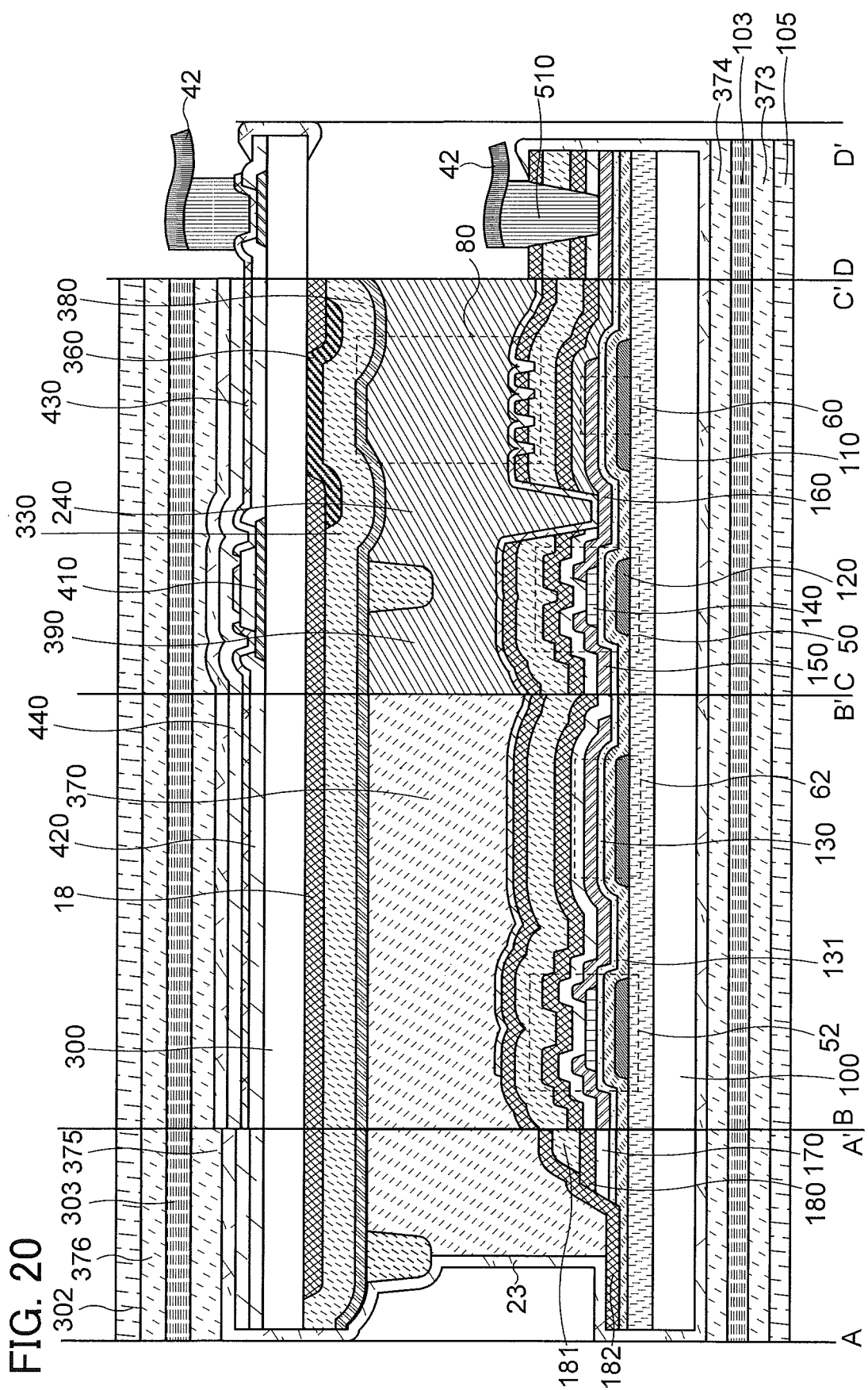
FIG. 20 is a cross-sectional view illustrating a display device of one embodiment of the present invention.
Figure 21:
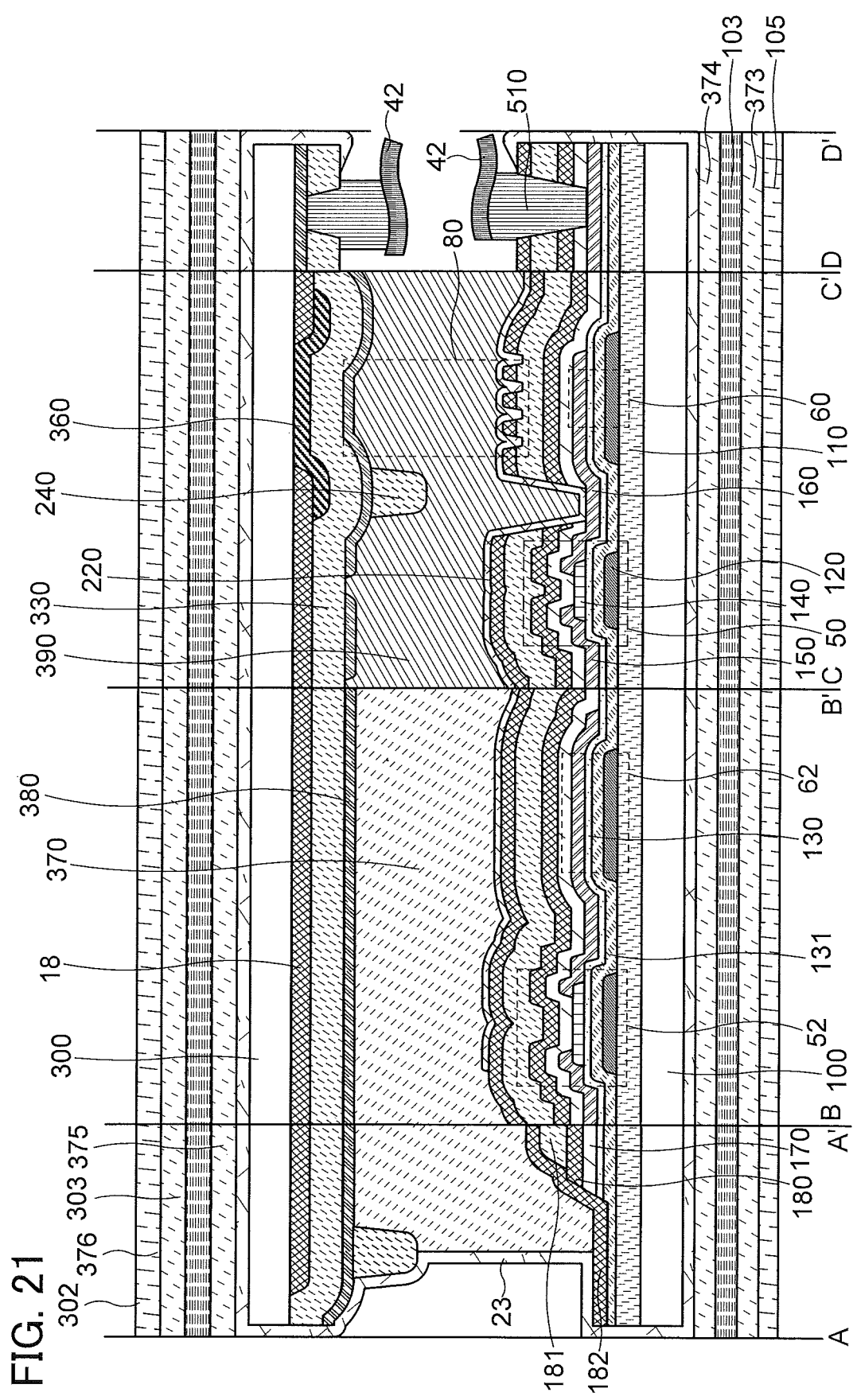
FIG. 21 is a cross-sectional view illustrating a display device of one embodiment of the present invention.

The display device 10 can be combined with a touch sensor to form a touch panel. FIG. 20 and FIG. 21 are cross-sectional views of touch panels. A structure illustrated in FIG. 20 in which a conductive layer 410 and a conductive layer 430 are used for an electrode (wiring) of a touch sensor can be employed. The conductive layer 380 used in a display panel can be used for the wiring of the touch sensor. By using the conductive layer 380 in combination with the conductive layer 410, the conductive layer 430, the insulating layer 420, and the insulating layer 440, an in-cell touch panel can be formed. Note that the electrode of the touch sensor may be formed on the viewer side (the top surface side) or the inner side (the display element side) of the substrate 300.

<<Conductive Layers 410 and 430>>

The conductive layer 410 is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used.

The conductive layer 410 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

Alternatively, as a material of the conductive films such as the conductive layer 410, that is, wirings and electrodes forming the touch panel, a transparent conductive film containing indium oxide, tin oxide, zinc oxide, or the like (e.g., ITO) can be given. Moreover, for example, a low-resistance material is preferably used as the material of the wiring and the electrode in the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 Ω/sq. or more and 100 Ω/sq. or less can be achieved.

A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode). The conductive layer 430 can be formed using a film similar to that used to form the conductive layer 410.

<<Insulating Layer 420 and Insulating Layer 440>>

An inorganic material or an organic material can be used for the insulating layer 420. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used. The insulating layer 440 can be formed with the same film as the insulating layer 420.

<<Transmissive Liquid Crystal Panel>>

Figure 22:
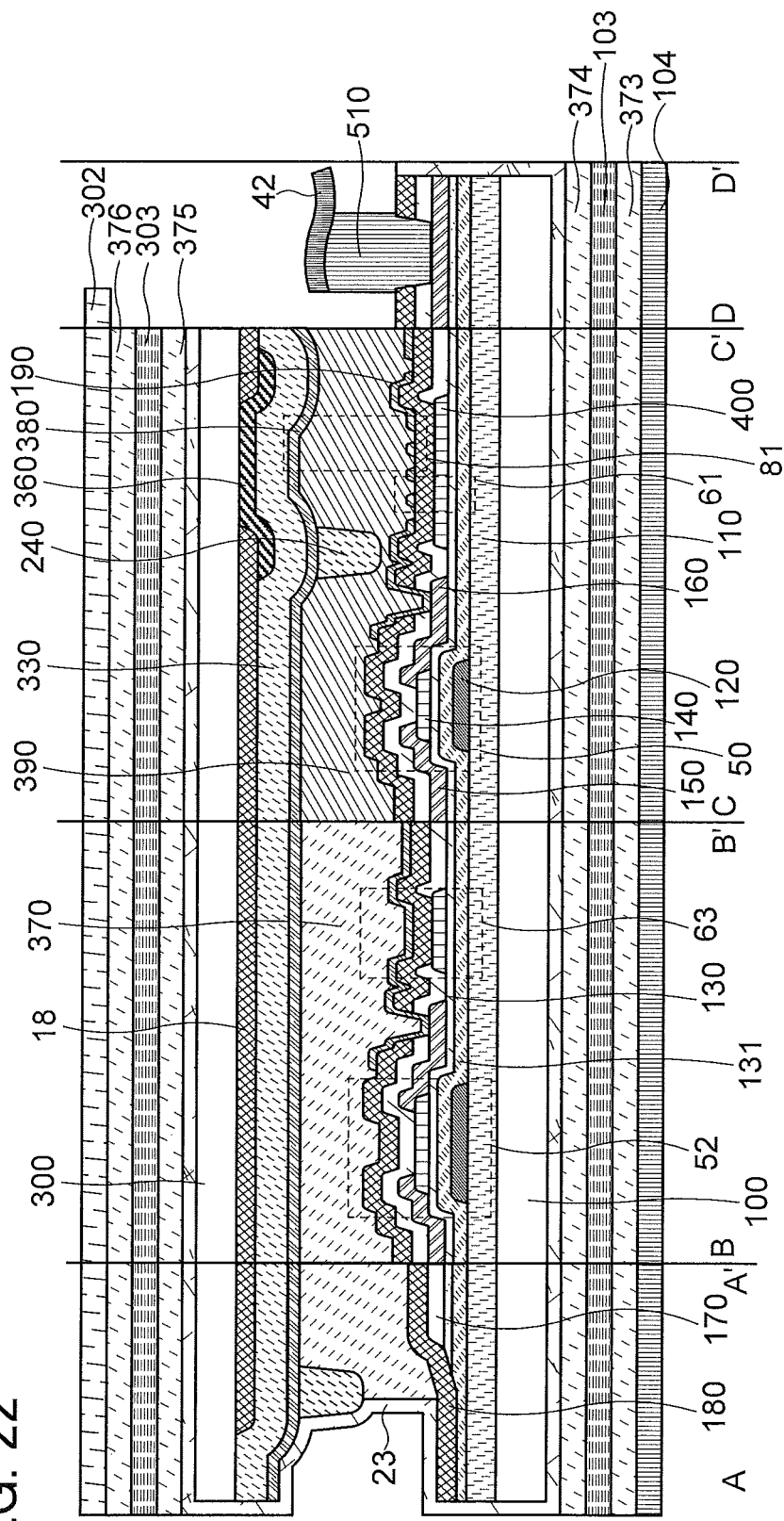
FIG. 22 is a cross-sectional view illustrating a display device of one embodiment of the present invention.

As the display panel mounted in the display device, a transmissive liquid crystal panel can be used as illustrated in FIG. 22. In the display device illustrated in FIG. 22, the liquid crystal element 81 is used as a display element. The display device includes the polarizing plate 103, the polarizing plate 303, a backlight 104, and bonding layers 373, 374, and 375. The protection substrate 302 is provided on the outer side (the viewer side) than the polarizing plate 303 and bonded with the bonding layer 376. Note that the same components (e.g., transistors) used in the reflective liquid crystal panel can be formed in the same manner as the reflective liquid crystal panel.

<<Liquid Crystal Element 81>>

The liquid crystal element 81 can be driven in a fringe field switching (FFS) mode. The liquid crystal element 81 includes the liquid crystal layer 390 and the conductive layer 190. Since the liquid crystal layer 390 receives an electric field from the conductive layer 190 in the horizontal direction, liquid crystal molecules included in the liquid crystal layer 390 can be controlled.

<<Conductive Layer 190>>

The conductive layer 190 is formed using a conductive film that transmits visible light. For example, a material including one of indium (In), zinc (Zn), and tin (Sn) can be used for the conductive film that transmits visible light. Typical examples of the conductive film that transmits visible light include conductive oxides such as indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon or silicon oxide.

<<Capacitor 61, 63>>

A capacitor 61 includes the conductive layer 400, the insulating layer 180, and the conductive layer 190. The conductive layer 400 functions as one electrode of the capacitor 61. The conductive layer 190 functions as the other electrode of the capacitor 61. The insulating layer 130 is provided between the conductive layer 400 and the conductive layer 190. A capacitor 63 can have a structure similar to that of the capacitor 61.

<<Conductive Layer 400>>

When the transistor 50 includes an oxide semiconductor in the semiconductor layer 140, the conductive layer 400 can be formed with the same material as the semiconductor layer 140. In that case, the conductive layer 400 is formed by processing a film formed at the same time as the semiconductor layer 140. The conductive layer 400 has a crystal structure similar to or different from that of the semiconductor layer 140. When the film formed at the same time as the semiconductor layer 140 includes impurities or oxygen vacancies, the film can have conductivity; thus, the conductive layer 400 is formed. Typical examples of the impurities included in the conductive layer 400 are a rare gas, hydrogen, boron, nitrogen, fluorine, aluminum, and phosphorus. Typical examples of the rare gas are helium, neon, argon, krypton, and xenon. Although an example where the conductive layer 400 has conductivity is shown, one embodiment of the present invention is not limited to this example. Depending on circumstances or conditions, the conductive layer 400 does not necessarily have conductivity. In other words, the conductive layer 400 may have properties similar to those of the semiconductor layer 140.

Although the semiconductor layer 140 and the conductive layer 400 are formed over the insulating layer 130 as described above, they have different impurity concentrations. Specifically, the impurity concentration of the conductive layer 400 is higher than that of the semiconductor layer 140. For example, in the semiconductor layer 140, the hydrogen concentration measured by secondary ion mass spectrometry is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, and yet still further preferably lower than or equal to $1 \times 10^{16}$ atoms/cm$^3$. In contrast, the hydrogen concentration in the conductive layer 400 measured by secondary ion mass spectrometry is higher than or equal to $8 \times 10^{19}$ atoms/cm$^3$, preferably higher than or equal to $1 \times 10^{20}$ atoms/cm$^3$, and further preferably higher than or equal to $5 \times 10^{20}$ atoms/cm$^3$. In addition, the hydrogen concentration in the conductive layer 400 is greater than or equal to 2 times or greater than or equal to 10 times that in the semiconductor layer 140.

When an oxide semiconductor film formed at the same time as the semiconductor layer 140 is exposed to plasma, the oxide semiconductor film is damaged and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of an opening in the insulating layer 170, oxygen vacancies are generated. Alternatively, when the oxide semiconductor film is exposed to plasma of a mixed gas of oxygen and hydrogen, hydrogen, a rare gas, ammonia, and the like, oxygen vacancies are generated. Alternatively, when impurities are added to the oxide semiconductor film, oxygen vacancies can be formed while the impurities are added to the oxide semiconductor film. The impurities can be added by an ion doping method, an ion implantation method, a plasma treatment method, and the like. In the plasma treatment method, plasma is generated in a gas atmosphere containing the impurities to be added, and ions of the impurities accelerated by plasma treatment are made to collide with the oxide semiconductor film, whereby oxygen vacancies can be formed in the oxide semiconductor film.

When an impurity, e.g., hydrogen is contained in the oxide semiconductor film in which oxygen vacancies are generated by addition of impurity elements, hydrogen enters an oxygen vacant site and forms a donor level in the vicinity of the conduction band. As a result, the oxide semiconductor film has increased conductivity to be a conductor. An oxide semiconductor film that has become a conductor can be referred to as an oxide conductor film. That is, it can be said that the semiconductor layer 140 is formed of an oxide semiconductor and the conductive layer 400 is formed of an oxide conductor film. It can also be said that the conductive layer 400 is formed of an oxide semiconductor film having high conductivity or a metal oxide film having high conductivity.

Note that the insulating layer 180 preferably contains hydrogen. Since the conductive layer 400 is in contact with the insulating layer 180, hydrogen contained in the insulating layer 180 can be diffused into the oxide semiconductor film formed at the same time as the semiconductor layer 140. As a result, impurities can be added to the oxide semiconductor film formed at the same time as the semiconductor layer 140; thus, the conductivity of the conductive layer 400 can be increased.

In the above manner, the conductive layer 400 can be formed at the same time as the semiconductor layer 140, and conductivity is given to the conductive layer 400 after the formation. Such a structure results in a reduction in manufacturing costs.

Oxide semiconductor films generally have a visible light transmitting property because of their large energy gap. In contrast, an oxide conductor film is an oxide semiconductor film having a donor level in the vicinity of the conduction band. Thus, the influence of light absorption due to the donor level is small, so that an oxide conductor film has a visible light transmitting property comparable to that of an oxide semiconductor film.

Thus, the conductive layer 190 and the conductive layer 400 have a light-transmitting property. Therefore, the capacitor 61 can have a light-transmitting property as a whole.

<Another Structure of Transmissive Liquid Crystal Panel>

A transmissive liquid crystal panel can have a peripheral portion in various shapes and the protection film 23 corresponding to the shape of the peripheral portion as in a manner similar to that of a reflective liquid crystal panel.

Figure 23:
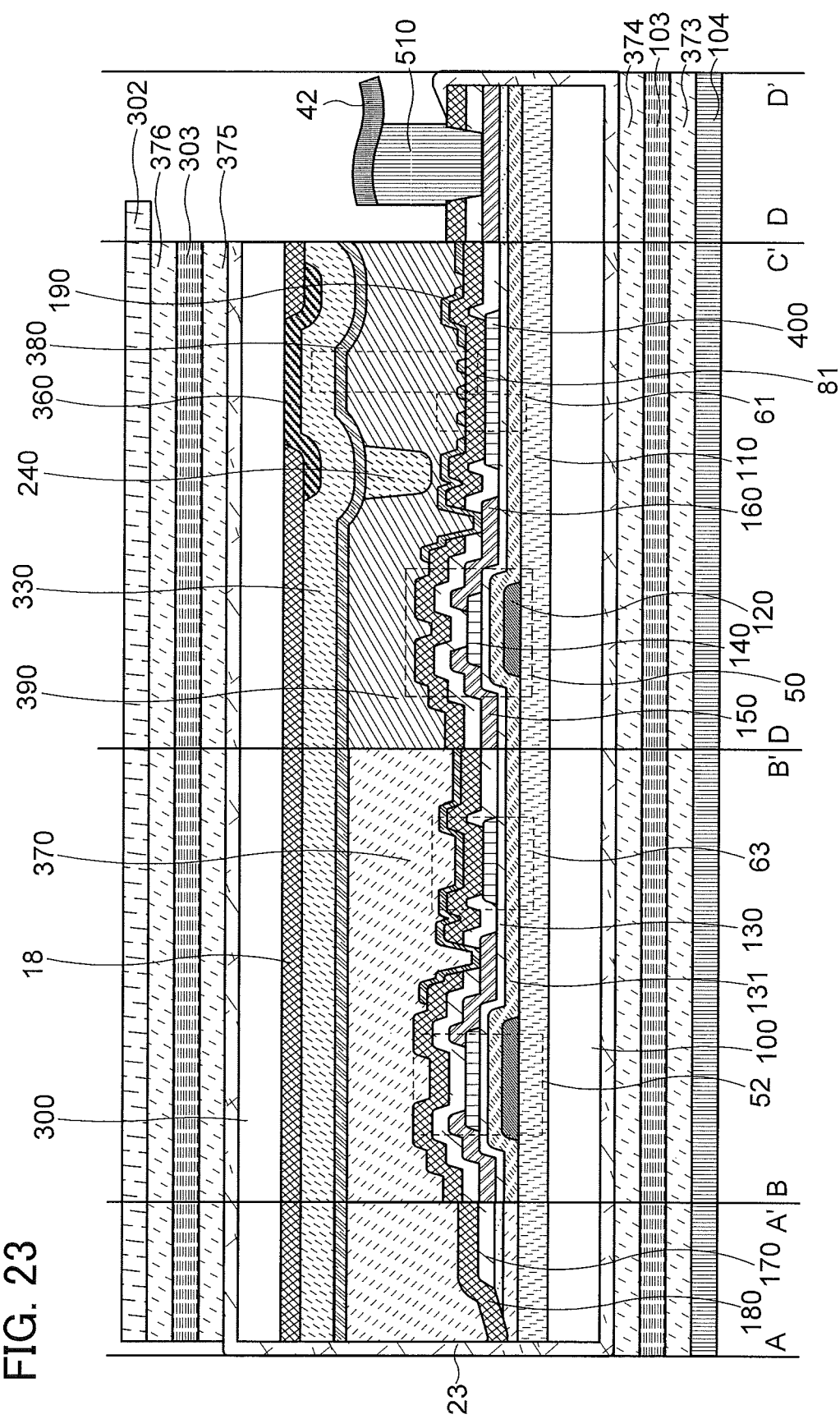
FIG. 23 is a cross-sectional view illustrating a display device of one embodiment of the present invention.
Figure 24:
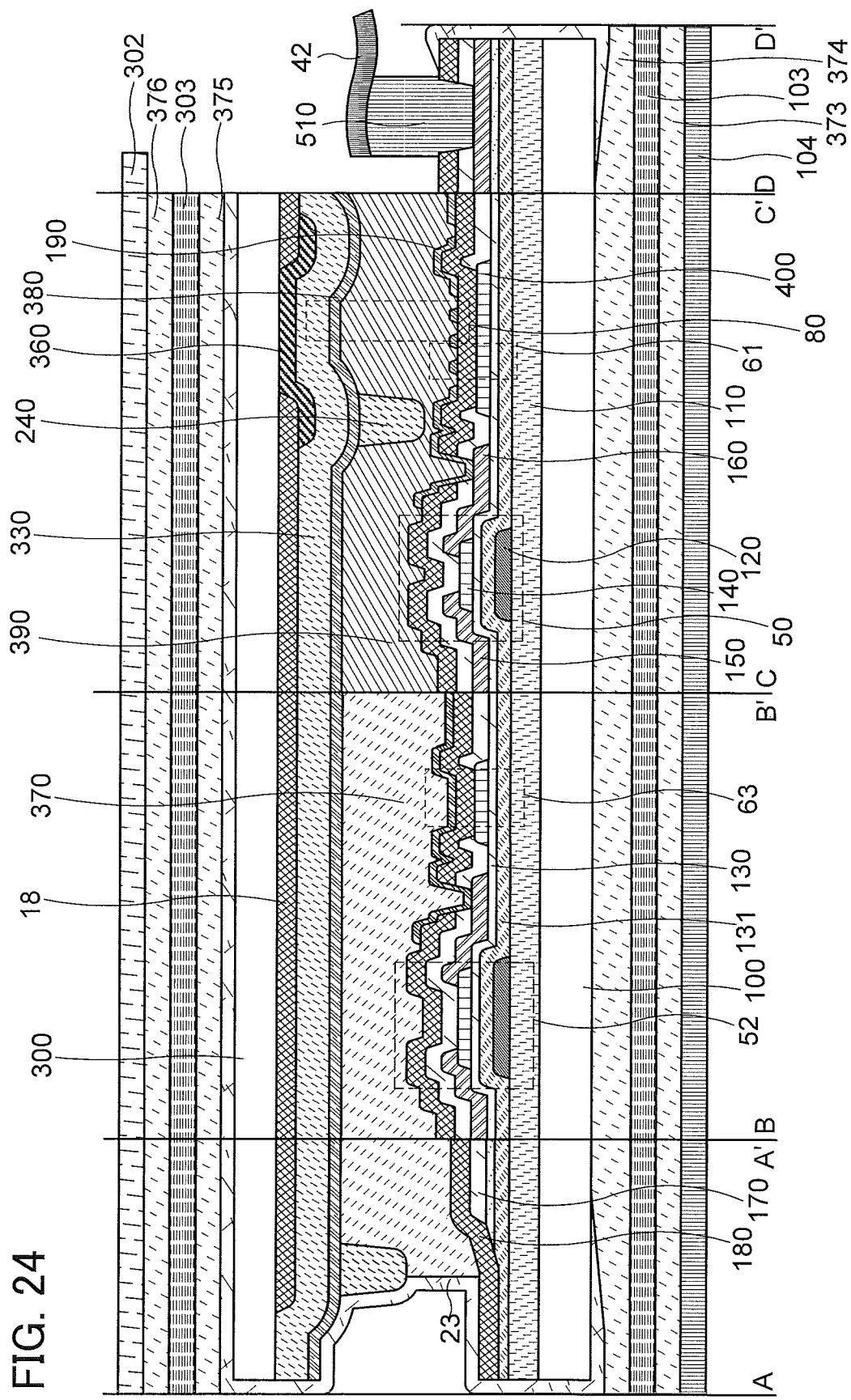
FIG. 24 is a cross-sectional view illustrating a display device of one embodiment of the present invention.
Figure 25:
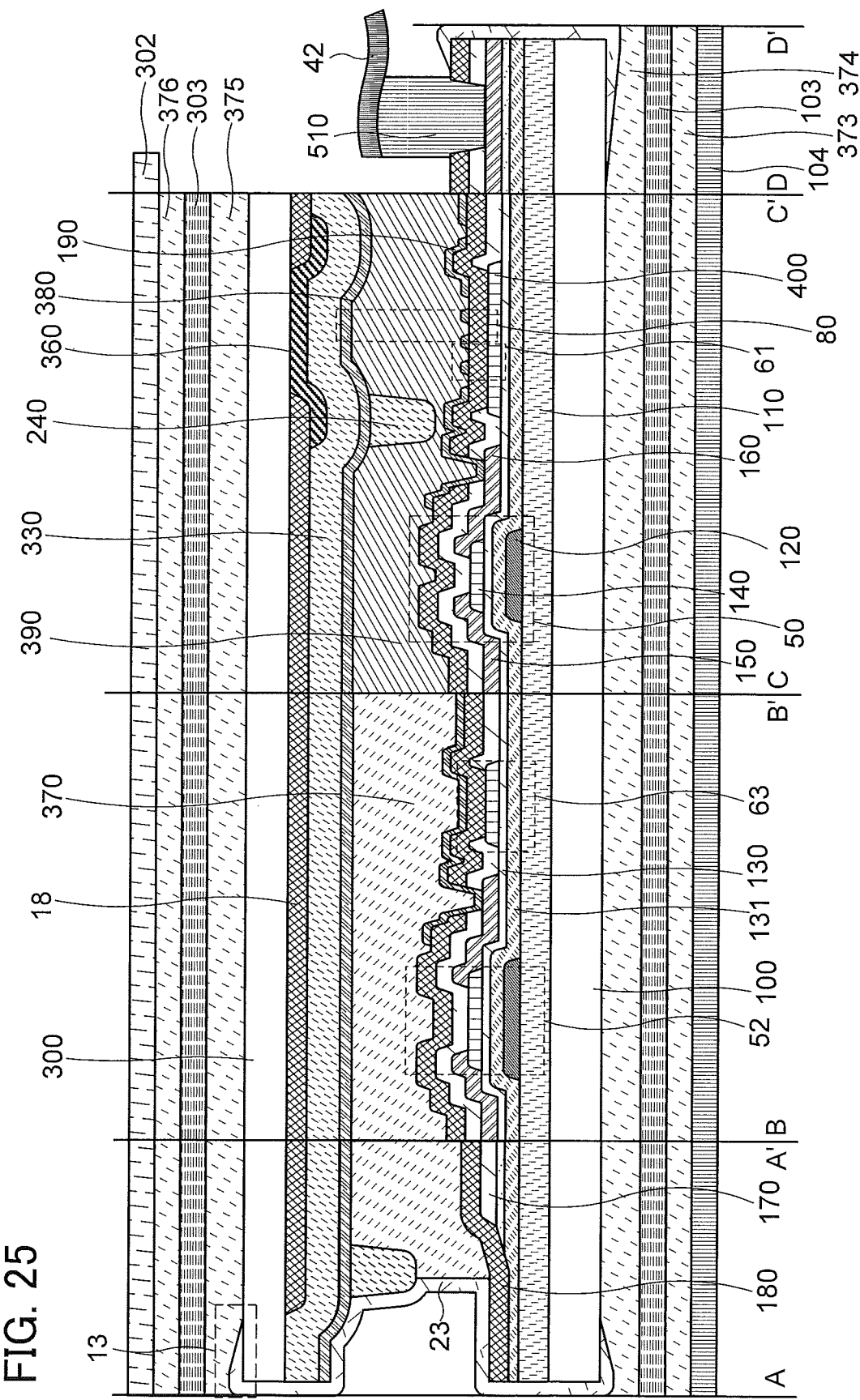
FIG. 25 is a cross-sectional view illustrating a display device of one embodiment of the present invention.
Figure 26:
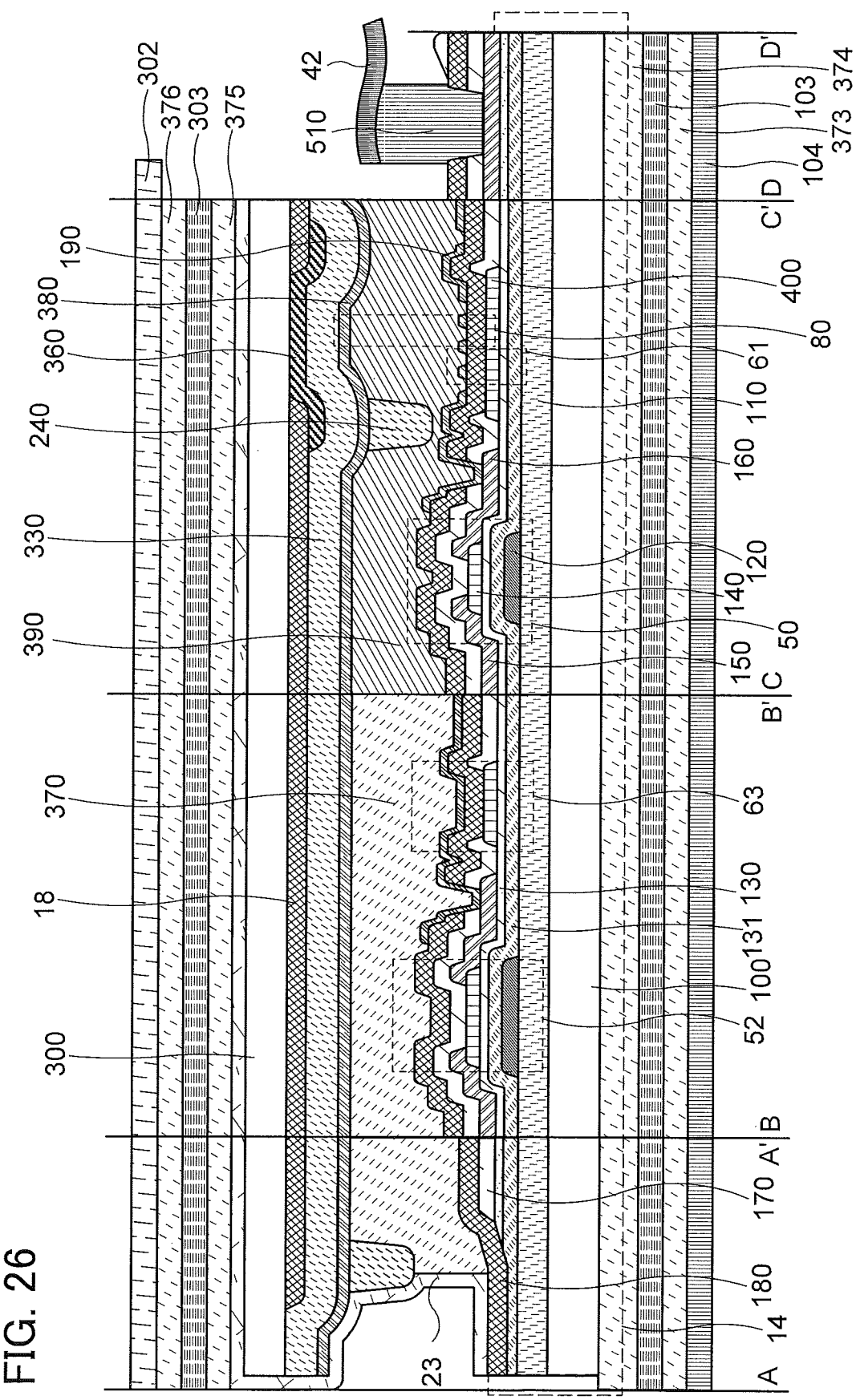
FIG. 26 is a cross-sectional view illustrating a display device of one embodiment of the present invention.

FIG. 23, FIG. 24, and FIG. 25 are cross-sectional views of transmissive liquid crystal panels. A transmissive liquid crystal panel of one embodiment of the present invention can have a structure illustrated in FIG. 23 in which the peripheral portion does not have unevenness. Alternatively, a structure illustrated in FIG. 24 in which the protection film 23 is hardly deposited on the rear surface of the display device (a surface of the substrate 100 where the transistor 50 and the liquid crystal element 81 are not formed) can be employed. Alternatively, a structure illustrated in FIG. 25 in which the protection film 23 is deposited on neither a top surface of the display device (a surface of the substrate 300 where the liquid crystal element is not formed) nor the rear surface of the display device (the surface of the substrate 100 where the transistor 50 and the liquid crystal element 81 are not formed) can be employed. Note that as illustrated in FIG. 24 and FIG. 25, the protection film 23 can cover edges of the substrate. Alternatively, a structure illustrated in FIG. 26 in which the protection film 23 is not deposited in the region 14 (the rear surface and the side surface of the display device) can be employed.

Figure 27:
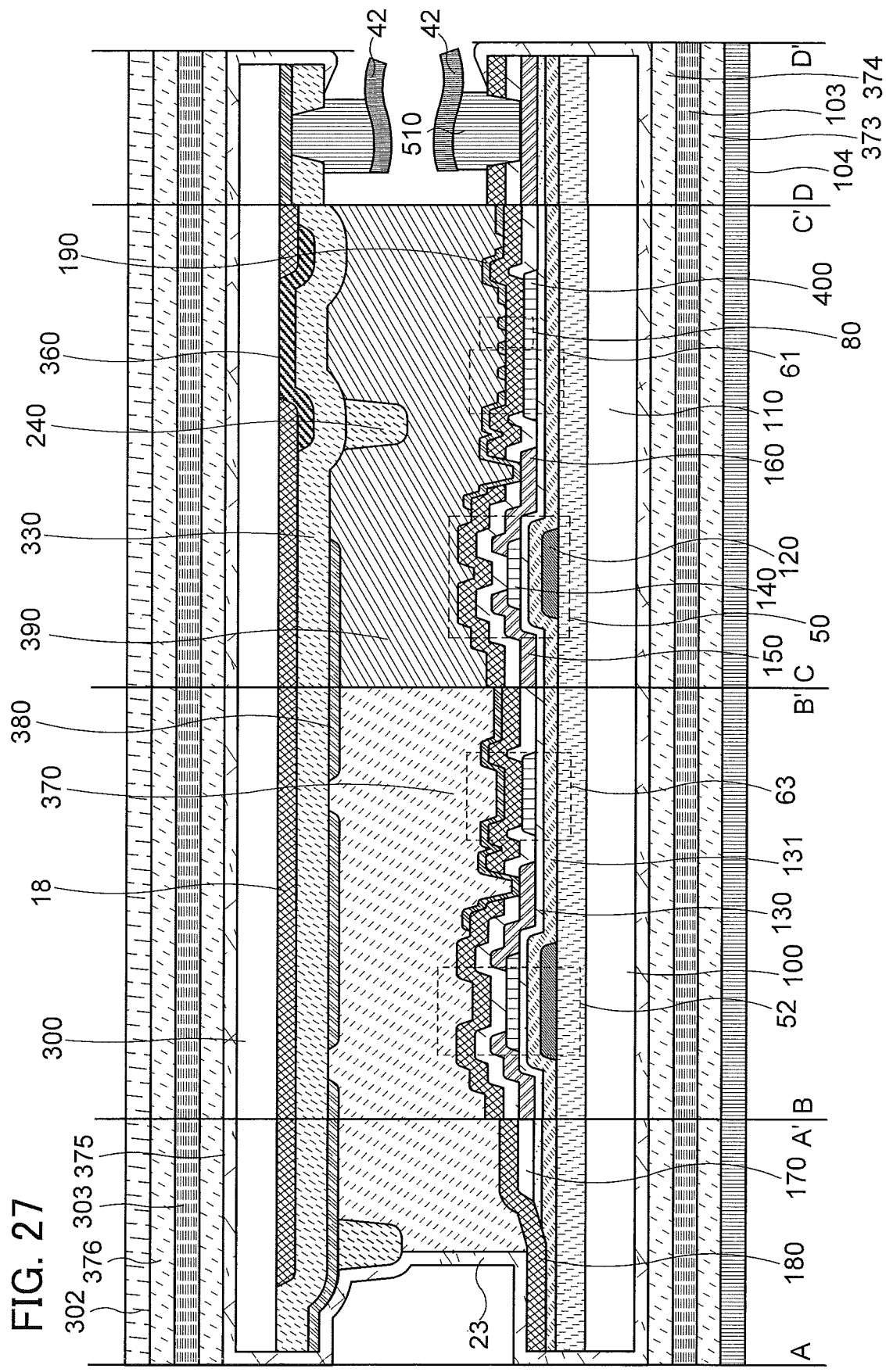
FIG. 27 is a cross-sectional view illustrating a display device of one embodiment of the present invention.
Figure 28:
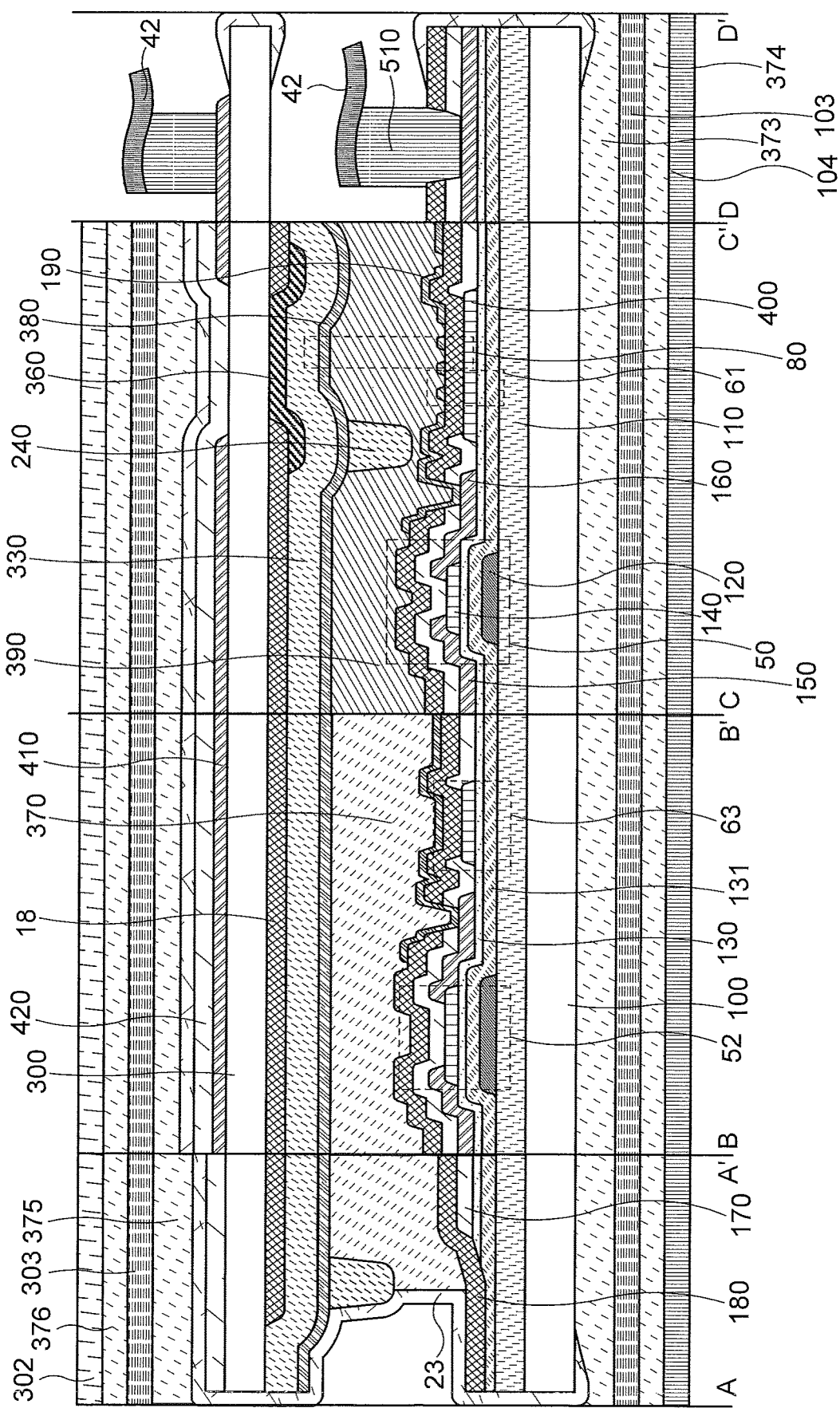
FIG. 28 is a cross-sectional view illustrating a display device of one embodiment of the present invention.
Figure 29:
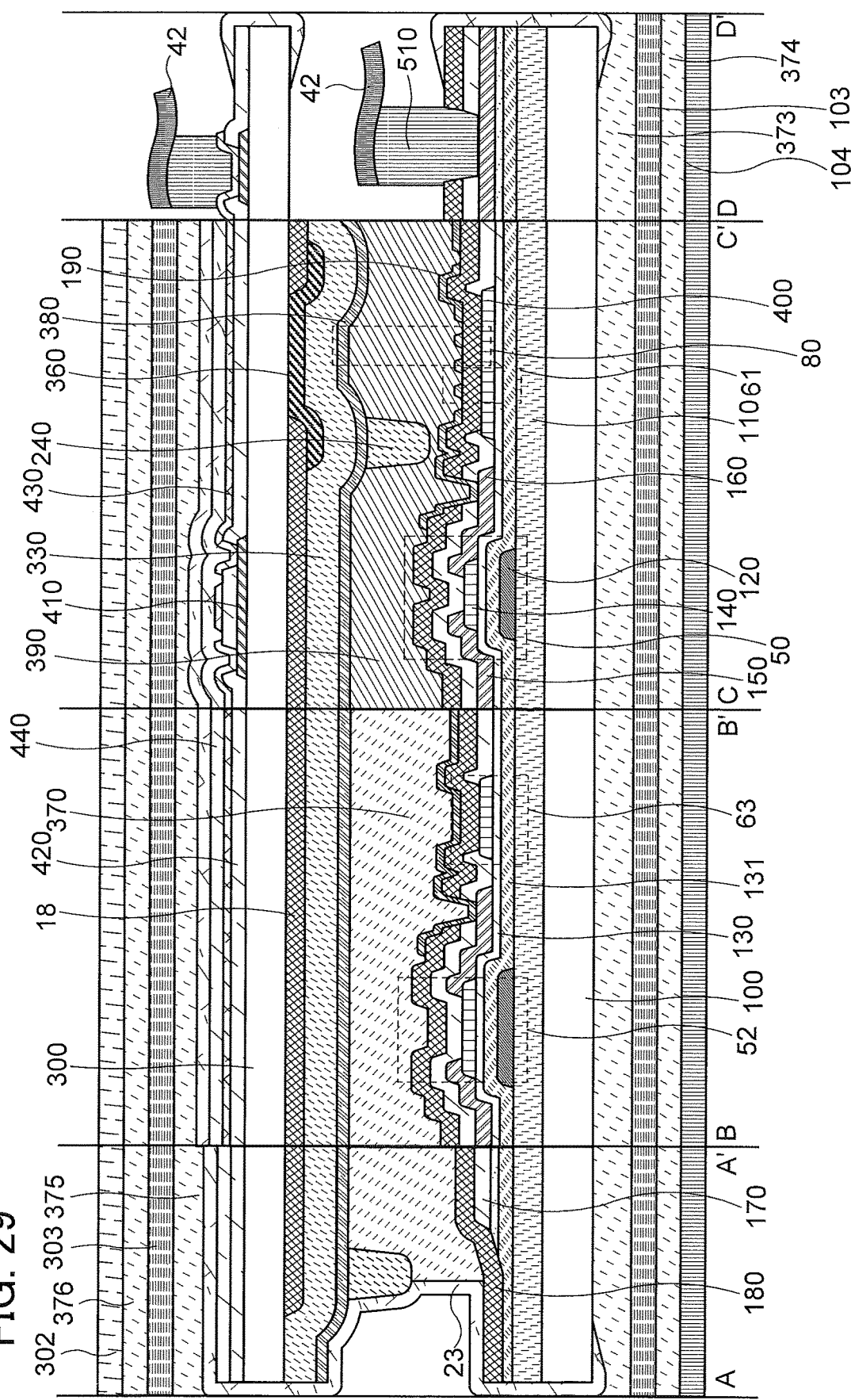
FIG. 29 is a cross-sectional view illustrating a display device of one embodiment of the present invention.

The transmissive liquid crystal panel can be combined with a touch sensor to form a touch panel. FIG. 27, FIG. 28, and FIG. 29 are cross-sectional views of touch panels. FIG. 27 and FIG. 28 illustrate examples of in-cell touch panels. In FIG. 27, the protection film 23 is deposited in the whole region except for an FPC portion. In FIG. 28, the protection film 23 is hardly deposited on the substrate 100 side. FIG. 29 illustrates an example of an on-cell touch panel.

<Organic EL Panel>

The display device 10 including the light-emitting element 70 as a display element can be manufactured.

Figure 30:
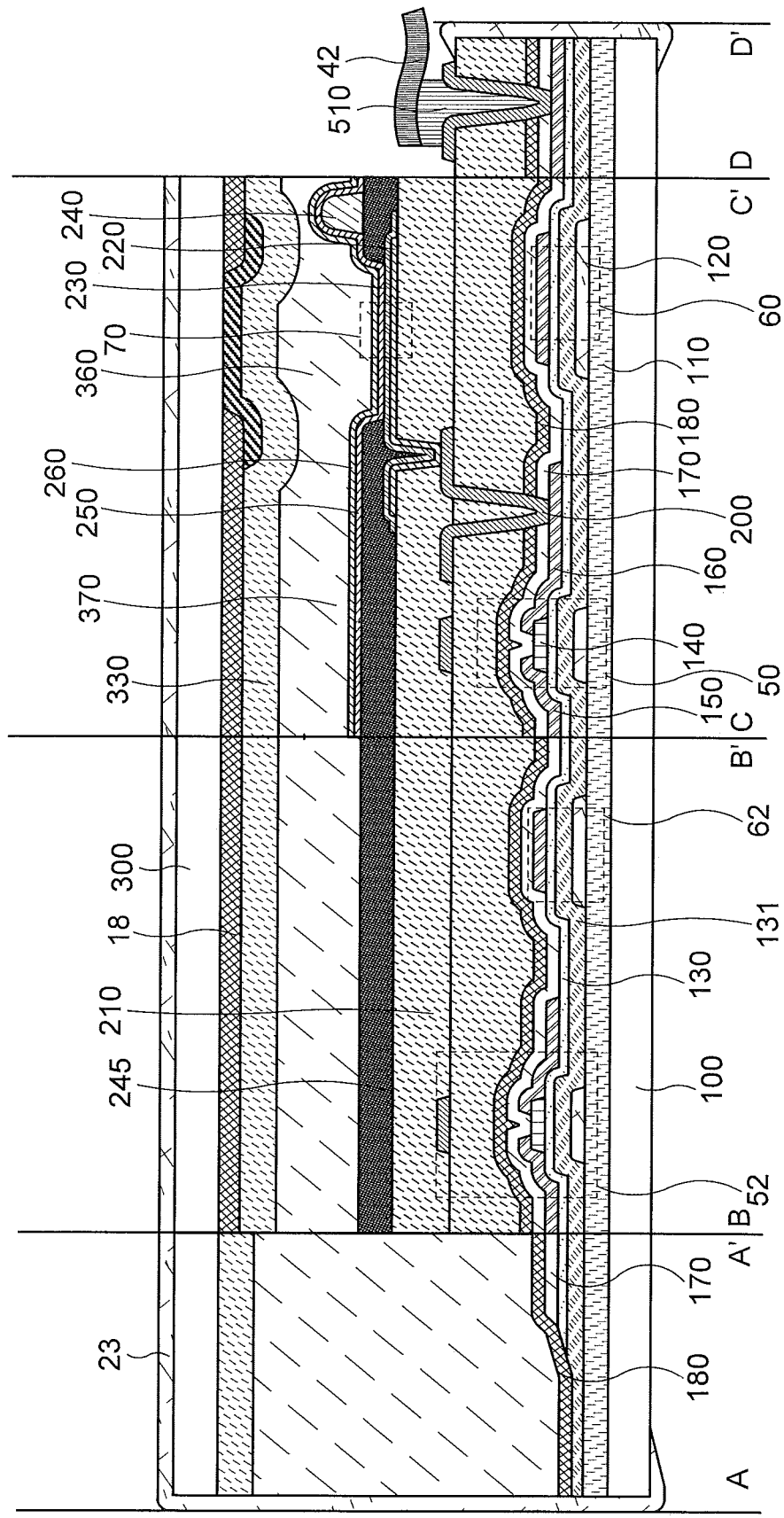
FIG. 30 is a cross-sectional view illustrating a display device of one embodiment of the present invention.
Figure 31:
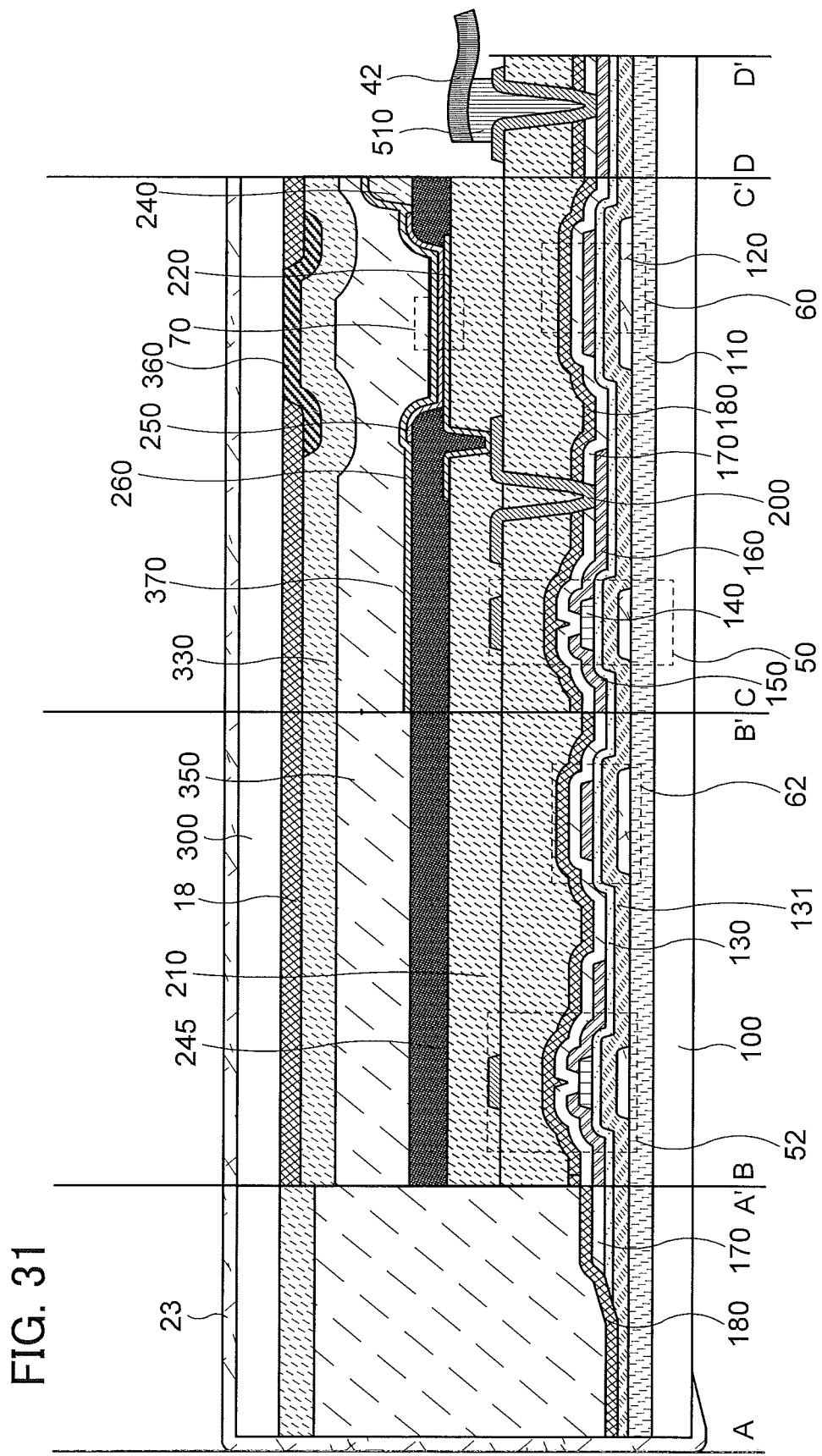
FIG. 31 is a cross-sectional view illustrating a display device of one embodiment of the present invention.
Figure 32:
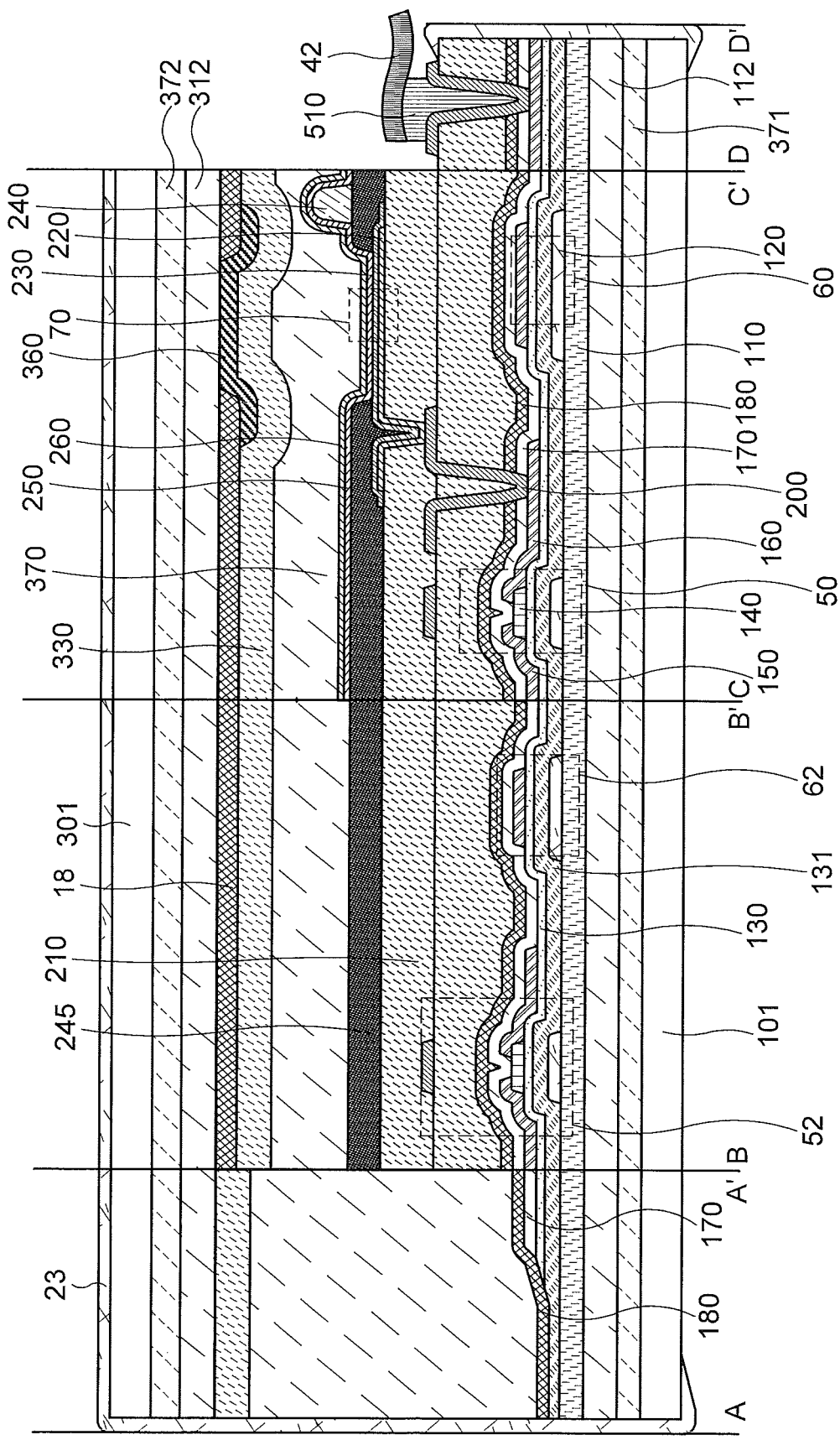
FIG. 32 is a cross-sectional view illustrating a display device of one embodiment of the present invention.

FIG. 30, FIG. 31, and FIG. 32 are cross-sectional views of display devices including a light-emitting element. Note that the same components (e.g., transistors) used in the liquid crystal panel can be formed in the same manner as the liquid crystal panel.

<<Light-Emitting Element 70>>

As the light-emitting element 70, a self-luminous element can be used, and an element whose luminance is controlled by current or voltage is included in the category of the light-emitting element. For example, a light-emitting diode (LED), an organic EL element, an inorganic EL element, or the like can be used. For example, an organic element which includes a lower electrode, an upper electrode, and a layer (also referred to as an EL layer 250) containing a light-emitting organic compound between the lower electrode and the upper electrode can be used as the light-emitting element 70.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

When a voltage higher than the threshold voltage of the light-emitting element is applied between the lower electrode of the conductive layer 220 and the upper electrode of the conductive layer 260, holes are injected to the EL layer 250 from the anode side and electrons are injected to the EL layer 250 from the cathode side. The injected electrons and holes recombine in the EL layer 250 and a light-emitting substance contained in the EL layer 250 emits light.

The EL layer 250 includes at least a light-emitting layer. In addition to the light-emitting layer, the EL layer 250 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 250, and an inorganic compound may be used. Each of the layers included in the EL layer 250 can be formed by any of the following methods: an evaporation method (including a vacuum evaporation method), a transfer method, a printing method, an inkjet method, a coating method, and the like.

The light-emitting element may contain two or more kinds of light-emitting substances. Thus, for example, a light-emitting element that emits white light can be achieved. For example, light-emitting substances are selected so that two or more light-emitting substances emit complementary colors to obtain white light emission. A light-emitting substance that emits red (R) light, green (G) light, blue (B) light, yellow (Y) light, or orange (0) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 70 preferably has two or more peaks in the wavelength range in a visible region (e.g., greater than or equal to 350 nm and less than or equal to 750 nm or greater than or equal to 400 nm and less than or equal to 800 nm).

The EL layer 250 may include a plurality of light-emitting layers. In the EL layer 250, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing cost can be reduced.

<Layer 230 for Adjusting Optical Path>

The light-emitting element 70 in FIG. 30 is an example of a light-emitting element having a microcavity structure. For example, the microcavity structure may be formed using the lower electrode and the upper electrode of the light-emitting element 70 so that light with a specific wavelength can be extracted from the light-emitting element efficiently.

Specifically, a reflective film which reflects visible light is used as the lower electrode, and a semi-transmissive and semi-reflective film which transmits part of visible light and reflects part of visible light is used as the upper electrode. The upper electrode and the lower electrode are arranged so that light with a specific wavelength can be extracted efficiently.

The lower electrode functions as, for example, a lower electrode or an anode of the light-emitting element. The lower electrode has a function of adjusting the optical path length so that desired light emitted from light-emitting layers resonates and its wavelength can be amplified. A layer 230 that adjusts the optical path length is not necessarily provided in the lower electrode. At least one layer included in the light-emitting element can be used to adjust the optical path length. The layer 230 that adjusts the optical path length can be formed using, for example, indium oxide, indium tin oxide (ITO), indium zinc oxide, zinc oxide (ZnO), or zinc oxide to which gallium is added.

In the case of using the microcavity structure, a semi-transmissive and semi-reflective electrode can be used as the upper electrode of the light-emitting element. The semi-transmissive semi-reflective electrode is formed using a reflective conductive material and a light-transmitting conductive material. As the conductive materials, a conductive material having a visible light reflectivity of higher than or equal to 20% and lower than or equal to 80%, preferably higher than or equal to 40% and lower than or equal to 70%, and a resistivity of lower than or equal to $1 \times 10^{-2}$ Ω·cm can be used. The semi-transmissive semi-reflective electrode can be formed using one or more kinds of conductive metals, conductive alloys, conductive compounds, and the like. In particular, a material with a small work function (3.8 eV or less) is preferable. For example, aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Ag—Mg or Al—Li), a rare earth metal such as europium or ytterbium, and an alloy containing any of these rare earth metals.

The electrodes can each be formed by an evaporation method or a sputtering method. Alternatively, a discharging method such as an ink-jet method, a printing method such as a screen printing method, or a plating method may be used.

Note that an organic EL can employ a structure other than a microcavity structure. For example, a separate coloring method by which different colors are emitted from light-emitting elements, or a white EL method in which a material emitting white light is used can be employed.

<<Partition Wall 245>>

An insulating material can be used for a partition wall 245. For example, an inorganic material, an organic material, or a stacked-layer material of an inorganic material and an organic material can be used. Specifically, a film containing silicon oxide, silicon nitride, or the like, acrylic, polyimide, a photosensitive resin, or the like can be used.

<<Conductive Layer 200>>

The conductive layer 200 is formed using a metal element selected from aluminum, chromium, copper, tantalum, titanium, molybdenum, nickel, iron, cobalt, and tungsten; an alloy containing any of these metal elements as a component; an alloy containing any of these metal elements in combination; or the like. Further, one or more metal elements selected from manganese and zirconium may be used. The conductive layer 200 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

<<Insulating Layer 210>>

The insulating layer 210 has a function of making a flat surface. An inorganic material or an organic material can be used for the insulating layer 210. For example, an oxide insulating film of silicon oxide, silicon oxynitride, aluminum oxide, aluminum oxynitride, gallium oxide, gallium oxynitride, yttrium oxide, yttrium oxynitride, hafnium oxide, hafnium oxynitride, or the like; a nitride insulating film of silicon nitride, aluminum nitride, or the like; or a heat-resistant organic material such as a polyimide resin, an acrylic resin, a polyimide amide resin, a benzocyclobutene resin, a polyamide resin, or an epoxy resin can be used.

<Conductive Layer 260>

The conductive layer 260 that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. A stack of any of the above materials can be used as the conductive layer. For example, a stacked film of ITO and an alloy of silver and magnesium is preferably used, in which case conductivity can be increased. Further alternatively, graphene or the like may be used.

<Organic EL Panel Using Separate Coloring Method>

An organic EL element can be formed using a separate coloring method as illustrated in FIG. 31. FIG. 31 is different from FIG. 30 in that a separate coloring method is used for the EL layer 250 over the conductive layer 220.

<Flexible Display Device>

The display device may be formed over a flexible substrate 101 or a flexible substrate 301 as illustrated in FIG. 32. The flexible substrate and the display device can be bonded to each other with the adhesive layer 370. In this manner, a flexible touch panel that can be folded or a touch panel having a curved surface can be fabricated. Moreover, the thickness of the substrate can be small, leading to a reduction in weight of the touch panel.

<Manufacturing Method Example of Flexible Display Device>

Here, a method for manufacturing a flexible display device will be described.

For convenience, a structure including a pixel and a circuit, a structure including an optical member such as a color filter, or a structure including a touch sensor is referred to as an element layer. An element layer includes a display element, for example, and may include a wiring electrically connected to the display element or an element such as a transistor used in a pixel or a circuit in addition to the display element.

Here, a support body (e.g., the substrate 101 or the substrate 301) with an insulating surface where an element layer is formed is referred to as a base material.

As a method for forming an element layer over a flexible base material provided with an insulating surface, there are a method in which an element layer is formed directly over the base material, and a method in which an element layer is formed over a supporting base material and then the element layer is separated from the supporting base material and transferred to the base material.

In the case where a material of the base material can withstand heating temperature in a process for forming the element layer, it is preferable that the element layer be formed directly over the base material, in which case a manufacturing process can be simplified. At this time, the element layer is preferably formed in a state where the base material is fixed to the supporting base material, in which case transfer thereof in an apparatus and between apparatuses can be easy.

In the case of employing the method in which the element layer is formed over the supporting base material and then transferred to the base material, first, a separation layer and an insulating layer are stacked over the supporting base material, and then the element layer is formed over the insulating layer. Next, the element layer is separated from the supporting base material and then transferred to the base material. At this time, a material is selected that would causes separation at an interface between the supporting base material and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the separation layer; and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is unnecessary in the case where separation can occur at an interface between the supporting base material and the insulating layer. For example, glass is used as the supporting base material and an organic resin such as polyimide is used as the insulating layer, a separation trigger is formed by locally heating part of the organic resin by laser light or the like, and separation is performed at an interface between the glass and the insulating layer. Alternatively, a metal layer may be provided between the supporting base material and the insulating layer formed of an organic resin, and separation may be performed at the interface between the metal layer and the insulating layer by heating the metal layer by feeding a current to the metal layer. In that case, the insulating layer formed of an organic resin can be used as a base material.

Examples of such a base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, and for example, a polyamide imide resin, a polyimide resin, PET, or the like with a thermal expansion coefficient lower than or equal to $30 \times 10^{-6}$/K can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the base material. Alternatively, a composite material where glass and a resin material are attached to each other may be used.

In the structure shown in FIG. 32, for example, a first separation layer and an insulating layer 112 are formed in this order over a first supporting base material, and then components in a layer over the first separation layer and the insulating layer 112 are formed. Separately, a second separation layer and an insulating layer 312 are formed in this order over a second supporting base material, and then upper components are formed. Next, the first supporting base material is bonded to the second supporting base material with the adhesive layer 370. After that, separation at an interface between the second separation layer and the insulating layer 312 is conducted so that the second supporting base material and the second separation layer are removed, and then the substrate 301 is bonded to the insulating layer 312 using an adhesive layer 372. Furthermore, separation at an interface between the first separation layer and the insulating layer 112 is conducted so that the first supporting base material and the first separation layer are removed, and then the substrate 101 is bonded to the insulating layer 112 using an adhesive layer 371. Note that either side may be subjected to separation and attachment first.

The above is the description of a manufacturing method of a flexible display device.

Note that the structures, methods, and the like described in this embodiment can be used as appropriate in combination with any of the structures, methods, and the like described in the other embodiments.

Embodiment 5

Described in Embodiment 5 is a modification example of the structure of the transistor described in Embodiment 4.
<<Stacked-Layer Oxide Semiconductor>>

Figure 33A:
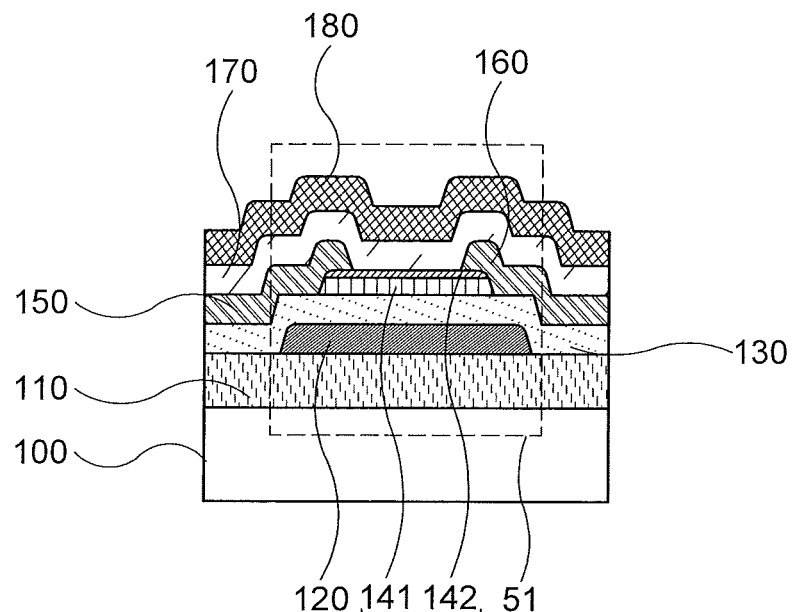
FIGS. 33A and 33B are cross-sectional views each illustrating a transistor of one embodiment of the present invention.
Figure 33B:
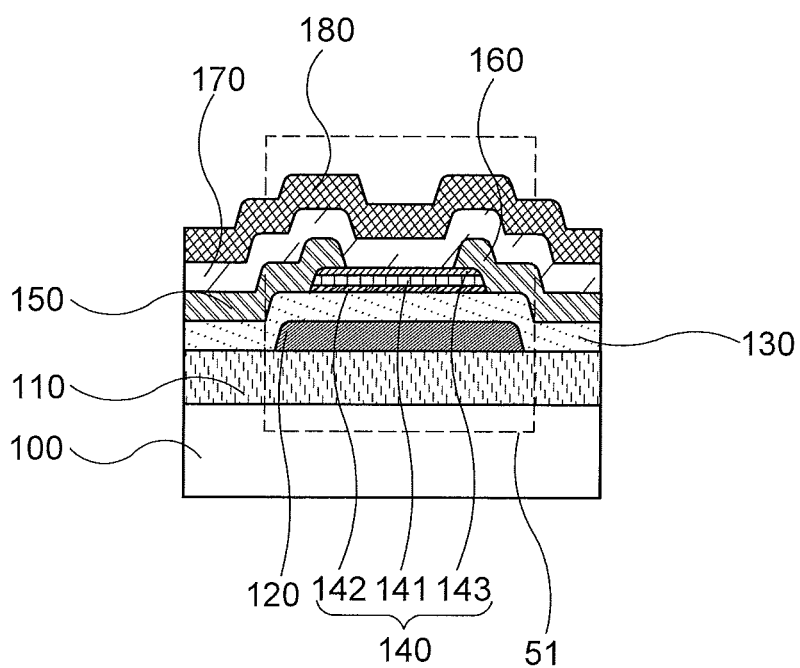

In the semiconductor layer 140, a plurality of oxide semiconductor films that differ in the atomic ratio of metal elements may be stacked. For example, in a transistor 51, oxide semiconductor layers 141 and 142 are stacked in this order over the insulating layer 130 as illustrated in FIG. 33A. Alternatively, the oxide semiconductor layer 142, the oxide semiconductor layer 141, and an oxide semiconductor layer 143 are stacked in this order over the insulating layer 130 as illustrated in FIG. 33B. The oxide semiconductor layer 142 and the oxide semiconductor layer 143 differ from the oxide semiconductor layer 141 in the atomic ratio of metal elements.
<<Channel-Protective Transistor and Top-Gate Transistor>>

Figure 34A:
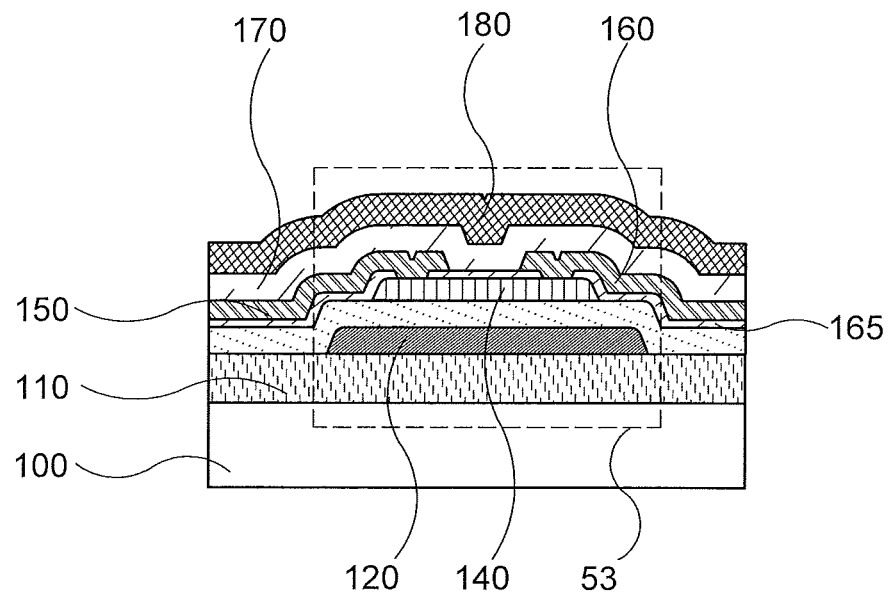
FIGS. 34A and 34B are cross-sectional views each illustrating a transistor of one embodiment of the present invention.
Figure 34B:
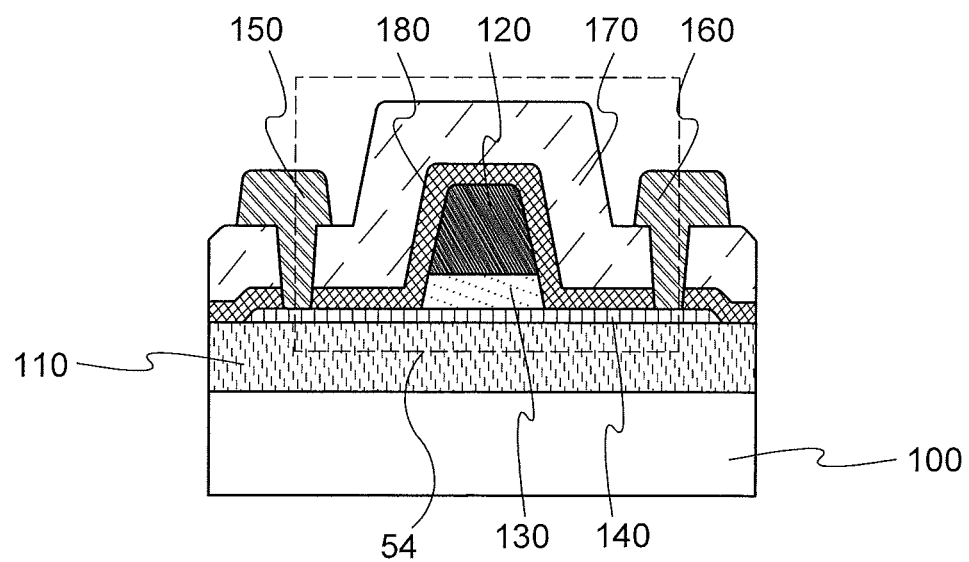

The transistor 50 illustrated in FIG. 12 is, but not limited to, a bottom-gate transistor. FIG. 34A illustrates a transistor 53 and FIG. 34B illustrates a transistor 54 as modification examples of the transistor 50. Although the transistor 50 illustrated in FIG. 11B is a channel-etched transistor, it may be a channel-protective transistor (the transistor 53) including an insulating layer 165 as illustrated in the cross-sectional view of FIG. 34A or may be a top-gate transistor (the transistor 54) as illustrated in the cross-sectional view of FIG. 34B.

Note that all of transistors 52 included in the peripheral circuit (gate driver and the like) may have the same structure or may have two or more kinds of structures. All of a plurality of transistors 50 included in the pixel portion may have the same structure, or may have two or more kinds of structures.

Although an example of using a transistor including an oxide semiconductor is shown in this embodiment, one embodiment of the present invention is not limited to this example. Depending on the case or circumstances, a transistor including a semiconductor material that is not an oxide semiconductor may be used in one embodiment of the present invention.

For example, a transistor in which a Group 14 element, a compound semiconductor, an oxide semiconductor, or the like is used for the semiconductor layer 140 can be used. Specifically, a semiconductor containing silicon, a semiconductor containing gallium arsenide, an organic semiconductor, or the like can be used.

For example, single crystal silicon, polysilicon, or amorphous silicon can be used for the semiconductor layer of the transistor.

Note that the structures, methods, and the like described in this embodiment can be used as appropriate in combination with any of the structures, methods, and the like described in the other embodiments.

Embodiment 6

In this embodiment, a structural example of the display panel of one embodiment of the present invention will be described with reference to FIGS. 36A to 36C.

Structural Example

Figure 36A:
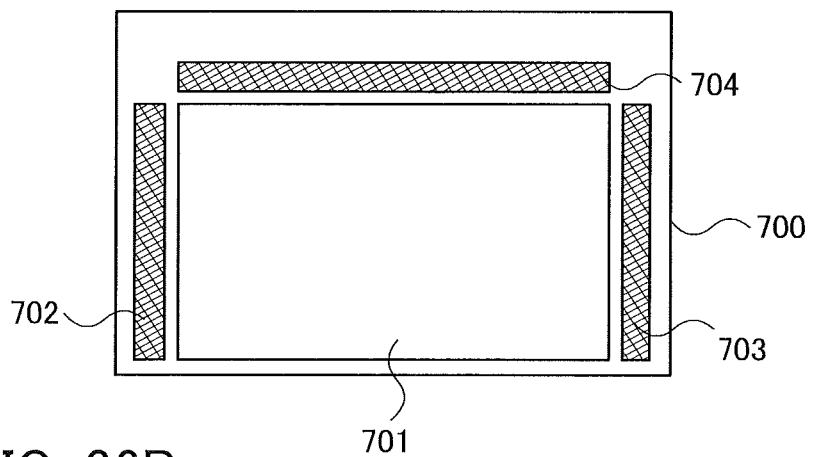
FIGS. 36A to 36C are a top view and circuit diagrams illustrating a display device of one embodiment of the present invention.

FIG. 36A is a top view of the display device of one embodiment of the present invention. FIG. 36B is a circuit diagram illustrating a pixel circuit that can be used in the case where a liquid crystal element is used in a pixel in the display device of one embodiment of the present invention. FIG. 36C is a circuit diagram illustrating a pixel circuit that can be used in the case where an organic EL element is used in a pixel in the display device of one embodiment of the present invention.

The transistor in the pixel portion can be formed in accordance with the above embodiments. The transistor can be easily formed as an n-channel transistor, and thus part of a driver circuit that can be formed using an n-channel transistor is formed over the same substrate as the transistor of the pixel portion. With the use of any of the transistors described in the above embodiments for the pixel portion or the driver circuit in this manner, a highly reliable display device can be provided.

FIG. 36A illustrates an example of a top view of an active matrix display device. A pixel portion 701, a scan line driver circuit 702, a scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the scan line driver circuit 702 and the scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 36A, the scan line driver circuit 702, the scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.
<Liquid Crystal Display Device>

Figure 36B:
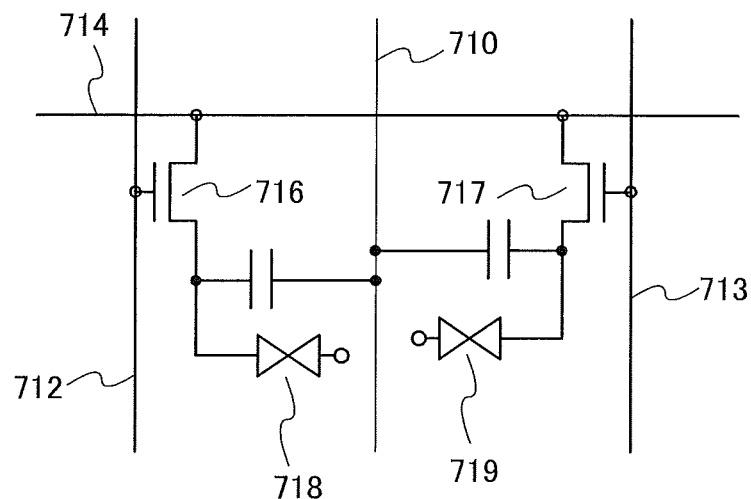

FIG. 36B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

A first pixel electrode layer is electrically connected to the transistor 716 and a second pixel electrode layer is electrically connected to the transistor 717. The first pixel electrode and the second pixel electrode are separated. Shapes of the first pixel electrode and the second pixel electrode are not especially limited. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, storage capacitors may be formed using a capacitor wiring 710, gate insulating films functioning as dielectrics, and capacitor electrodes electrically connected to the first pixel electrode layer and the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 36B. For example, a switch, a resistor, a capacitor, a transistor, a sensor, a logic circuit, or the like may be added to the pixel circuit illustrated in FIG. 36B.

<Organic EL Display Device>

Figure 36C:
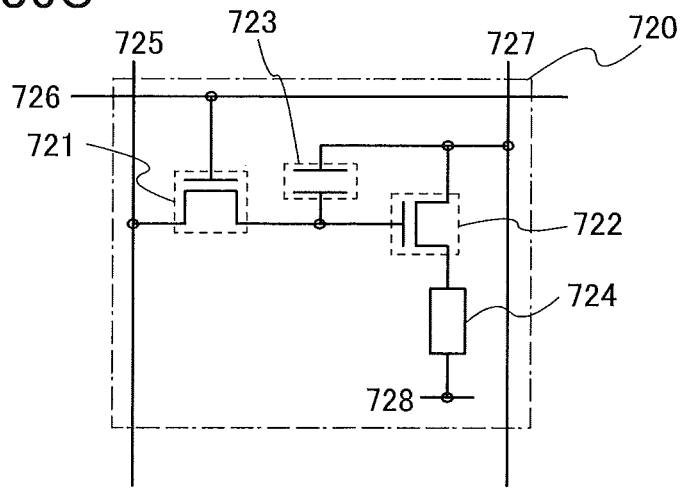

FIG. 36C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 36C illustrates an applicable example of a pixel circuit. Here, one pixel includes two n-channel transistors. Note that a metal oxide film of one embodiment of the present invention can be used for a channel formation region of the n-channel transistor. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that the gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 will be described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 36C. For example, a switch, a resistor, a capacitor, a sensor, a transistor, a logic circuit, or the like may be added to the pixel circuit illustrated in FIG. 36C.

In the case where the transistor shown in the above embodiments is used for the circuit shown in FIGS. 36A to 36C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electrical or magnetic effect may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Note that the structures, methods, and the like described in this embodiment can be used as appropriate in combination with any of the structures, methods, and the like described in the other embodiments.

Embodiment 7

In this embodiment, a structural example of the touch panel of one embodiment of the present invention is described with reference to FIG. 37.

<<Positional Relation Between Transistor and Wirings of Touch Sensor>>

Figure 37:
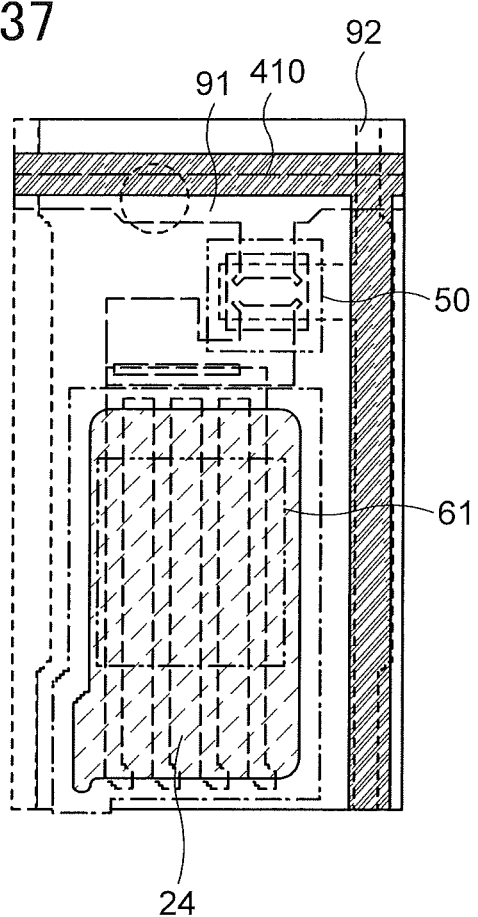
FIG. 37 is a top view illustrating positional relations of a pixel, a transistor, and wirings of a touch sensor.

FIG. 37 is a top view illustrating the positional relation between the pixel, a transistor, and wirings of the touch sensor. The conductive layer 410, which is an electrode for the touch sensor, can be provided so as to overlap with a source line 91 or a gate line 92, or can be provided not to overlap with and parallel to the source line 91 or the gate line 92, for example. The conductive layer 410, which is a wiring of the touch sensor, may overlap with a transistor 50 and a capacitor 61 unlike in the example. Although the conductive layer 410 is provided not to overlap with the pixel 24, the conductive layer 410 can be provided to overlap with the pixel 24. The conductive layers 430 and 380 which can function as an electrode of the touch sensor can be arranged in a similar manner.

<Structural Example of Sensor Electrode and the Like>

More specific structural examples of an input device 90, which functions as a touch sensor, are described below with reference to drawings.

Figure 38A:
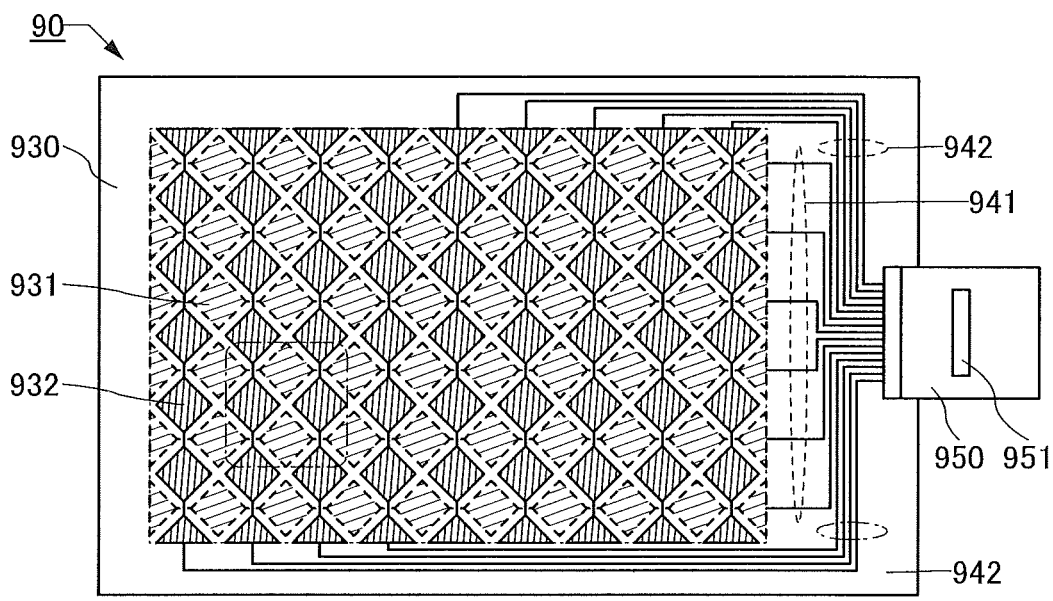
FIGS. 38A to 38D are top views each illustrating an input device of one embodiment of the present invention.

FIG. 38A is a top view of the input device 90. The input device 90 includes a plurality of electrodes 931, a plurality of electrodes 932, a plurality of wirings 941, and a plurality of wirings 942 over a substrate 930. The substrate 930 is provided with an FPC 950 which is electrically connected to each of the plurality of wirings 941 and the plurality of wirings 942. FIG. 38A illustrates an example in which the FPC 950 is provided with an IC 951.

Figure 38B:
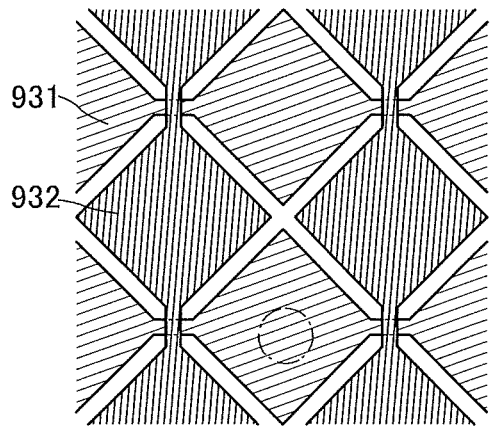

FIG. 38B shows an enlarged view of a region surrounded by a dashed dotted line in FIG. 38A. The electrodes 931 are each in the form of a series of rhombic electrode patterns aligned in a lateral direction of this figure. The rhombic electrode patterns aligned in a line are electrically connected to each other. The electrodes 932 are also each in the form of a series of rhombic electrode patterns aligned in a longitudinal direction of this figure and the rhombic electrode patterns aligned in a line are electrically connected. Part of the electrode 931 and part of the electrode 932 overlap and intersect with each other. At this intersection portion, an insulator is sandwiched in order to avoid an electrical short-circuit between the electrode 931 and the electrode 932.

Figure 38C:
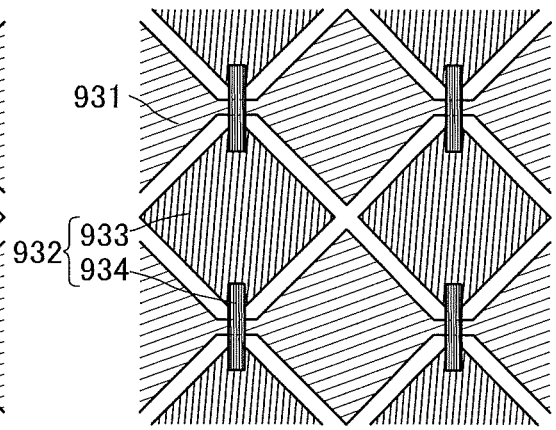

As shown in FIG. 38C, the electrodes 932 may form a plurality of island-shape rhombic electrodes 933 and bridge electrodes 934. The electrodes 933 are aligned in a longitudinal direction of this figure, and two adjacent electrodes 933 are electrically connected to each other by the bridge electrode 934. Such a structure makes it possible that the electrodes 933 and the electrodes 931 can be formed at the same time by processing the same conductive film. This can prevent variations in the thickness of these films, and can prevent the resistance value and the light transmittance of each electrode from varying from place to place. Note that although the electrodes 932 include the bridge electrodes 934 here, the electrodes 931 may have such a structure.

Figure 38D:
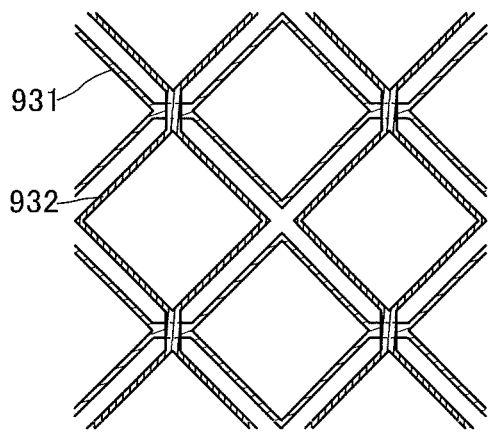
Figure 39A:
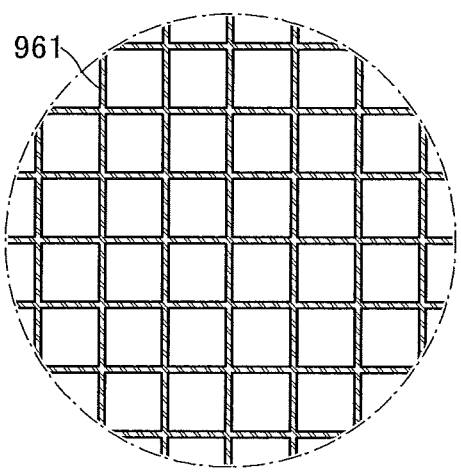
FIGS. 39A to 39D are top views each illustrating an input device of one embodiment of the present invention.
Figure 39B:
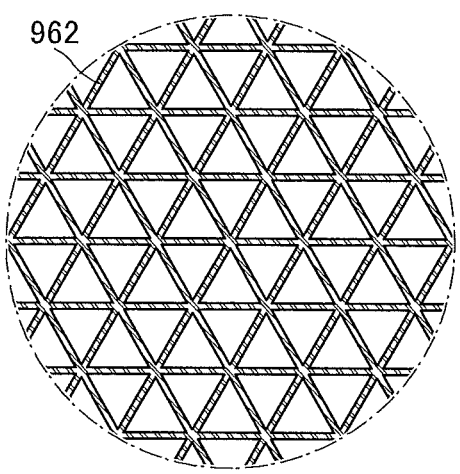
Figure 39C:
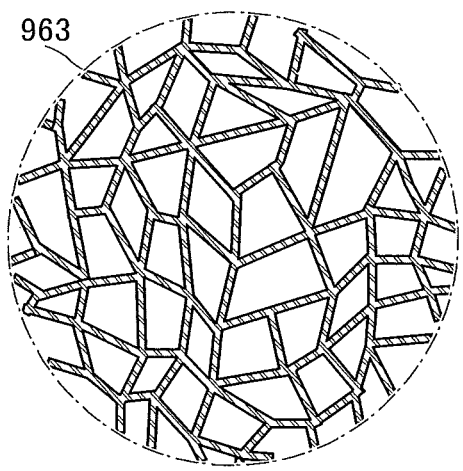
Figure 39D:
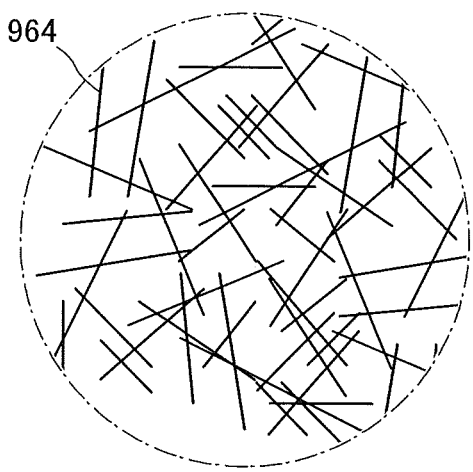

As shown in FIG. 38D, a design in which rhombic electrode patterns of the electrodes 931 and 932 shown in FIG. 38B are hollowed out and only edge portions are left may be used. At that time, when the electrodes 931 and the electrodes 932 are too small in width for the users to view, the electrodes 931 and the electrodes 932 can be formed using a light-blocking material such as a metal or an alloy, as described later. In addition, either the electrodes 931 or the electrodes 932 shown in FIG. 38D may include the above bridge electrodes 934.

One of the electrodes 931 is electrically connected to one of the wirings 941. One of the electrodes 932 is electrically connected to one of the wirings 942. Here, one of the electrodes 931 and 932 corresponds to a row wiring, and the other corresponds to a column wiring.

As examples, enlarged schematic views of part of the electrodes 931 or the electrodes 932 are shown in FIGS. 39A to 39D. The electrodes can have various shapes.

Figure 40A:
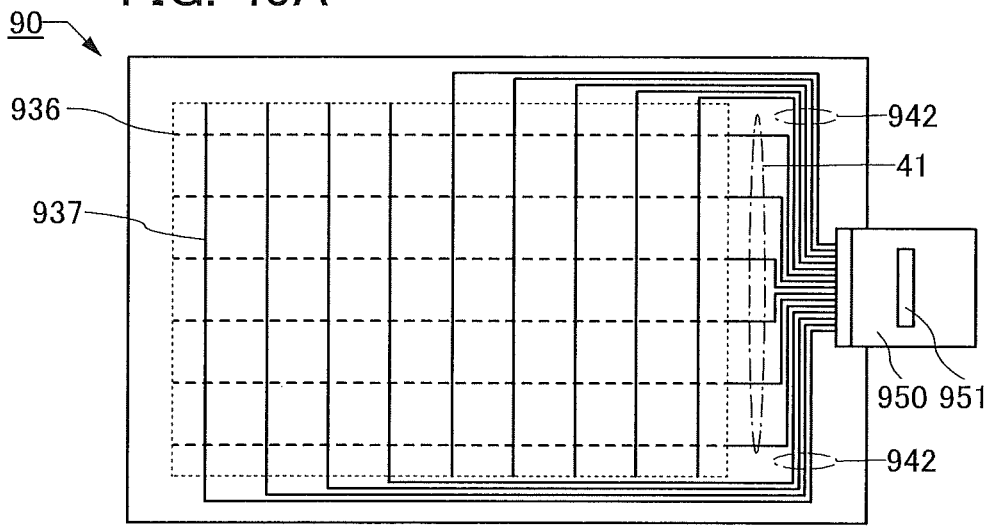
FIGS. 40A to 40C are top views each illustrating an input device of one embodiment of the present invention.
Figure 40B:
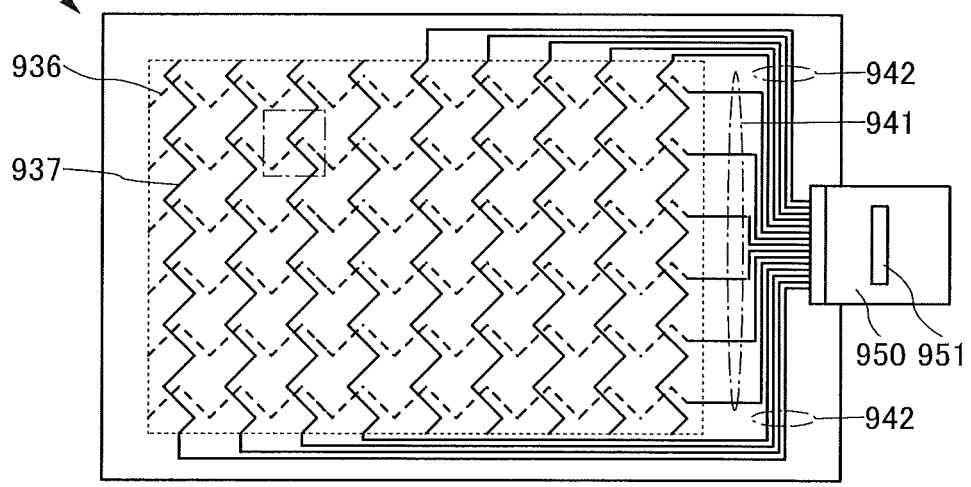
Figure 40C:
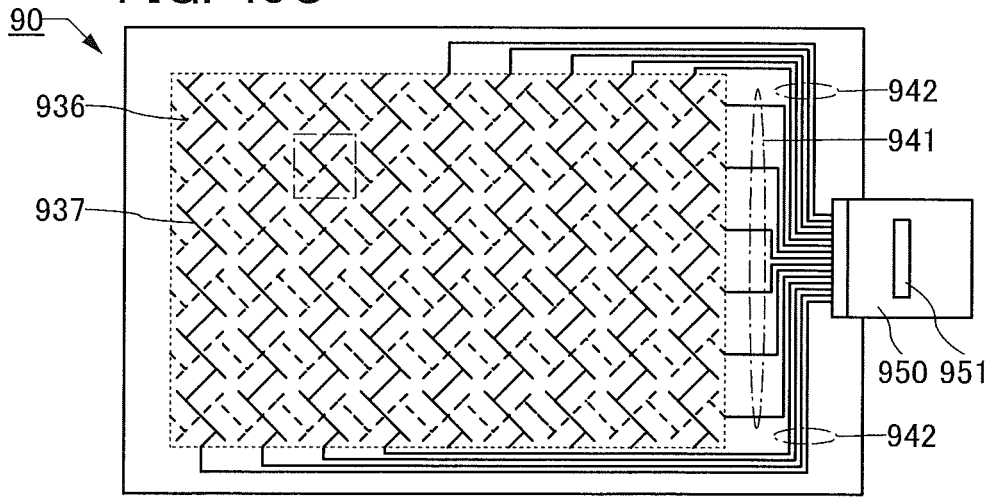

FIGS. 40A to 40C illustrate examples of the case where electrodes 936 and electrodes 937, which have a top surface shape of thin lines, are used instead of the electrodes 931 and the electrodes 932. FIG. 40A shows an example in which linear electrodes 936 and 937 are arranged so as to form a lattice shape. In FIGS. 40B and 40C, the electrodes 936 and 937 having a zigzag shape are arranged.

Figure 41A:
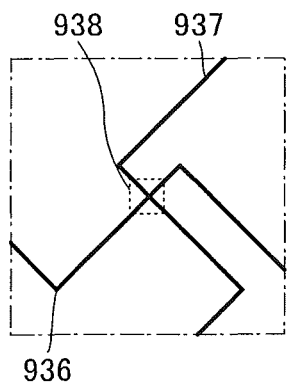
FIGS. 41A to 41F are top views each illustrating an input device of one embodiment of the present invention.
Figure 41B:
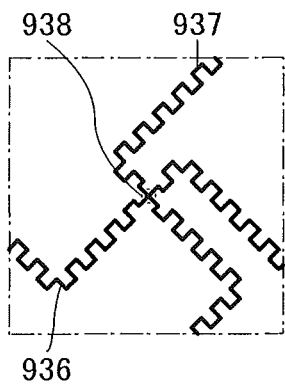
Figure 41C:
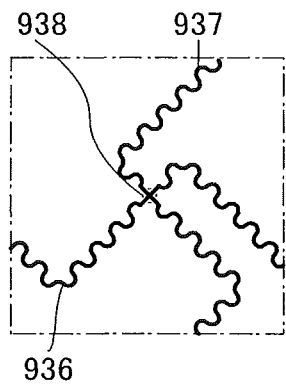
Figure 41D:
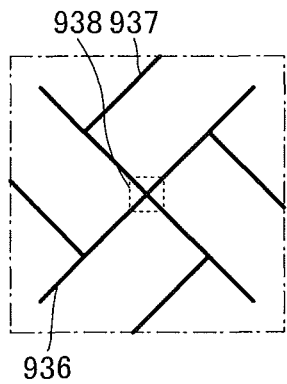
Figure 41E:
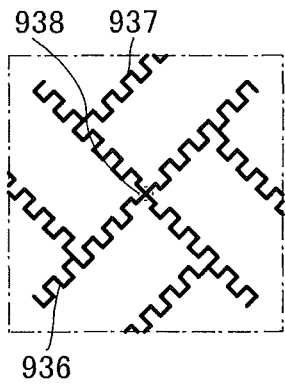
Figure 41F:
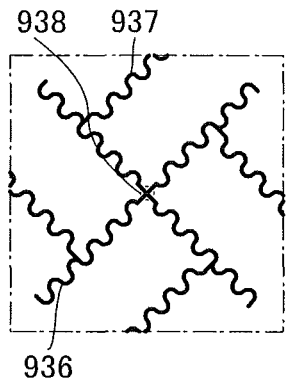

FIGS. 41A to 41C show enlarged views of a region surrounded by a dashed dotted line in FIG. 40B, and FIGS. 41D to 41F show enlarged views of a region surrounded by a dashed dotted line in FIG. 41C. In these drawings, the electrodes 936, the electrodes 937, and intersection portions 938 at which the electrodes 936 and the electrodes 937 intersect are illustrated. The straight-line portions of the electrodes 936 and the electrodes 937 shown in FIGS. 41A and 41D may have a serpentine shape that meanders with angled corners as shown in FIGS. 41B and 41E or may have a serpentine shape that continuously meanders as shown in FIGS. 41C and 41F.

<Structural Example of in-Cell Touch Panel>

A structural example of a touch panel incorporating the touch sensor into a display portion including a plurality of pixels will be described below. Here, an example where a liquid crystal element is used as a display element provided in the pixel is shown.

Figure 42A:
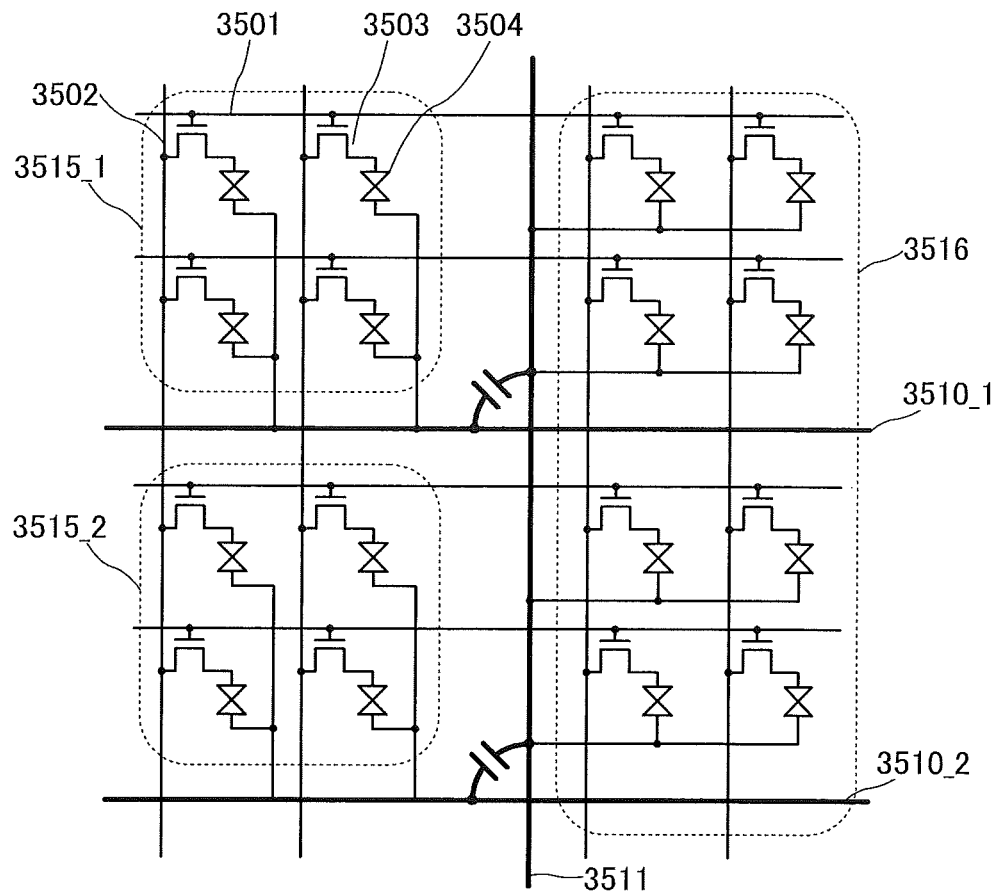
FIGS. 42A and 42B are circuit diagrams illustrating an input device of one embodiment of the present invention.

FIG. 42A is an equivalent circuit diagram of part of a pixel circuit provided in the display portion of the touch panel exemplified in this structural example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIGS. 42A and 42B, and actually, these two kinds of blocks are repeatedly arranged in the X direction and the Y direction.

The wiring 3510_1 (or the wiring 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511 extending in the Y direction is electrically connected to the linear block 3516.

Figure 42B:
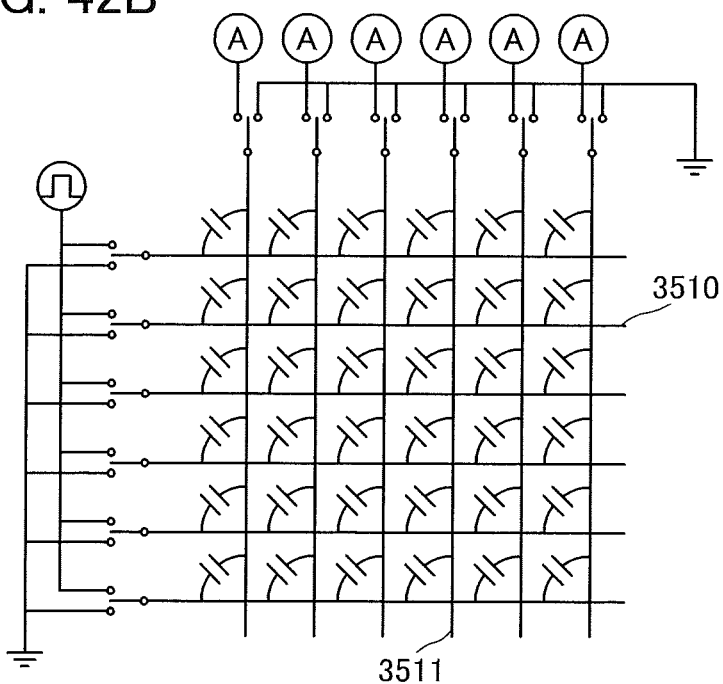

FIG. 42B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Furthermore, a ground potential can be input to each of the wirings 3511 extending in the Y direction, or each of the wirings 3511 can be electrically connected to a detection circuit.

Operation of the above-described touch panel will be described below with reference to FIGS. 43A and 43B.

Here, one frame period is divided into a writing period and a sensing period. The writing period is a period in which image data is written to a pixel, and the wirings 3510 (also referred to as gate lines) are sequentially selected. On the other hand, the sensing period is a period in which sensing is performed by a touch sensor, and the wirings 3510 extending in the X direction are sequentially selected and input voltage is input.

Figure 43A:
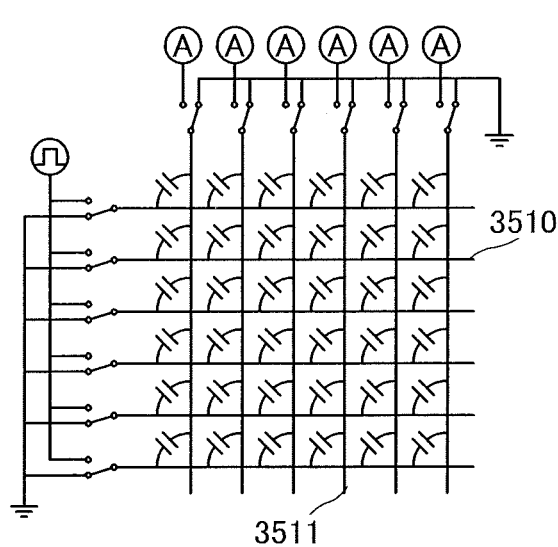
FIGS. 43A and 43B are circuit diagrams illustrating an input device of one embodiment of the present invention.

FIG. 43A is an equivalent circuit diagram in the writing period. In the wiring period, a common potential is input to both the wiring 3510 extending in the X direction and the wiring 3511 extending in the Y direction.

Figure 43B:
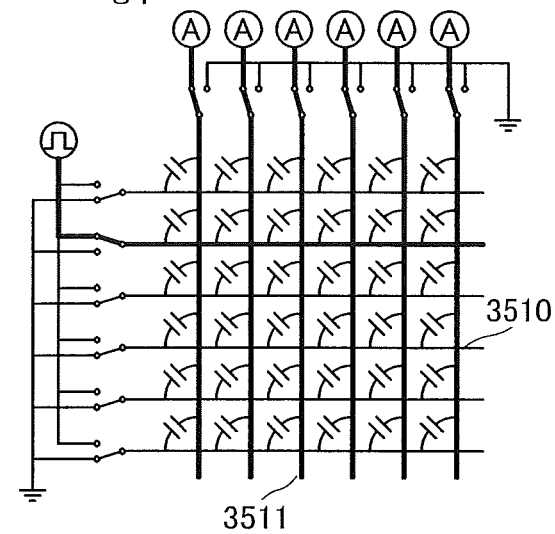

FIG. 43B is an equivalent circuit diagram at some point in time in the sensing period. In the sensing period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

Note that the driving method described here can be applied to not only an in-cell touch panel but also the above-described touch panels, and can be used in combination with the method described in the driving method example.

It is preferable that a period in which an image is written and a period in which sensing is performed by a touch sensor be separately provided as described above. Thus, a decrease in sensitivity of the touch sensor caused by noise generated when data is written to a pixel can be suppressed.

Note that the structures, methods, and the like described in this embodiment can be used as appropriate in combination with any of the structures, methods, and the like described in the other embodiments.

Embodiment 8

In this embodiment, a structure of an oxide semiconductor film is described.

<<Film Formation Method>>

An example of a method for forming a CAAC-OS film is described below.

FIG. 44A is a schematic view of the inside of a film formation chamber. The CAAC-OS film can be formed by a sputtering method.

As shown in FIG. 44A, a substrate 5220 and a target 5230 are arranged to face each other. Plasma 5240 is generated between the substrate 5220 and the target 5230. A heating mechanism 5260 is under the substrate 5220. The target 5230 is attached to a backing plate (not illustrated in the drawing). A plurality of magnets is arranged to face the target 5230 with the backing plate positioned therebetween. A sputtering method in which the disposition speed is increased by utilizing a magnetic field of the magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The film formation chamber is mostly filled with a deposition gas (e.g., an oxygen gas, an argon gas, or a mixed gas containing oxygen at 5 vol % or higher) and the pressure in the film formation chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 45:
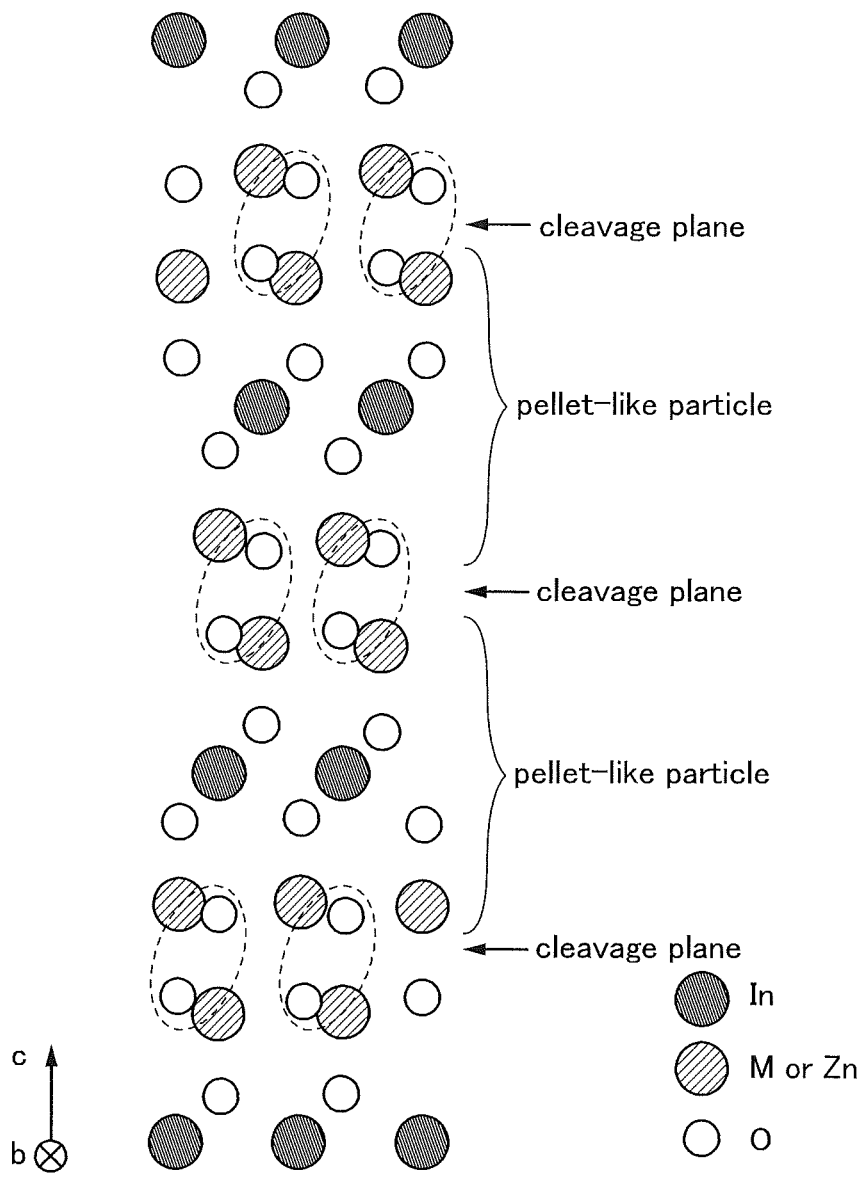
FIG. 45 illustrates a crystal structure of $InMZnO_4$.

Here, the target 5230 has a polycrystalline structure which includes a plurality of crystal grains and in which a cleavage plane exists in any of the crystal grains. As an example, a crystal structure of $InMZnO_4$ (the element M is aluminum, gallium, yttrium, or tin, for example) included in the target 5230 is illustrated in FIG. 45. Note that FIG. 45 illustrates the crystal structure of $InMZnO_4$ observed from a direction parallel to a b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 44A). The pellet 5200 is between the two cleavage planes shown in FIG. 45. Thus, when the pellet 5200 is observed, the cross-section thereof is as shown in FIG. 44B, and the top surface thereof is as shown in FIG. 44C. Note that the structure of the pellet 5200 may be distorted by an impact of collision of the ion 5201. Note that along with the separation of the pellet 5200, a particle 5203 is also sputtered from the target 5230. The particle 5203 has an atom or an aggregate of several atoms. Therefore, the particle 5203 can be referred to as an atomic particle.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of the deposition gas and the like. For example, the thickness of the pellet 5200 is greater than or equal to 0.4 nm and less than or equal to 1 nm, preferably greater than or equal to 0.6 nm and less than or equal to 0.8 nm In addition, for example, the width of the pellet 5200 is greater than or equal to 1 nm and less than or equal to 3 nm, preferably greater than or equal to 1.2 nm and less than or equal to 2.5 nm. For example, the ion 5201 collides with the target 5230 including the In-M-Zn oxide. Then, the pellet 5200 including three layers of an M-Zn—O layer, an In—O layer, and an M-Zn—O layer is separated. Note that the particle 5203 is also sputtered from the target 5230 along with the separation of the pellet 5200. The particle 5203 has an atom or an aggregate of several atoms. Therefore, the particle 5203 can be referred to as an atomic particle.

The pellet 5200 may receive a charge when passing through the plasma 5240, so that surfaces thereof are negatively or positively charged. For example, the pellet 5200 receives a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that part of the particles 5203 is discharged to the outside by a vacuum pump or the like because the particle 5203 is small in mass.

Next, deposition of the pellet 5200 and the particle 5203 on the surface of the substrate 5220 is described with reference to FIGS. 46A to 46E.

Figure 46A:
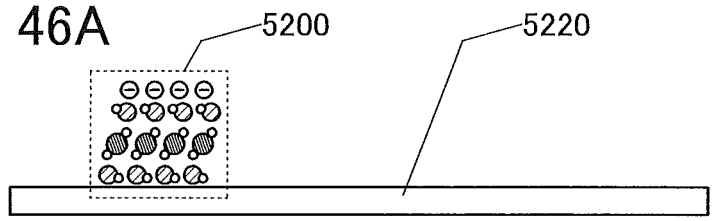
FIGS. 46A to 46E illustrate a deposition method of a CAAC-OS.

First, a first of the pellets 5200 is deposited over the substrate 5220. Since the pellet 5200 has a flat-plate-like shape, it is deposited so that the flat plane faces to the surface of the substrate 5220 (FIG. 46A). Here, a charge on a surface of the pellet 5200 on the substrate 5220 side is lost through the substrate 5220.

Figure 46B:
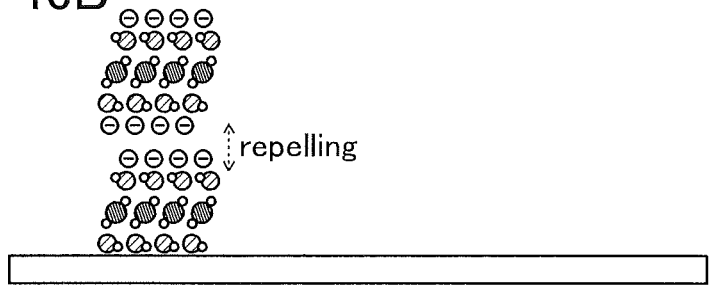

Next, a second of the pellets 5200 reaches the substrate 5220. Here, since another surface of the first of the pellets 5200 and surfaces of the second of the pellets 5200 are charged, they repel each other (FIG. 46B).

Figure 46C:
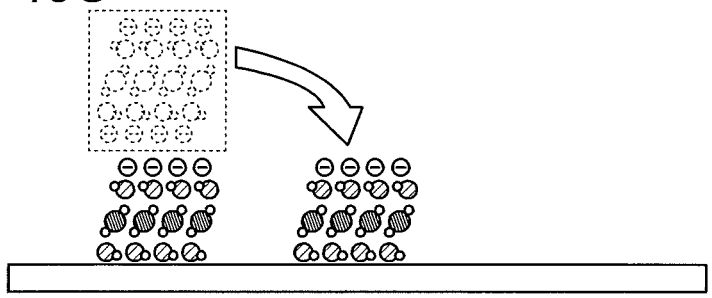

As a result, the second of the pellets 5200 avoids being deposited over the first of the pellets 5200, and is deposited over the surface of the substrate 5220 so as to be a little distance away from the first of the pellets 5200 (FIG. 46C). With repetition of this, millions of the pellets 5200 are deposited over the surface of the substrate 5220 to have a thickness of one layer. A region where any pellet 5200 is not deposited is generated between adjacent pellets 5200.

Figure 46D:
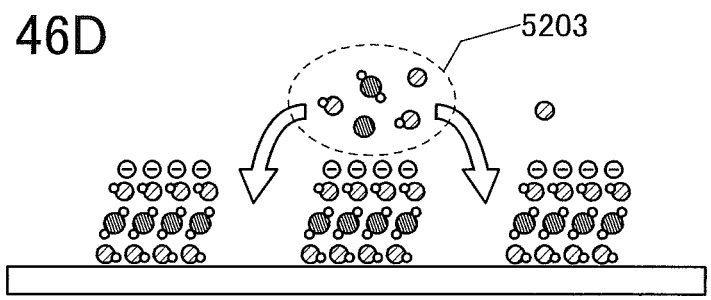

Next, the particle 5203 reaches the surface of the substrate 5220 (FIG. 46D).

The particle 5203 cannot be deposited over an active region such as the surface of the pellet 5200. Therefore, the particle 5203 is deposited so as to fill a region where the pellets 5200 are not deposited. The particles 5203 grow in the horizontal (lateral) direction between the pellets 5200, thereby connecting the pellets 5200. In this way, the particles 5203 are deposited until they fill regions where the pellets 5200 are not deposited. This mechanism is similar to a deposition mechanism of the ALD method.

Figure 46E:
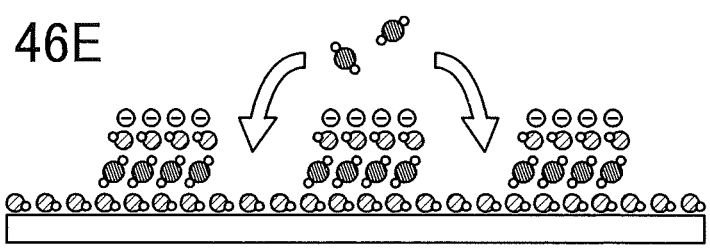

Note that there can be several mechanisms for the lateral growth of the particles 5203 between the pellets 5200. For example, as shown in FIG. 46E, the pellets 5200 can be connected from side surfaces of the first M-Zn—O layers. In this case, after the first M-Zn—O layers make connection, the In—O layers and the second M-Zn—O layers are connected in this order (the first mechanism).

Figure 47A:
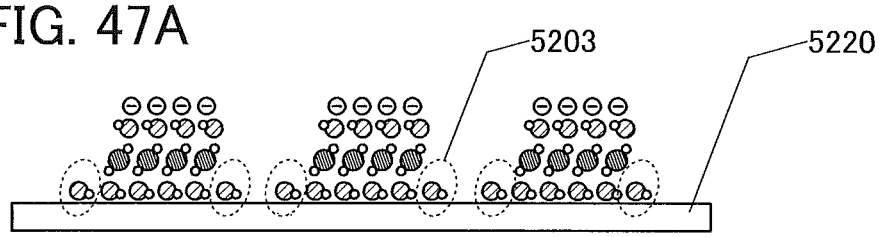
FIGS. 47A to 47C illustrate a deposition method of a CAAC-OS.
Figure 47B:
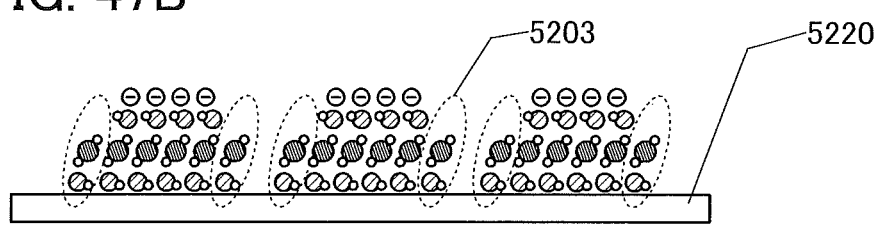
Figure 47C:
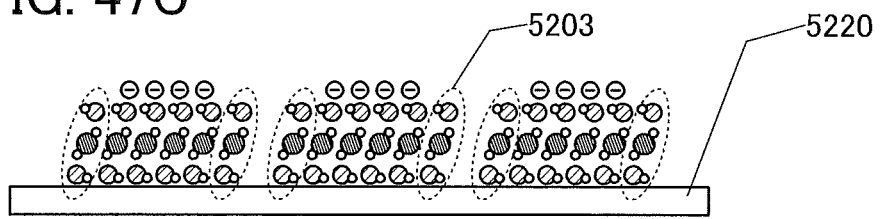

Alternatively, as shown in FIG. 47A, first, the particles 5203 are connected to the sides of the first M-Zn—O layers so that each side of the first M-Zn—O layer has one particle 5203. Then, as shown in FIG. 47B, the particle 5203 is connected to each side of the In—O layers. After that, as shown in FIG. 47C, the particle 5203 is connected to each side of the second M-Zn—O layers (the second mechanism). Note that the connection can also be made by the simultaneous occurrence of the deposition in FIGS. 47A, 47B, and 47C (the third mechanism).

As shown in the above, the above three mechanisms are considered as the mechanisms of the lateral growth of the particles 5203 between the pellets 5200. However, the particles 5203 may grow up laterally between the pellets 5200 by other mechanisms.

Therefore, even when the orientations of a plurality of pellets 5200 are different from each other, generation of crystal boundaries can be suppressed since the particles 5203 laterally grow to fill gaps between the plurality of pellets 5200. In addition, as the particles 5203 make smooth connection between the plurality of pellets 5200, a crystal structure different from a single crystal and a polycrystal is formed. In other words, a crystal structure including distortion between minute crystal regions (pellets 5200) is formed. The regions filling the gaps between the crystal regions are distorted crystal regions; and thus, it will be not appropriate to say that the regions have an amorphous structure.

When the particles 5203 completely fill the regions between the pellets 5200, a first layer with a thickness almost the same as that of the pellet 5200 is formed. Then, a new first of the pellets 5200 is deposited over the first layer, and a second layer is formed. With repetition of this cycle, the stacked-layer thin film structure is formed (FIG. 44D).

A deposition way of the pellets 5200 changes depending on the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and less than 500° C., preferably higher than or equal to 140° C. and less than 450° C., or further preferably higher than or equal to 170° C. and less than 400° C. Therefore, even when a large-sized substrate of the 8th generation or more is used as the substrate 5220, a warp or the like hardly occur.

Figure 48:
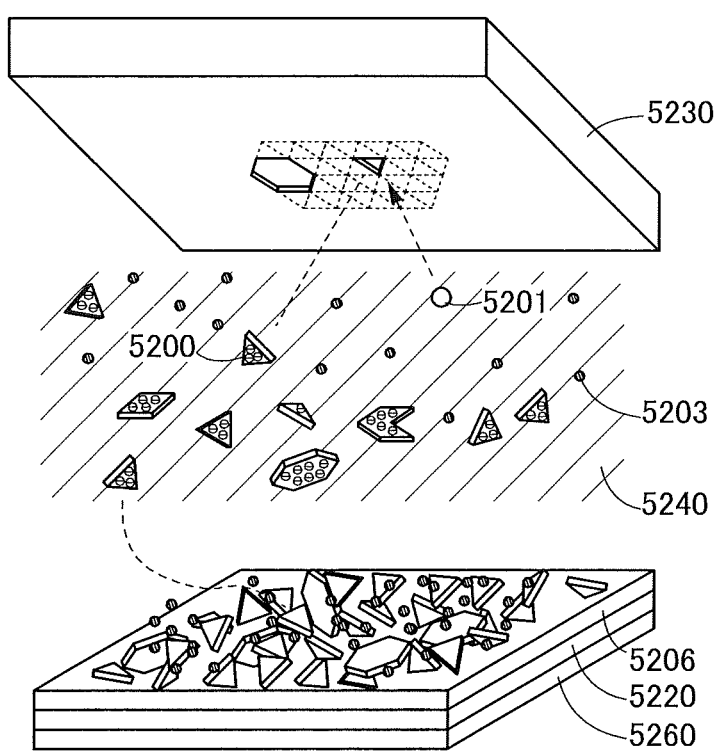
FIG. 48 illustrates a deposition method of an nc-OS.

On the other hand, if the surface temperature of the substrate 5220 is low, the migration of the pellets 5200 over the substrate 5220 does not easily occur. As a result, the pellets 5200 are stacked to form a nanocrystalline oxide semiconductor (nc-OS) or the like with low orientation (FIG. 48). In the nc-OS, the pellets 5200 are possibly deposited with certain gaps since the pellets 5200 are negatively charged. Therefore, the nc-OS film has low orientation but some regularity, and thus it has a denser structure than an amorphous oxide semiconductor.

When spaces between the pellets are extremely small in a CAAC-OS, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

According to such a model, the pellets 5200 are considered to be deposited on the substrate 5220. A CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

Embodiment 9

<Module>

A display module using a semiconductor device of one embodiment of the present invention is described below with reference to FIG. 49.

Figure 49:
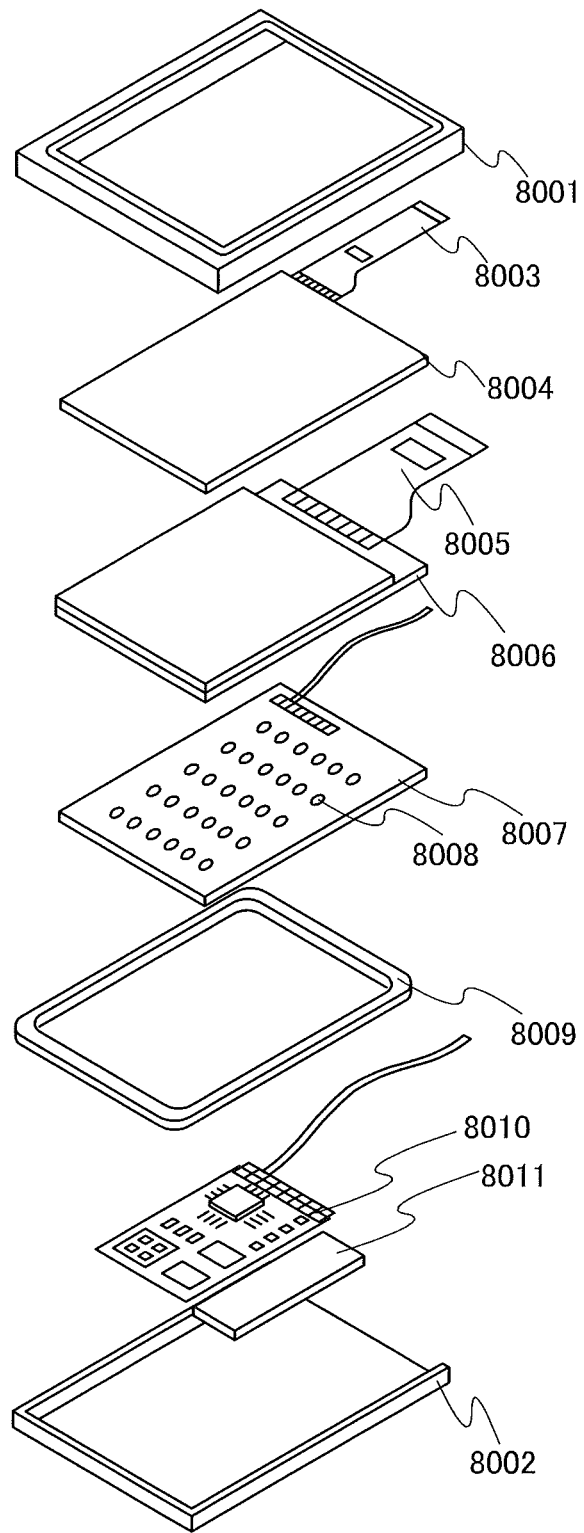
FIG. 49 is a top view illustrating a display module to which a semiconductor device of one embodiment of the present invention is applied.

In a display module 8000 in FIG. 49, a touch sensor portion 8004 connected to an FPC 8003, a display device 8006 connected to an FPC 8005, a backlight unit 8007, a frame 8009, a printed board 8010, and a battery 8011 are provided between an upper cover 8001 and a lower cover 8002. The backlight unit 8007, the battery 8011, the touch sensor 8004, or the like is not provided in some cases.

The semiconductor device of one embodiment of the present invention can be used for, for example, the display device 8006.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and can be formed to overlap with the display device 8006. A counter substrate (sealing substrate) of the display device 8006 can have a touch panel function. A photosensor may be provided in each pixel of the display device 8006 to form an optical touch panel. An electrode for a touch sensor may be provided in each pixel of the display device 8006 to form a capacitive touch panel.

The backlight unit 8007 includes a light source 8008. The light source 8008 may be provided at an end portion of the backlight unit 8007 and a light diffusing plate may be used.

The frame 8009 protects the display device 8006 and may also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

Embodiment 10

<Electronic Device>

In this embodiment, examples of an electronic device to which the display device of one embodiment of the present invention can be applied will be described with reference to FIGS. 50A to 50F and FIGS. 51A to 51D.

Examples of an electronic device including the display device include television sets (also referred to as televisions or television receivers), monitors of computers or the like, cameras such as digital cameras or digital video cameras, digital photo frames, mobile phones (also referred to as cellular phones or mobile phone devices), portable game machines, portable information terminals, audio reproducing devices, and large game machines such as pachinko machines. Specific examples of these electronic devices are illustrated in FIGS. 50A to 50F and FIGS. 51A to 51D.

Figure 50A:
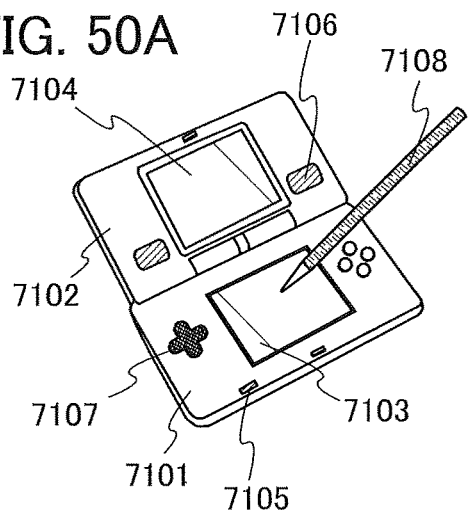
FIGS. 50A to 50F each illustrate an electronic device of one embodiment of the present invention.

FIG. 50A illustrates a portable game machine including a housing 7101, a housing 7102, a display portion 7103, a display portion 7104, a microphone 7105, speakers 7106, an operation key 7107, a stylus 7108, and the like. The display device of one embodiment of the present invention can be used for the display portion 7103 or the display portion 7104. When the display device of one embodiment of the present invention is used as the display portion 7103 or 7104, it is possible to provide a user-friendly portable game machine with quality that hardly deteriorates. Although the portable game machine illustrated in FIG. 50A includes two display portions, the display portion 7103 and the display portion 7104, the number of display portions included in the portable game machine is not limited to two.

Figure 50B:
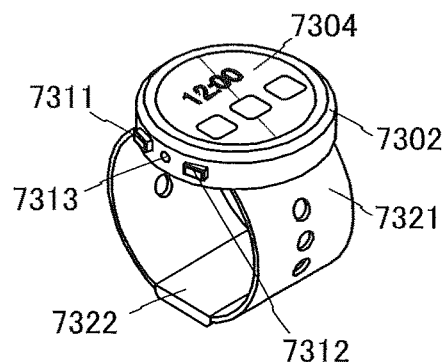

FIG. 50B illustrates a smart watch, which includes a housing 7302, a display portion 7304, operation buttons 7311 and 7312, a connection terminal 7313, a band 7321, a clasp 7322, and the like. The display device or touch panel of one embodiment of the present invention can be used for the display portion 7304.

Figure 50C:
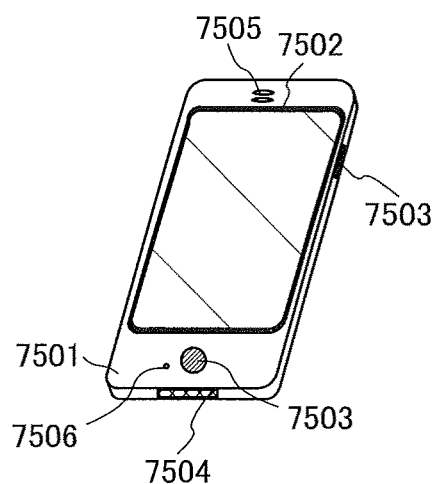

FIG. 50C illustrates a portable information terminal that includes a display portion 7502 incorporated in a housing 7501, operation buttons 7503, an external connection port 7504, a speaker 7505, a microphone 7506, and the like. The display device of one embodiment of the present invention can be used for the display portion 7502. Note that the display portion 7502 is small- or medium-sized but can perform 8 k display because it has greatly high definition; therefore, a significantly clear image can be obtained.

Figure 50D:
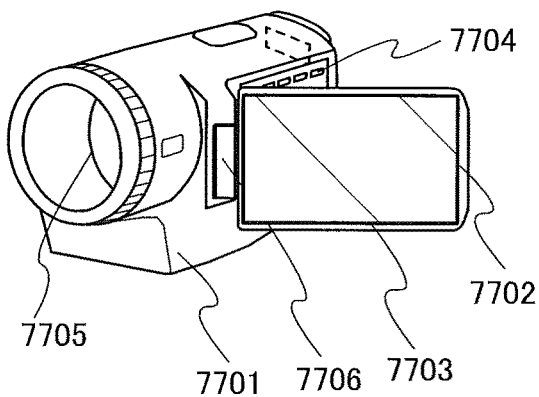

FIG. 50D illustrates a video camera, which includes a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device in one embodiment of the present invention can be provided in a focus position of the lens 7705. The display device of one embodiment of the present invention can be used for the image display portion 7703.

Figure 50E:
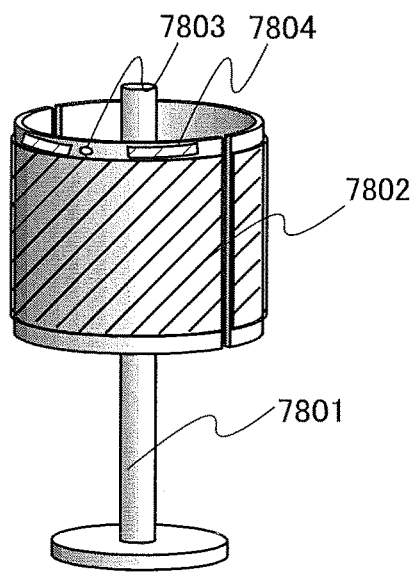

FIG. 50E illustrates a curved display including a display portion 7802 incorporated in a housing 7801, an operation button 7803, a speaker 7804, and the like. The display device of one embodiment of the present invention can be used for the display portion 7802.

Figure 50F:
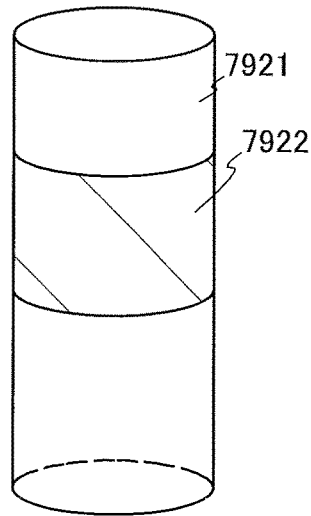

FIG. 50F illustrates a digital signage including a display portion 7922 provided on a utility pole 7921. The display device of one embodiment of the present invention can be used for the display portion 7922.

Figure 51A:
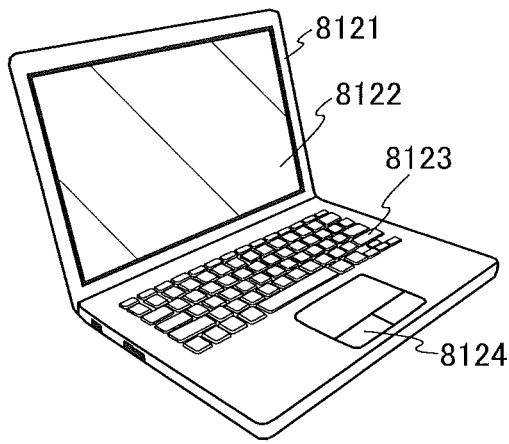
FIGS. 51A to 51D each illustrate an electronic device of one embodiment of the present invention.

FIG. 51A illustrates a notebook personal computer, which includes a housing 8121, a display portion 8122, a keyboard 8123, a pointing device 8124, and the like. The display device of one embodiment of the present invention can be used for the display portion 8122. Note that the display portion 8122 is small- or medium-sized but can perform 8 k display because it has greatly high definition; therefore, a significantly clear image can be obtained.

Figure 51B:
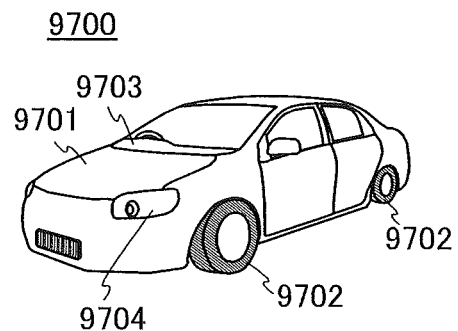
Figure 51C:
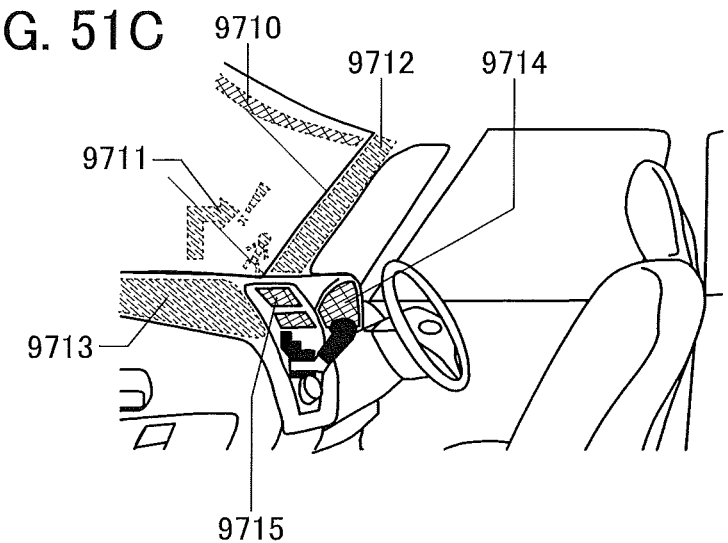

FIG. 51B is an external view of an automobile 9700. FIG. 51C illustrates a driver's seat of the automobile 9700. The automobile 9700 includes a car body 9701, wheels 9702, a dashboard 9703, lights 9704, and the like. The display device or input/output device of one embodiment of the present invention can be used in a display portion or the like of the automobile 9700. For example, the display device, input/output device, or touch panel of one embodiment of the present invention can be used in display portions 9710 to 9715 illustrated in FIG. 51C.

The display portion 9710 and the display portion 9711 are each a display device or an input/output device provided in an automobile windshield. The display device or input/output device of one embodiment of the present invention can be a see-through display device or input/output device, through which the opposite side can be seen, using a light-transmitting conductive material for its electrodes. Such a see-through display device or input/output device does not hinder driver's vision during driving the automobile 9700. Thus, the display device or input/output device of one embodiment of the present invention can be provided in the windshield of the automobile 9700. Note that in the case where a transistor or the like for driving the display device or input/output device is provided in the display device or input/output device, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 51D:
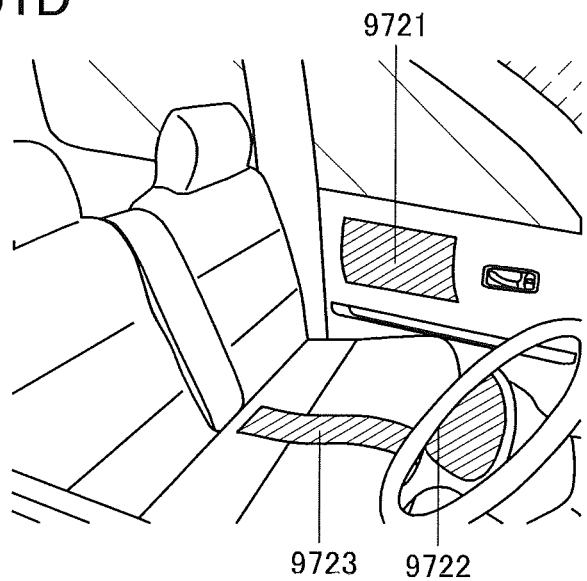

FIG. 51D illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

A display portion including the display device of one embodiment of the present invention can be flat, in which case the display device does not necessarily have a curved surface or flexibility.

Note that the structures, methods, and the like described in this embodiment can be used as appropriate in combination with any of the structures, methods, and the like described in the other embodiments.

Example 1

In this example, Ca tests were conducted to evaluate a moisture barrier property of the protection film 23 of one embodiment of the present invention. The results are described.

A sample was fabricated in the following manner: an 80-nm-thick calcium film was formed on a glass substrate by vacuum evaporation; an adhesive for one drop fill (ODF) was applied thereon; the glass substrate was bonded to another glass substrate in a vacuum; the adhesive was cured; and then, the protection film 23 was formed. The width of the bonded portion between the glass substrates was approximately 1 mm.

As the protection film 23, an aluminum oxide film was formed by an ALD method. A 100-nm-thick aluminum oxide film was formed by a thermal ALD method using trimethyl aluminum (TMA) and ozone as precursors.

Figure 52:
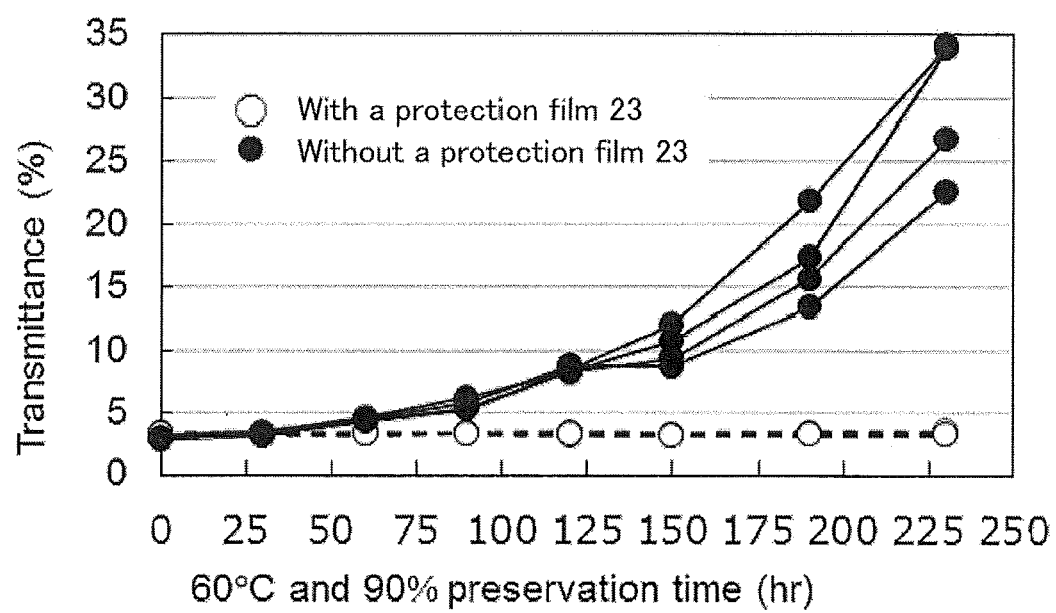
FIG. 52 shows results of Ca tests with/without a protection film formed by an ALD method.

FIG. 52 shows the results of the Ca tests of samples with/without the protection film formed by an ALD method. The horizontal axis represents the preservation time at 60° C. and at a humidity of 90%, and the vertical axis represents light transmittance. A high light transmittance means a large amount of moisture.

According to FIG. 52, in the case of samples without the protection film 23, the light transmittance tends to increase because moisture enters the samples. In contrast, in the case of the sample with the protection film 23 of one embodiment of the present invention which is formed by an ALD method, a change in light transmittance was not observed. Therefore, one embodiment of the present invention has an effect of suppressing entry of moisture.

Example 2

In this example, voltage holding characteristics of a test cell in which liquid crystal was sealed and the protection film 23 of one embodiment of the present invention was provided was evaluated. The results are described.

Table 1 lists the specifications of the test cells, and Table 2 lists measurement conditions.

TABLE 1

| Electrode area | 29 mm × 29 mm |
|---|---|
| Cell gap | 4 μm |
| Alignment treatment | Twist rubbing |
| Liquid crystal (two kinds) | $\Delta\varepsilon$ = 3.8, $\Delta n$ = 0.1102 |
| | $\Delta\varepsilon$ = −3.0, $\Delta n$ = 0.0998 |
| Sealed width | approx. 1 mm |
| AlOx film thickness | approx. 70 nm, 110 nm |

TABLE 2

| Measurement System | Model 6254 (TOYO Corporation) |
|---|---|
| Soak Voltage | ±5 V |
| Soak time | 4 msec |
| Holding time | 9996 msec |
| Temperature | 30° C. |

Each of the test cells has a structure in which liquid crystal is sandwiched between electrodes having a light-transmitting property (ITO electrodes), and was fabricated by an ODF process. Then, an aluminum oxide film was formed as the protection film 23. The aluminum oxide film was formed at 80° C. by a thermal ALD method using TMA and ozone as precursors. Two types of the aluminum oxide films (thickness: 70 nm, 110 nm) were prepared. For the evaluation, positive-type liquid crystal and negative-type liquid crystal were used.

Figure 53:
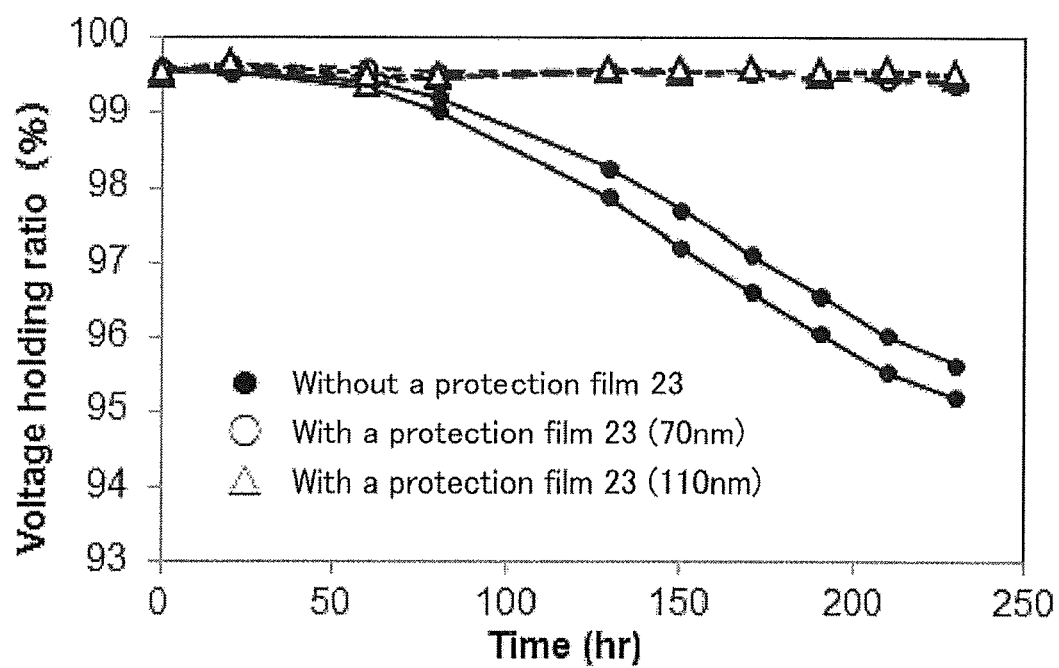
FIG. 53 shows measurement results of voltage holding ratios of samples that use positive-type liquid crystal and one embodiment of the present invention.
Figure 54:
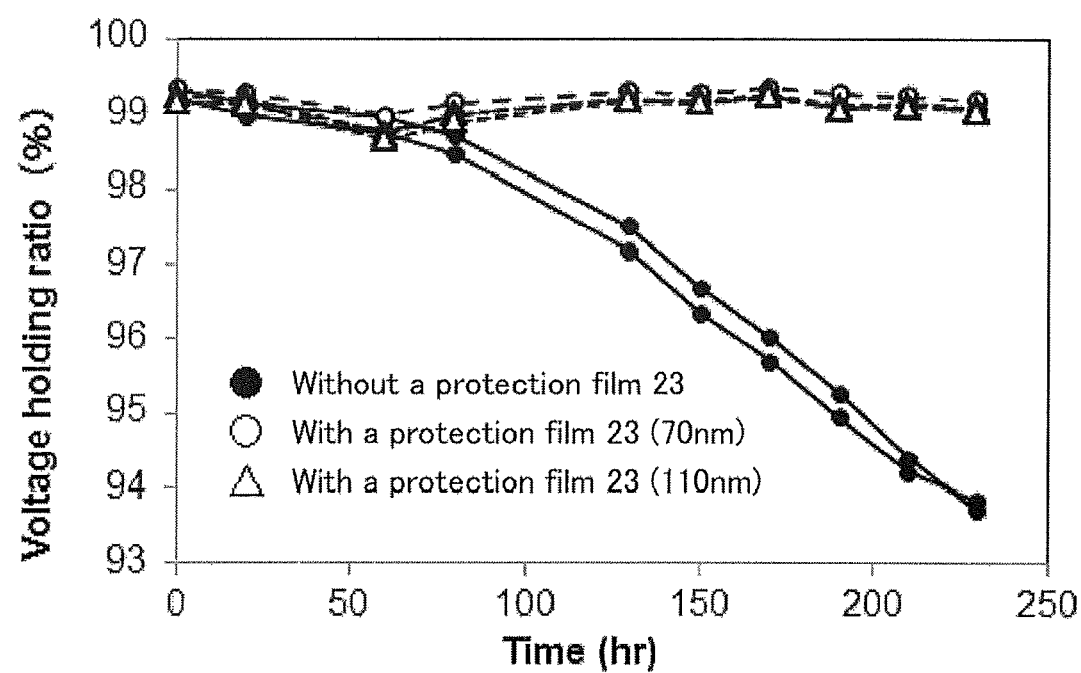
FIG. 54 shows measurement results of voltage holding ratios of samples that use negative-type liquid crystal and one embodiment of the present invention.

FIG. 53 shows measurement results of voltage holding ratios of samples in which the protection film 23 of one embodiment of the present invention and positive-type liquid crystal are used. FIG. 54 shows measurement results of voltage holding ratios of samples in which the protection film 23 of one embodiment of the present invention and negative-type liquid crystal are used. The horizontal axis represents the preservation time at 60° C. and at a humidity of 90%, and the vertical axis represents the voltage holding ratios.

According to FIG. 53 and FIG. 54, it is found that in the samples using positive-type liquid crystal and the samples using negative-type liquid crystal, the voltage holding ratios are not changed from the start period, that is, long-term reliability of a voltage holding ratio is improved. This is because the samples include the protection film 23 of one embodiment of the present invention. This effect can be obtained in both cases where the thickness of the protection film 23 is 70 nm and 110 nm Therefore, the protection film 23 of one embodiment of the present invention enables more stable voltage holding, so that operation reliability can be improved even at driving with reduced writing operations.

Example 3

In this example, a display device including the liquid crystal element of one embodiment of the present invention was manufactured. The display result of the display device is described.

Table 3 lists specifications of the display device including the liquid crystal element. The display device is a high-definition liquid crystal panel.

TABLE 3

| Screen Diagonal | 4.29 inch |
|---|---|
| Resolution | 1080 × RGB (H) × 1920 (V): Full-HD |
| Pixel Pitch | 49.5 μm (H) × 49.5 μm (V) |
| Pixel Density | 513 ppi |
| FET | CAAC-OS |
| Scan driver | Integrated |
| Bezel | <1 mm |

In the display device, an aluminum oxide film was formed as the protection film 23 by an ALD method. An aluminum oxide film was formed to a thickness of approximately 100 nm at 80° C. by a thermal ALD method using trimethyl aluminum (TMA) and ozone as precursors.

Figure 55:
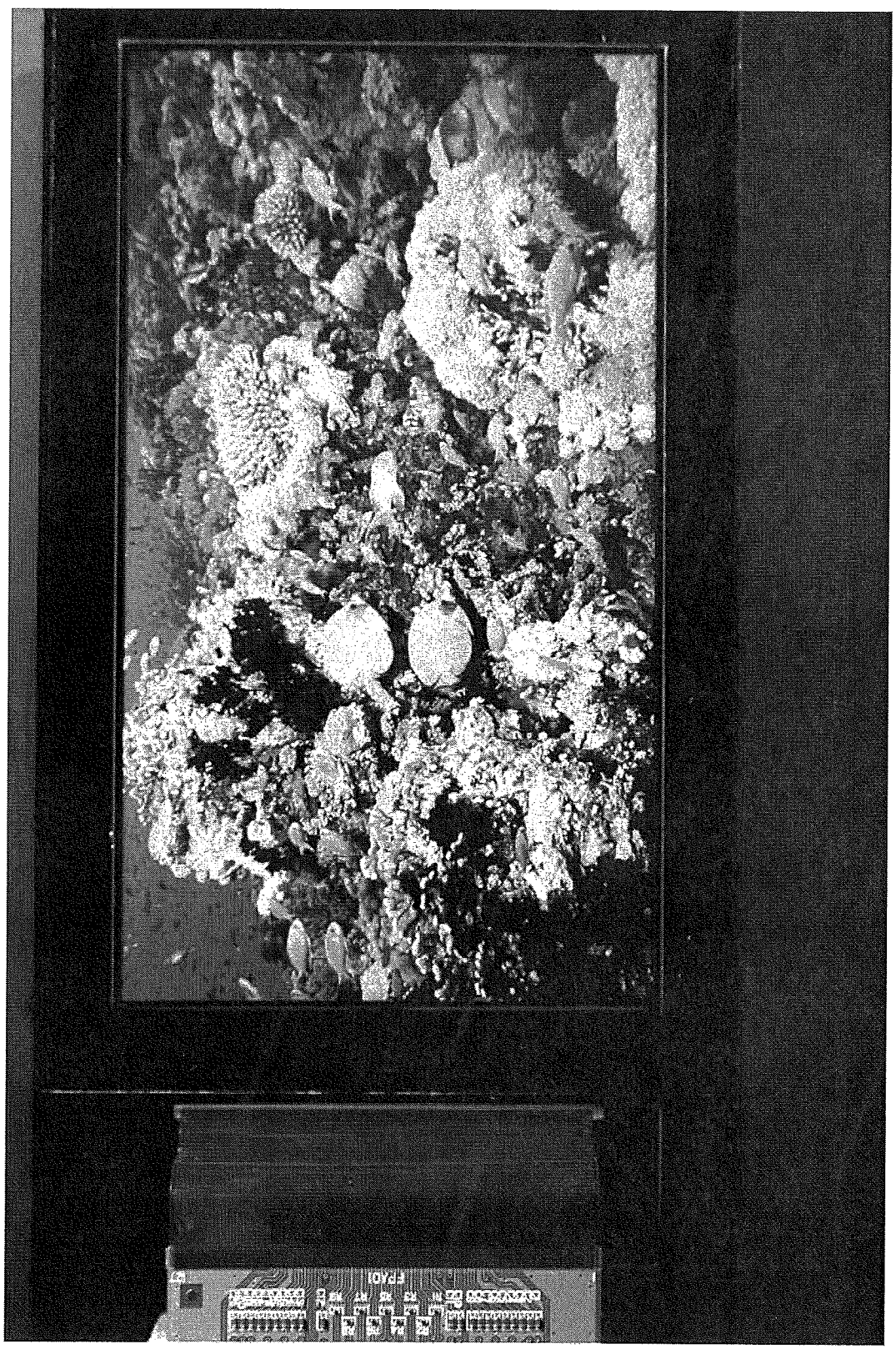
FIG. 55 shows display of a display device manufactured using one embodiment of the present invention.

FIG. 55 shows display of the display device for which one embodiment of the present invention is used. The frame width is less than or equal to 1 mm According to FIG. 55, it is found that by sealing the side surface portion and the peripheral portion with the protection film 23 formed by an ALD method, a display device which has high display quality and is highly reliable while having a narrow frame width can be provided.

Example 4

In this example, a side surface portion of the display panel 20, which was used in Example 3, was subjected to cross-sectional observation with a scanning electron microscope (SEM) and element mapping analysis with an energy dispersive X-ray spectroscopy (EDX). The results of the observation and the analysis are described.

Figure 56A:
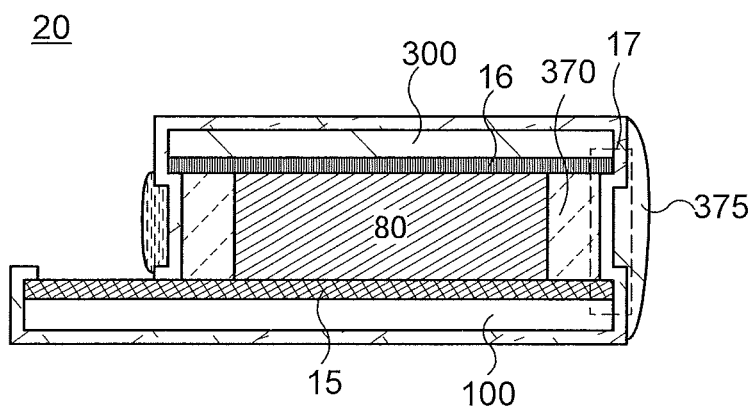
FIG. 56A is a schematic cross-sectional view of a display panel.
Figure 56B:
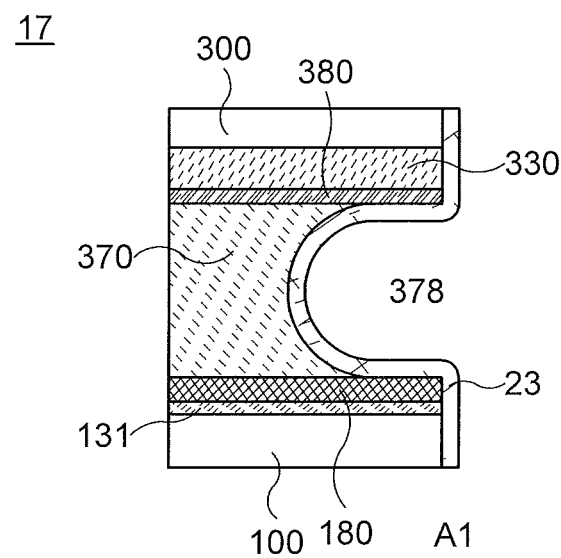
FIG. 56B is a schematic cross-sectional view of a region observed by SEM.

For the SEM observation, SU8030 produced by Hitachi High-Technologies Corporation was used. For the EDX analysis, EMAXEvolution produced by HORIBA, Ltd. was used. The side surface portions of the substrates were fixed to a resin 378, and then observation was performed. FIG. 56A is a schematic cross-sectional view of the observed display panel 20. For easier describing, regions in which a transistor, a capacitor, an insulating layer, a conductive layer, and the like are formed are illustrated as a region 15 and a region 16. An observed region is a region 17 in FIG. 56A. FIG. 56B is a schematic view of the region 17. The region 17 includes the substrate 100, the substrate 300, the insulating layer 131, the insulating layer 180, the protection film 23, the insulating layer 330, the conductive layer 380, the bonding layer 370, and the resin 378.

Figure 57A:
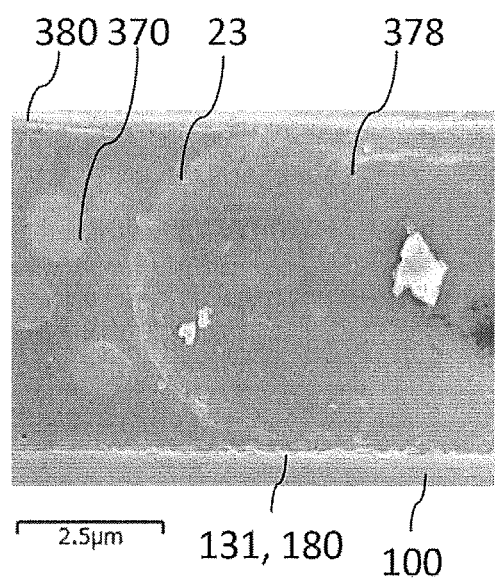
FIG. 57A is a cross-sectional SEM image of a side surface portion of a display panel.
Figure 57B:
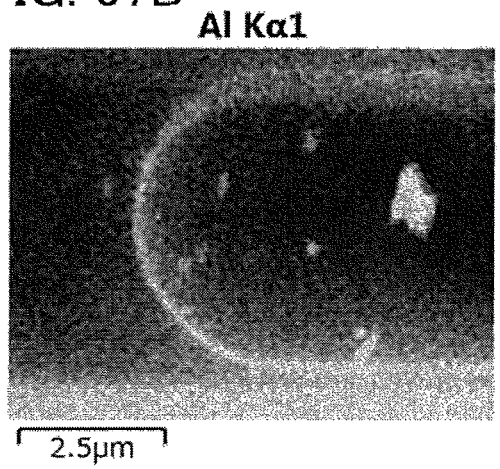
FIGS. 57B and 57C show mapping analysis results thereof by EDX.
Figure 57C:
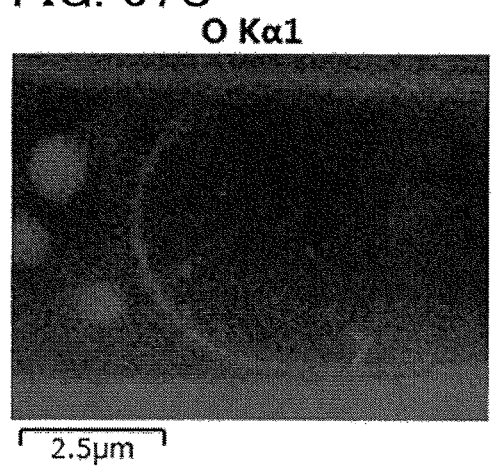

FIG. 57A is a cross-sectional SEM image of the region 17. FIG. 57B shows EDX analysis results of aluminum mapping. FIG. 57C shows EDX analysis results of oxygen mapping.

FIG. 57A indicates that the region 17 includes the substrate 100, the insulating layer 131, the insulating layer 180, the bonding layer 370, the resin 378, and the conductive layer 380. According to FIGS. 57B and 57C, it is found that in the side surface portion of the display device, aluminum and oxygen are detected along the conductive layer 380, the bonding layer 370, and the insulating layer 180; thus, the aluminum oxide film, which is the protection film 23 formed by an ALD method, is uniformly formed.

Figure 58A:
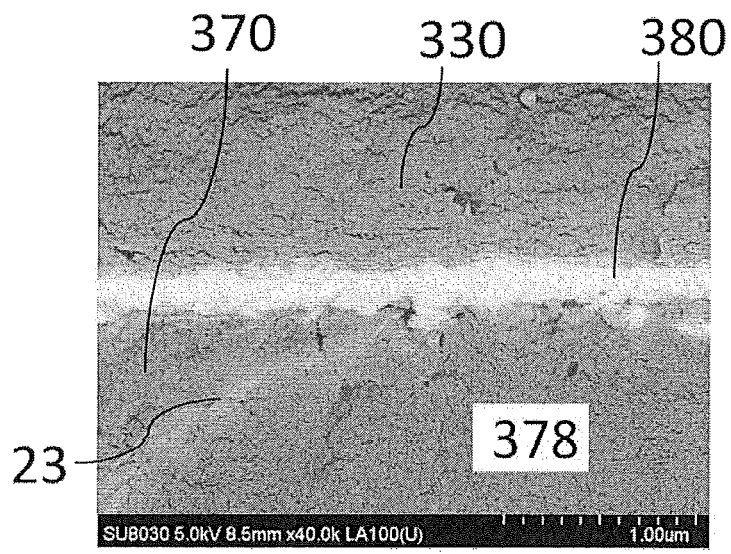
FIGS. 58A and 58C are cross-sectional SEM images of a side surface portion of a display panel.
Figure 58B:
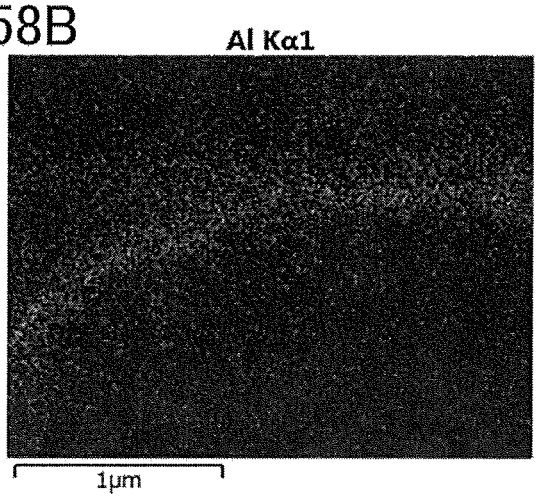
FIG. 58B shows a mapping analysis result thereof by EDX.
Figure 58C:
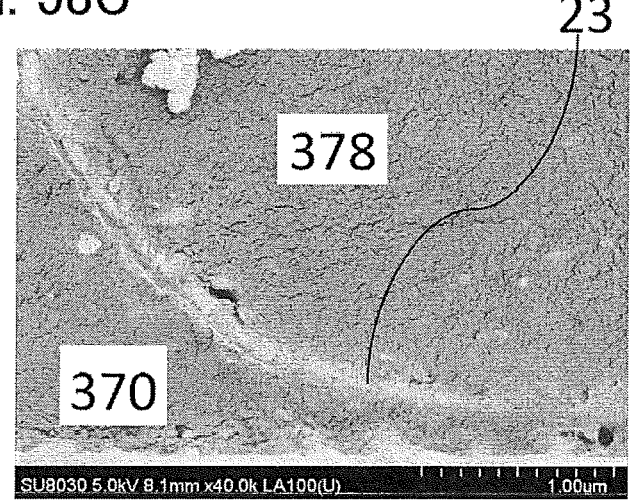

An upper portion and a lower portion of the region 17 were enlarged and subjected to cross-sectional SEM observation. The upper portion was further subjected to EDX analysis. FIG. 58A is a SEM image of the upper portion of the region 17. FIG. 58B shows the EDX analysis result of aluminum mapping in the upper portion of the region 17. FIG. 58C shows a result of cross-sectional SEM observation in the lower portion of the region 17.

In FIGS. 58A and 58B, existence of aluminum is confirmed in addition to the existence of the insulating layer 330, the bonding layer 370, the resin 378, and the conductive layer 380, and an aluminum oxide film that functions as the protection film 23 is uniformly formed with respect to side surface portions, which include the bonding layer 370, the conductive layer 380, and the like, of the display device. Moreover, FIG. 58C shows that the aluminum oxide film that functions as the protection film 23 is also uniformly formed in the lower portion.

As described above, each of the structures shown in FIGS. 57A to 57C and FIGS. 58A to 58C reflects the structure illustrated in FIG. 56B; thus, it was verified that the present invention can be implemented. The display device to which one embodiment of the present invention is used can have a high barrier property, and can have an improved reliability even when the frame width is narrowed.

Example 5

In this example, the concentration of impurities in the protection film 23 was measured, and the results are described.

The impurity concentration was measured by secondary ion mass spectrometry (SIMS). A dynamic SIMS apparatus PHI ADEPT-1010 produced by ULVAC-PHI, Inc. was used as an analysis apparatus. The samples for analysis were prepared in the following manner a thermal oxidation film was formed on a silicon wafer by oxidation with a hydrochloric acid, and then an aluminum oxide (AlOx) film was formed by an ALD method or an aluminum oxide film was formed by a sputtering method as the protection film 23 over the thermal oxidation film.

Figure 59:
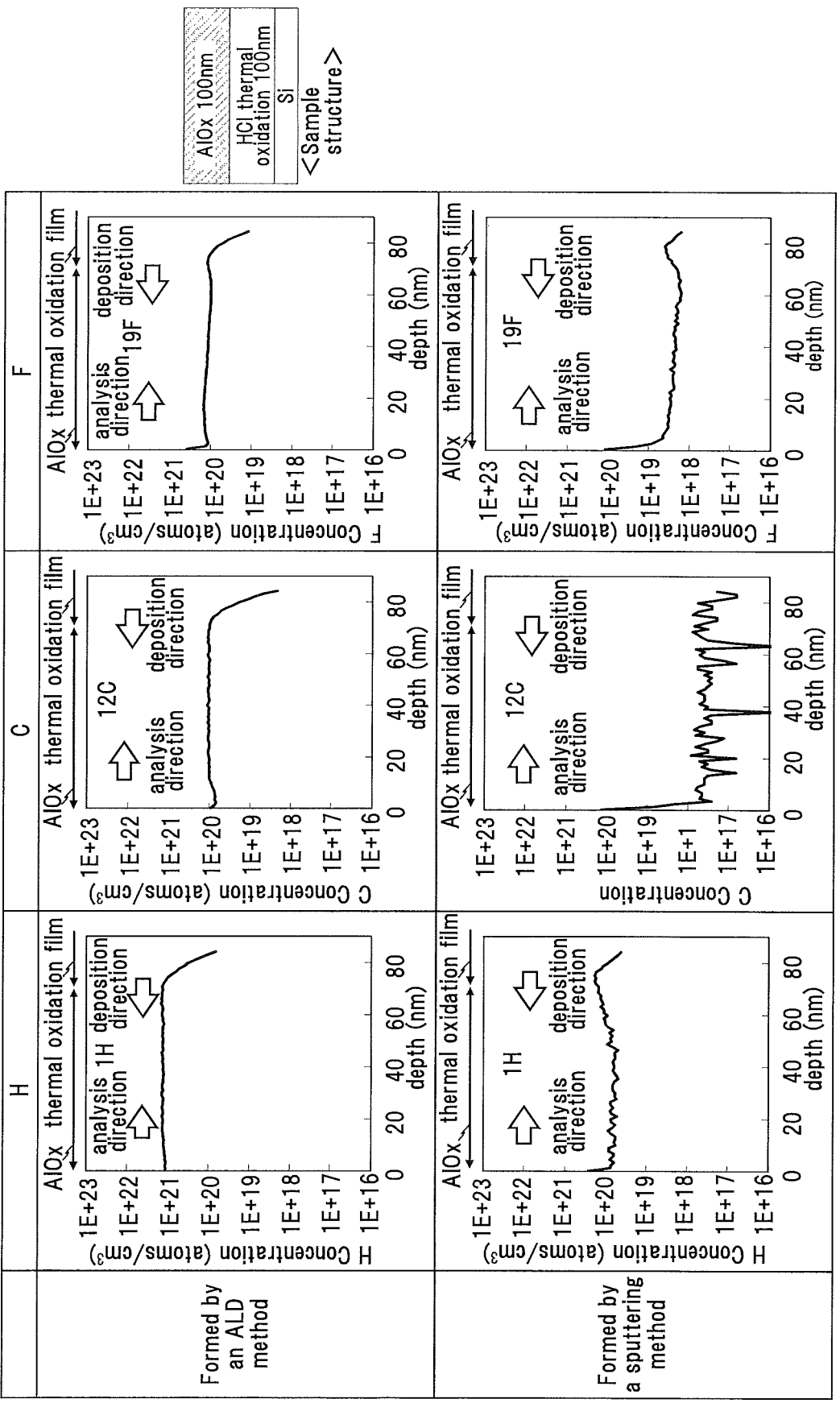
FIG. 59 shows SIMS analysis results of aluminum oxide films formed by an ALD method or a sputtering method.

FIG. 59 shows SIMS analysis results of hydrogen, carbon, and fluorine in the aluminum oxide film.

FIG. 59 shows that the aluminum oxide film formed by an ALD method has a hydrogen concentration of approximately $1 \times 10^{21}$ atoms/cm$^3$, a carbon concentration of approximately $1 \times 10^{20}$ atoms/cm$^3$, and a fluorine concentration of approximately $1 \times 10^{20}$ atoms/cm$^3$. These element concentrations are different from those of the aluminum oxide film formed by a sputtering method; thus, the difference is due to a film formation method. In addition, the impurity concentration of the aluminum oxide film formed by an ALD method can be further reduced, which can improve the reliability of a display device.

Example 6

In this example, the light transmittances of the samples were measured after the preservation test at high temperature and high humidity, and the measurement results are described.

Figure 60A:
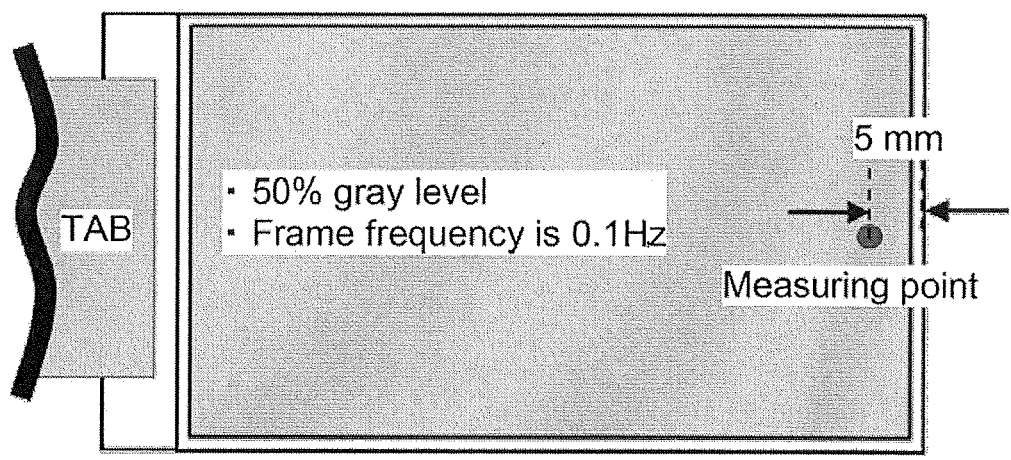
FIG. 60A is a top view of a sample used for light transmittance measurement and FIGS. 60B and 60C each illustrate a method for driving a display.
Figure 61:
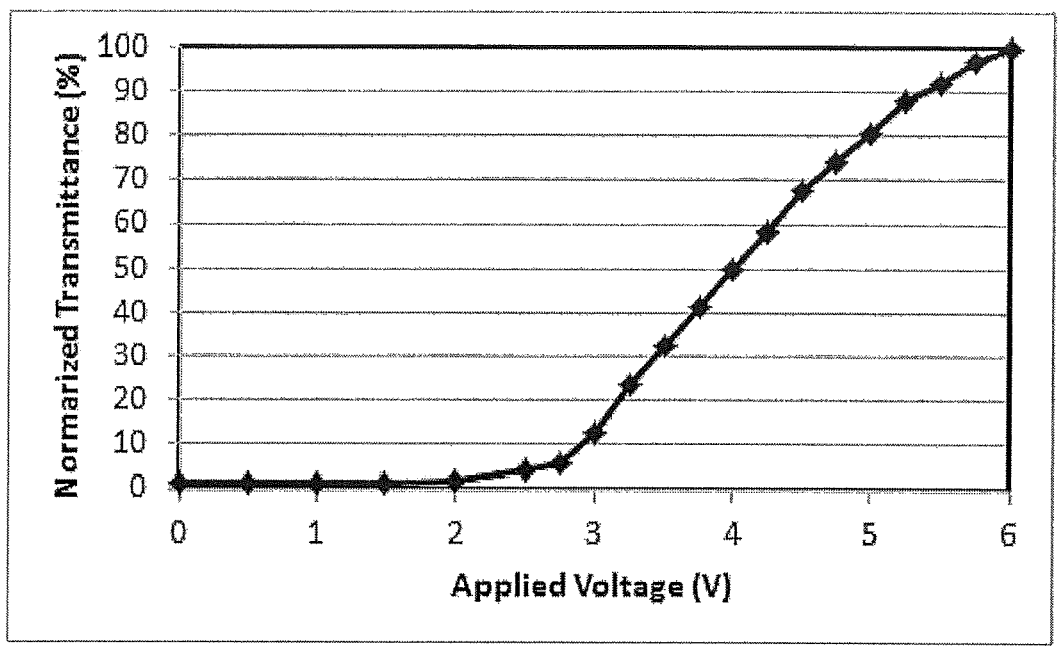
FIG. 61 shows voltage-light transmittance characteristics in gray level.

Some samples which include an aluminum oxide film formed by an ALD method and some samples which do not include the aluminum oxide film were prepared. These samples have the same specifications as the liquid crystal display described in Example 3. These samples were subjected to a preservation test at a high temperature of 60° C. and a high humidity of 90% and then to idling stop (IDS) driving at a frame frequency of 0.1 Hz, and their light transmittances were measured. The measuring point was set to 5 mm inner than the edge of each sample (FIG. 60A). For the measurement, halftone display was performed because a change in light transmittance caused by writing is most easily observed in halftone (gray) display (see FIG. 61).

Figure 60B:
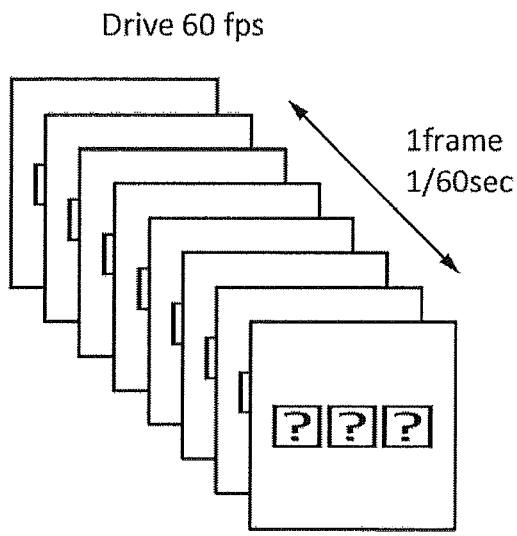
Figure 60C:
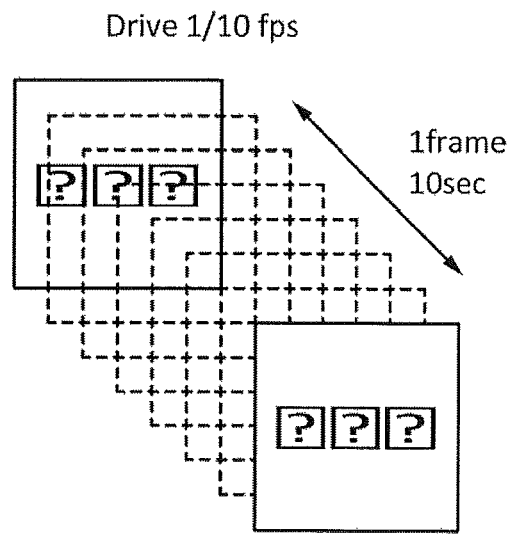

Note that idling stop (IDS) driving is a driving method in which data rewriting is stopped after data writing is executed. Although the conventional driving method needs approximately 60-time rewriting operations per second as shown in FIG. 60B, the IDS driving can reduce the number of rewriting operations as shown in FIG. 60C and thus can cut power consumption.

Figure 62A:
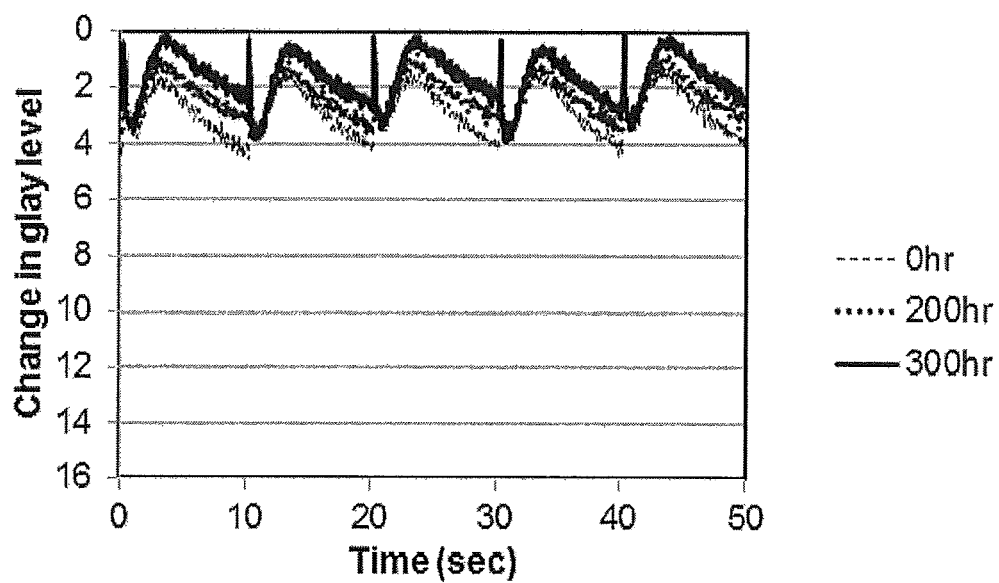
FIGS. 62A and 62B show the light transmittance of samples subjected to a preservation test at a temperature of 60° C. and a humidity of 90%.
Figure 62B:
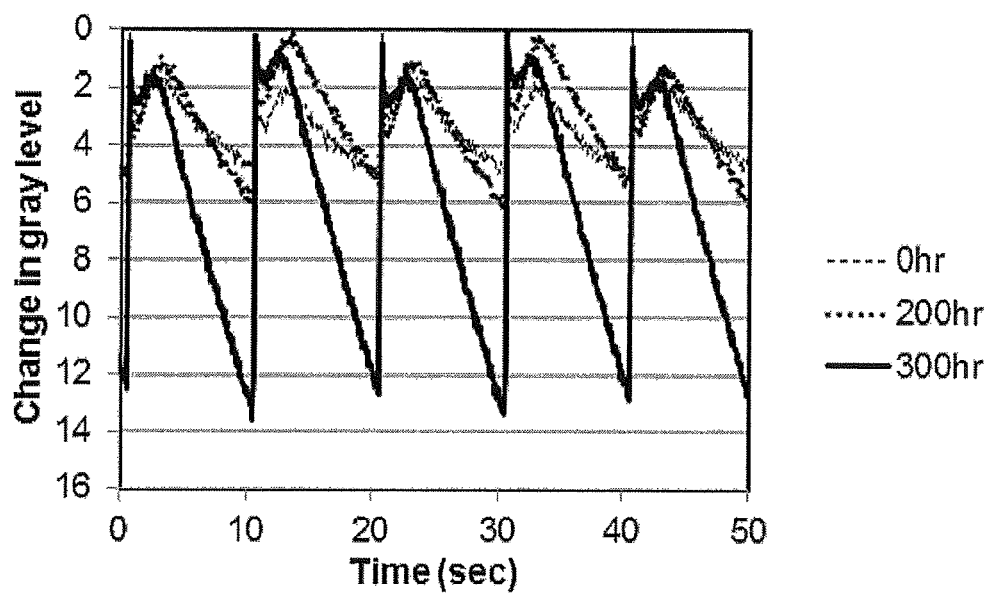

FIGS. 62A and 62B show the light transmittance measurement results of samples subjected to the preservation test at a temperature of 60° C. and a humidity of 90% over time. Note that in FIGS. 62A and 62B, a change in light transmittance is converted into a change in gray level. The change in gray level caused by writing was approximately 4 levels in the samples which include the aluminum oxide film (FIG. 62A). In contrast, the change in gray level was as large as approximately 13 levels in the samples which do not include the aluminum oxide film (FIG. 62B).

Therefore, use of one embodiment of the present invention can reduce the change in gray level and thus can improve long-term reliability of a liquid crystal display.

Example 7

In this example, described are the evaluation results of oxide aluminum films which were deposited at different temperatures by an ALD method.
<Density of Oxide Aluminum Film>

Samples for measuring the density of aluminum oxide films were formed by depositing oxide aluminum over Si wafers to a thickness of 100 nm by an ALD method. The deposition temperatures of the oxide aluminum films were 80° C., 100° C., and 120° C. The same precursors used in Example 3 were used.

The density of the aluminum oxide films was measured by X-ray reflectometry with TRXV-SMX produced by TECHNOS CORP.

Figure 63:
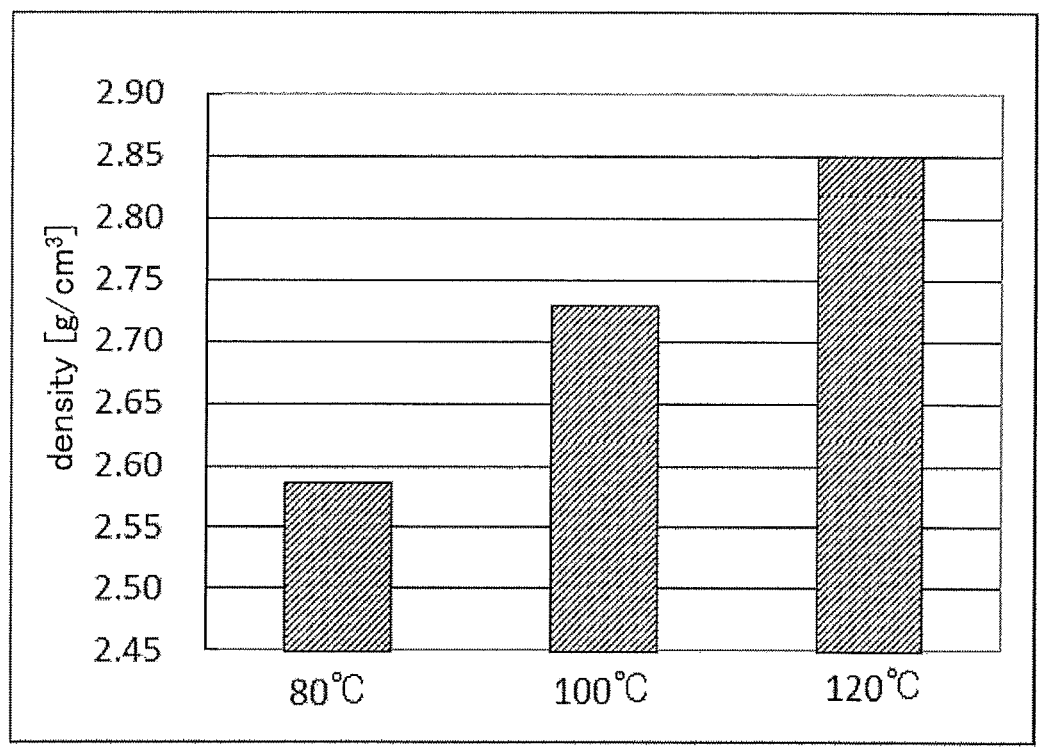
FIG. 63 shows evaluation results of the density of the aluminum oxide films.

FIG. 63 shows the density of the aluminum oxide films deposited at different temperatures. FIG. 63 indicates that the higher the deposition temperature is, the higher the density tends to be.
<Moisture Permeability of Aluminum Oxide Films>

Figure 64:
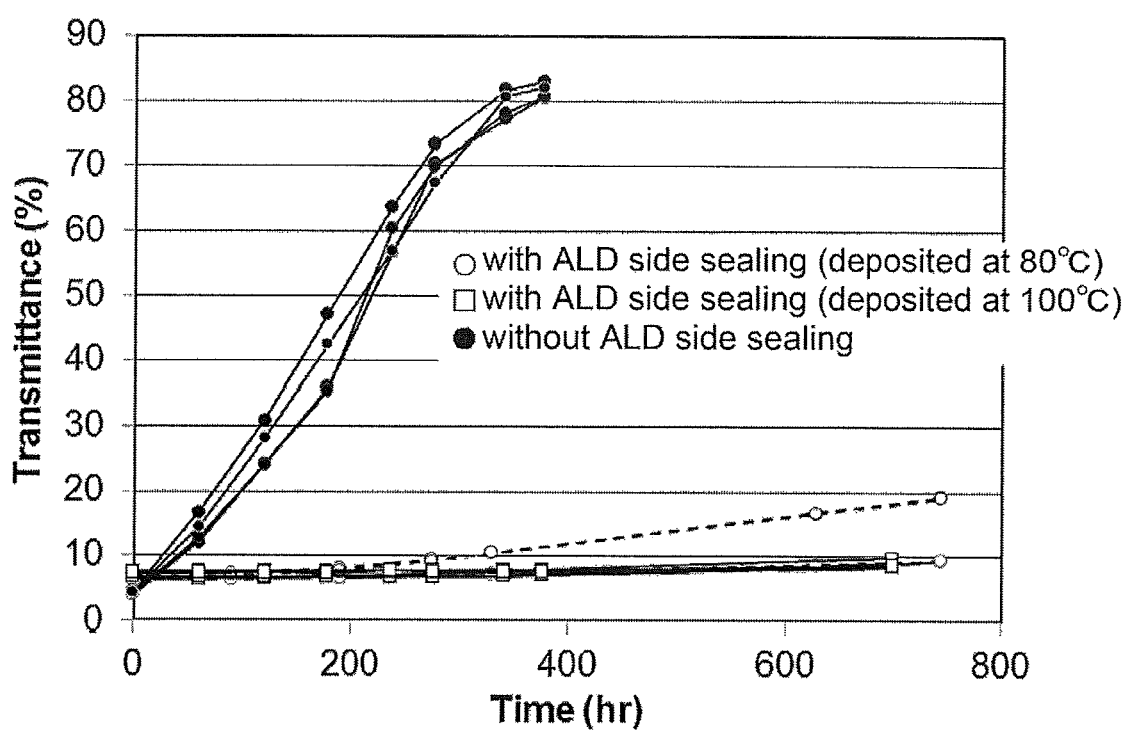
FIG. 64 shows measurement results of Ca tests of samples with/without a protection film formed by an ALD method.

The aluminum oxide films deposited by the above-described method were subjected to the same Ca test conducted in Example 1. FIG. 64 shows the results. The horizontal axis represents time of a test at a temperature of 60° C. and a humidity of 90% and the vertical axis represents light transmittance. A higher light transmittance means more water enters the film.

From FIG. 64, it is found that the samples formed at deposition temperatures of 80° C. and 100° C. can keep low light transmittance. Furthermore, the sample formed at a deposition temperature of 100° C. is likely to obtain low light transmittance stably. This is because the aluminum oxide film that functions as a protection film prevents moisture from entering.

Accordingly, with one embodiment of the present invention, a highly reliable display device can be provided.

This application is based on Japanese Patent Application serial no. 2014-238566 filed with Japan Patent Office on Nov. 26, 2014, Japanese Patent Application serial no. 2014-243313 filed with Japan Patent Office on Dec. 1, 2014, Japanese Patent Application serial no. 2015-044820 filed with Japan Patent Office on Mar. 6, 2015, Japanese Patent Application serial no. 2015-109045 filed with Japan Patent Office on May 28, 2015, the entire contents of which are hereby incorporated by reference.

What is claimed is:

1. A display device comprising:
    a first substrate comprising a first plane and a second plane opposite to the first plane;
    a second substrate comprising a third plane and a fourth plane opposite to the third plane;
    a first insulating layer on the first plane of the first substrate;
    a second insulating layer on the third plane of the second substrate;
    a bonding layer between the first insulating layer and the second insulating layer; and
    a protection film in contact with the first insulating layer, the bonding layer, the second insulating layer, and at least one of the second plane of the first substrate and the fourth plane of the second substrate,
    wherein an area of the first plane of the first substrate is substantially the same as an area of the third plane of the second substrate,
    wherein the first plane of the first substrate and the third plane of the second substrate face each other,
    wherein the protection film comprises any one of aluminum oxide, hafnium oxide, zirconium oxide, titanium oxide, zinc oxide, indium oxide, tin oxide, indium tin oxide, tantalum oxide, manganese oxide, nickel oxide, erbium oxide, cobalt oxide, tellurium oxide, barium titanate, titanium nitride, tantalum nitride, aluminum nitride, tungsten nitride, cobalt nitride, silicon nitride, manganese nitride, hafnium nitride, ruthenium, platinum, nickel, cobalt, manganese, and copper, and
    wherein a concentration of hydrogen in the protection film is greater than or equal to $1 \times 10^{19}$ atoms/cm$^3$ and less than $1 \times 10^{22}$ atoms/cm$^3$.

2. The display device according to claim 1, further comprising a transistor, a capacitor, a display element, a light-blocking layer, and a coloring layer between the first plane of the first substrate and the third plane of the second substrate.

3. The display device according to claim 1, wherein the protection film comprises any one of oxygen, nitrogen, and a metal.

4. The display device according to claim 1, wherein a concentration of fluorine in the protection film is greater than or equal to $1 \times 10^{18}$ atoms/cm$^3$ and less than $1 \times 10^{22}$ atoms/cm$^3$.

5. The display device according to claim 1, wherein a concentration of carbon in the protection film is greater than or equal to $1 \times 10^{17}$ atoms/cm$^3$ and less than $1 \times 10^{22}$ atoms/cm$^3$.

6. The display device according to claim 2, wherein the display element is a liquid crystal element.

7. The display device according to claim 2, wherein the display element is an organic EL element.

8. An electronic device comprising the display device according to claim 1, the display device comprising a microphone and a speaker.

9. A display device comprising:
    a first substrate comprising a first plane and a second plane opposite to the first plane;
    a second substrate comprising a third plane and a fourth plane opposite to the third plane;
    a first insulating layer on the first plane of the first substrate;
    a second insulating layer on the third plane of the second substrate;
    a bonding layer between the first insulating layer and the second insulating layer; and
    a protection film in contact with the first insulating layer, the bonding layer, the second insulating layer, and at least one of the second plane of the first substrate and the fourth plane of the second substrate,
    wherein an area of the third plane of the second substrate is smaller than an area of the first plane of the first substrate,
    wherein the first plane of the first substrate and the third plane of the second substrate face each other,
    wherein the protection film comprises any one of aluminum oxide, hafnium oxide, zirconium oxide, titanium oxide, zinc oxide, indium oxide, tin oxide, indium tin oxide, tantalum oxide, manganese oxide, nickel oxide, erbium oxide, cobalt oxide, tellurium oxide, barium titanate, titanium nitride, tantalum nitride, aluminum nitride, tungsten nitride, cobalt nitride, silicon nitride, manganese nitride, hafnium nitride, ruthenium, platinum, nickel, cobalt, manganese, and copper, and wherein a concentration of hydrogen in the protection film is greater than or equal to $1\times10^{19}$ atoms/cm$^3$ and less than $1\times10^{22}$ atoms/cm$^3$.

10. The display device according to claim 9, further comprising a transistor, a capacitor, a display element, a light-blocking layer, and a coloring layer between the first plane of the first substrate and the third plane of the second substrate.

11. The display device according to claim 9, wherein the protection film comprises any one of oxygen, nitrogen, and a metal.

12. The display device according to claim 9, wherein a concentration of fluorine in the protection film is greater than or equal to $1\times10^{18}$ atoms/cm$^3$ and less than $1\times10^{22}$ atoms/cm$^3$.

13. The display device according to claim 9, wherein a concentration of carbon in the protection film is greater than or equal to $1\times10^{17}$ atoms/cm$^3$ and less than $1\times10^{22}$ atoms/cm$^3$.

14. The display device according to claim 10, wherein the display element is a liquid crystal element.

15. The display device according to claim 10, wherein the display element is an organic EL element.

16. An electronic device comprising the display device according to claim 9, the display device comprising a microphone and a speaker.

17. The display device according to claim 1, further comprising a spacer, wherein the spacer is in contact with the protection film.

18. The display device according to claim 9, further comprising a spacer, wherein the spacer is in contact with the protection film.

19. A display device comprising:
a first substrate;
a second substrate;
a first insulating layer adjacent to the first substrate;
a second insulating layer adjacent to the second substrate;
a bonding layer between the first insulating layer and the second insulating layer; and
a protection film in contact with the first insulating layer, the bonding layer, the second insulating layer, the first substrate, and the second substrate,
wherein the protection film comprises any one of aluminum oxide, hafnium oxide, zirconium oxide, titanium oxide, zinc oxide, indium oxide, tin oxide, indium tin oxide, tantalum oxide, manganese oxide, nickel oxide, erbium oxide, cobalt oxide, tellurium oxide, barium titanate, titanium nitride, tantalum nitride, aluminum nitride, tungsten nitride, cobalt nitride, silicon nitride, manganese nitride, hafnium nitride, ruthenium, platinum, nickel, cobalt, manganese, and copper, and
wherein a concentration of hydrogen in the protection film is greater than or equal to $1\times10^{19}$ atoms/cm$^3$ and less than $1\times10^{22}$ atoms/cm$^3$.

* * * * *